(12) United States Patent
Han et al.

(10) Patent No.: US 12,183,275 B2
(45) Date of Patent: Dec. 31, 2024

(54) DISPLAY SUBSTRATE AND DISPLAY PANEL

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Linhong Han, Beijing (CN); Qiwei Wang, Beijing (CN); Benlian Wang, Beijing (CN); Yao Huang, Beijing (CN); Weiyun Huang, Beijing (CN); Zhi Wang, Beijing (CN); Binyan Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/640,546

(22) PCT Filed: Apr. 28, 2021

(86) PCT No.: PCT/CN2021/090732
§ 371 (c)(1),
(2) Date: Mar. 4, 2022

(87) PCT Pub. No.: WO2022/226845
PCT Pub. Date: Nov. 3, 2022

(65) Prior Publication Data
US 2024/0078971 A1    Mar. 7, 2024

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0426* (2013.01);
(Continued)

(58) Field of Classification Search
CPC ......... G09G 3/3233; G09G 2300/0426; G09G 2300/0819; G09G 2300/0842;
(Continued)

(56) References Cited

U.S. PATENT DOCUMENTS

| | | | |
|---|---|---|---|
| 2018/0330663 A1 | 11/2018 | Yang et al. | |
| 2020/0411611 A1* | 12/2020 | Liu | H10K 59/65 |
| 2021/0134224 A1 | 5/2021 | He et al. | |

FOREIGN PATENT DOCUMENTS

| | | |
|---|---|---|
| CN | 106489175 A | 3/2017 |
| CN | 109935183 A | 6/2019 |

(Continued)

*Primary Examiner* — Abdul-Samad A Adediran
(74) *Attorney, Agent, or Firm* — Leason Ellis LLP

(57) ABSTRACT

A display substrate and a display panel are provided. The display substrate includes: sub-pixels, a data line, a scan signal line, a first light-emitting control signal line, and a second light-emitting control signal line, each sub-pixel includes a pixel circuit that includes a first light-emitting control sub-circuit, a second light-emitting control sub-circuit, and a data writing sub-circuit, the first light-emitting control sub-circuit is connected to the first light-emitting control signal line; the second light-emitting control sub-circuit is connected to the second light-emitting control signal line; the data writing sub-circuit is connected to the scan signal line; the first light-emitting control signal line, the scan signal line, and the second light-emitting control signal line extend along a first direction and are arranged along a second direction, and the scan signal line is between the first light-emitting control signal line and the second light-emitting control signal line in the second direction.

19 Claims, 35 Drawing Sheets

(52) U.S. Cl.
CPC ............... *G09G 2300/0819* (2013.01); *G09G 2300/0842* (2013.01); *G09G 2300/0861* (2013.01); *G09G 2310/08* (2013.01)

(58) Field of Classification Search
CPC ....... G09G 2300/0861; G09G 2310/08; H10K 59/131; H10K 59/65
See application file for complete search history.

(56) References Cited

FOREIGN PATENT DOCUMENTS

| | | | |
|---|---|---|---|
| CN | 110265458 | A | 9/2019 |
| CN | 110648629 | A | 1/2020 |
| CN | 110649080 | A | 1/2020 |
| CN | 110767665 | A | 2/2020 |
| CN | 111403465 | A | 7/2020 |
| CN | 111951729 | A | 11/2020 |

* cited by examiner

DISPLAY SUBSTRATE AND DISPLAY PANEL

CROSS-REFERENCE TO RELATED PATENT APPLICATIONS

This application is a U.S. National Stage Application under 35 U.S.C. § 371 of International Patent Application No. PCT/CN2021/090732 filed Apr. 28, 2021, which is incorporated by reference in its entirety.

TECHNICAL FIELD

The embodiments of the present disclosure relate to a display substrate and a display panel.

BACKGROUND

With the rapid development of an organic light-emitting diode (OLED) in the display field, people's requirements for a display effect are getting higher and higher. Due to the advantages, such as high display quality, an application range of a high-resolution display device is becoming wider and wider. In the display field, the more critical technology is the layout design of a pixel circuit.

SUMMARY

Some embodiments of the present disclosure provide a display substrate, the display substrate comprises: a base substrate, and a plurality of sub-pixels, a first voltage line, a data line, a scan signal line, a first light-emitting control signal line, and a second light-emitting control signal line, which are on the base substrate, each sub-pixel comprises a pixel circuit and a light-emitting element, and the pixel circuit comprises a driving sub-circuit, a first light-emitting control sub-circuit, a second light-emitting control sub-circuit, and a data writing sub-circuit, the first light-emitting control sub-circuit is electrically connected to a first terminal of the driving sub-circuit, a first electrode of the light-emitting element, and the first light-emitting control signal line, and is configured to control a connection between the first terminal of the driving sub-circuit and the first electrode of the light-emitting element to be turned on or off under control of a first light-emitting control signal on the first light-emitting control signal line; the second light-emitting control sub-circuit is electrically connected to a second terminal of the driving sub-circuit, the first voltage line, and the second light-emitting control signal line, and is configured to control a connection between the second terminal of the driving sub-circuit and the first voltage line to be turned on or off under control of a second light-emitting control signal on the second light-emitting control signal line; the data writing sub-circuit is electrically connected to the second terminal of the driving sub-circuit, the data line, and the scan signal line, and is configured to transmit a data voltage on the data line to the second terminal of the driving sub-circuit under control of a scan signal on the scan signal line; and the first light-emitting control signal line, the scan signal line, and the second light-emitting control signal line extend along a first direction and are arranged along a second direction that is not parallel to the first direction, and the scan signal line is between the first light-emitting control signal line and the second light-emitting control signal line in the second direction.

For example, in the display substrate provided by some embodiments of the present disclosure, the pixel circuit further comprises a storage capacitor, a first electrode plate of the storage capacitor is electrically connected to a control terminal of the driving sub-circuit, and a second electrode plate of the storage capacitor is electrically connected to the first voltage line; and in the second direction, an orthographic projection of the first light-emitting control signal line on the base substrate and an orthographic projection of the second light-emitting control signal line on the base substrate are on both sides of an orthographic projection of the second electrode plate of the storage capacitor on the base substrate.

For example, in the display substrate provided by some embodiments of the present disclosure, in the second direction, an orthographic projection of the scan signal line on the base substrate and the orthographic projection of the second light-emitting control signal line on the base substrate are on both sides of the orthographic projection of the second electrode plate of the storage capacitor on the base substrate.

For example, the display substrate provided by some embodiments of the present disclosure further comprises a reset signal line and an initial signal line, which are on the base substrate, the pixel circuit further comprises a reset sub-circuit and a threshold compensation sub-circuit; the reset sub-circuit is electrically connected to a control terminal of the driving sub-circuit, the initial signal line, the first light-emitting control signal line, and the reset signal line, and is configured to transmit an initial voltage on the initial signal line to the control terminal of the driving sub-circuit under control of the first light-emitting control signal and a reset control signal on the reset signal line; the threshold compensation sub-circuit is electrically connected to the control terminal and the first terminal of the driving sub-circuit and the reset signal line, and is configured to control a connection between the first terminal of the driving sub-circuit and the control terminal of the driving sub-circuit to be turned on or off under control of the reset control signal; and the reset signal line extends along the first direction, and in the second direction, the reset signal line is at a side of the first light-emitting control signal line away from the scan signal line.

For example, in the display substrate provided by some embodiments of the present disclosure, the reset sub-circuit comprises a first reset transistor, the first reset transistor comprises a reset active layer, and the reset active layer comprises a first reset active layer portion; the threshold compensation sub-circuit comprises a threshold compensation transistor, the threshold compensation transistor comprises a compensation active layer, and the compensation active layer comprises a first compensation active layer portion; an orthographic projection of the first reset active layer portion on the base substrate and an orthographic projection of the initial signal line on the base substrate at least partially overlap; and an orthographic projection of the first compensation active layer portion on the base substrate and the orthographic projection of the initial signal line on the base substrate at least partially overlap.

For example, in the display substrate provided by some embodiments of the present disclosure, the initial signal line comprises a first sub-initial signal line, the first sub-initial signal line extends along the first direction, and the orthographic projection of the first reset active layer portion on the base substrate and the orthographic projection of the first compensation active layer portion on the base substrate are both within an orthographic projection of the first sub-initial signal line on the base substrate.

For example, in the display substrate provided by some embodiments of the present disclosure, the first reset active layer portion and the first compensation active layer portion are sequentially arranged in the first direction.

For example, in the display substrate provided by some embodiments of the present disclosure, the initial signal line further comprises a second sub-initial signal line, the second sub-initial signal line extends along the second direction, and the first sub-initial signal line and the second sub-initial signal line are electrically connected.

For example, in the display substrate provided by some embodiments of the present disclosure, the display substrate comprises an active semiconductor layer, a first conductive layer, a second conductive layer, and a source-drain metal layer, in a direction perpendicular to the base substrate, the active semiconductor layer is between the base substrate and the first conductive layer, the first conductive layer is between the active semiconductor layer and the second conductive layer, and the second conductive layer is between the first conductive layer and the source-drain metal layer; and the first sub-initial signal line is in the second conductive layer, and the second sub-initial signal line is in the source-drain metal layer.

For example, in the display substrate provided by some embodiments of the present disclosure, the reset active layer further comprises a second reset active layer portion, and the compensation active layer further comprises a second compensation active layer portion; an orthographic projection of the second reset active layer portion on the base substrate and an orthographic projection of the reset signal line on the base substrate at least partially overlap; an orthographic projection of the second compensation active layer portion on the base substrate and the orthographic projection of the reset signal line on the base substrate at least partially overlap; and the second reset active layer portion and the second compensation active layer portion are sequentially arranged in the first direction.

For example, in the display substrate provided by some embodiments of the present disclosure, the first reset transistor and the threshold compensation transistor are double-gate transistors.

For example, in the display substrate provided by some embodiments of the present disclosure, the display substrate comprises an active semiconductor layer and a first conductive layer, and the active semiconductor layer is between the base substrate and the first conductive layer in a direction perpendicular to the base substrate; and the reset signal line, the scan signal line, the first light-emitting control signal line, and the second light-emitting control signal line are all in the first conductive layer.

For example, in the display substrate provided by some embodiments of the present disclosure, under control of the first light-emitting control signal and the reset control signal, the initial voltage is transmitted to the first electrode of the light-emitting element via the reset sub-circuit, the threshold compensation sub-circuit, and the first light-emitting control sub-circuit.

For example, in the display substrate provided by some embodiments of the present disclosure, the driving sub-circuit comprises a driving transistor, the control terminal of the driving sub-circuit comprises a gate electrode of the driving transistor, the first terminal of the driving circuit comprises a first electrode of the driving transistor, and the second terminal of the driving circuit comprises a second electrode of the driving transistor; the first light-emitting control sub-circuit comprises a first light-emitting control transistor, a gate electrode of the first light-emitting control transistor is electrically connected to the first light-emitting control signal line, a first electrode of the first light-emitting control transistor is electrically connected to the first electrode of the driving transistor, a second electrode of the first light-emitting control transistor is electrically connected to the first electrode of the light-emitting element, and a second electrode of the light-emitting element is electrically connected to a second voltage line; the second light-emitting control sub-circuit comprises a second light-emitting control transistor, a gate electrode of the second light-emitting control transistor is electrically connected to the second light-emitting control signal line, a first electrode of the second light-emitting control transistor is electrically connected to the second electrode of the driving transistor, and a second electrode of the second light-emitting control transistor is electrically connected to the first voltage line; the data writing sub-circuit comprises a data writing transistor, a gate electrode of the data writing transistor is electrically connected to the scan signal line, a first electrode of the data writing transistor is electrically connected to the data line, and a second electrode of the data writing transistor is electrically connected to the second electrode of the driving transistor; the reset sub-circuit comprises a first reset transistor and a second reset transistor, a gate electrode of the first reset transistor is electrically connected to the reset signal line, a first electrode of the first reset transistor is electrically connected to the initial signal line, a second electrode of the first reset transistor is electrically connected to a first electrode of the second reset transistor, a gate electrode of the second reset transistor is electrically connected to the first light-emitting control signal line, and a second electrode of the second reset transistor is electrically connected to the gate electrode of the driving transistor; and the threshold compensation sub-circuit comprises a threshold compensation transistor, a gate electrode of the threshold compensation transistor is electrically connected to the reset signal line, a first electrode of the threshold compensation transistor is electrically connected to the first electrode of the driving transistor, and a second electrode of the threshold compensation transistor is electrically connected to the gate electrode of the driving transistor.

For example, in the display substrate provided by some embodiments of the present disclosure, the display substrate comprises an active semiconductor layer, a first conductive layer, a second conductive layer, a source-drain metal layer, and a planarization layer, in a direction perpendicular to the base substrate, the active semiconductor layer is between the base substrate and the first conductive layer, the first conductive layer is between the active semiconductor layer and the second conductive layer, the second conductive layer is between the first conductive layer and the source-drain metal layer, and the planarization layer is on a side of the source-drain metal layer away from the base substrate; the second electrode of the first light-emitting control transistor is electrically connected to the first electrode of the light-emitting element through a first hole penetrating through the planarization layer; and in the second direction, an orthographic projection of the first hole on the base substrate is between an orthographic projection of the reset signal line on the base substrate and an orthographic projection of the second light-emitting control signal line on the base substrate.

For example, in the display substrate provided by some embodiments of the present disclosure, the display substrate further comprises a first insulation layer, a second insulation layer, and a third insulation layer, the first insulation layer is between the active semiconductor layer and the first conductive layer, the second insulation layer is between the first conductive layer and the second conductive layer, and the third insulation layer is between the second conductive layer and the source-drain metal layer; a part, which corresponds to the second electrode of the first light-emitting control transistor, of the active semiconductor layer is electrically connected to a first connection electrode in the source-drain metal layer through a second hole penetrating through the first insulation layer, the second insulation layer, and the third insulation layer, and the first connection electrode is electrically connected to the second electrode of the first light-emitting control transistor; and the first connection electrode is electrically connected to the first electrode of the light-emitting element through the first hole.

For example, in the display substrate provided by some embodiments of the present disclosure, in the second direction, the orthographic projection of the first hole on the base substrate is between an orthographic projection of the scan signal line on the base substrate and an orthographic projection of the first light-emitting control signal line on the base substrate.

For example, in the display substrate provided by some embodiments of the present disclosure, the first voltage line comprises a first sub-voltage line and a second sub-voltage line, the first sub-voltage line and the second sub-voltage line are electrically connected, the first sub-voltage line extends along the second direction, and the second sub-voltage line extends along the first direction.

For example, in the display substrate provided by some embodiments of the present disclosure, pixel circuits of the plurality of sub-pixels are arranged in an array along the first direction and the second direction.

For example, in the display substrate provided by some embodiments of the present disclosure, the initial signal line comprises a first sub-initial signal line and a second sub-initial signal line, the first sub-initial signal line extends along the first direction and the second sub-initial signal line extends along the second direction, and the first sub-initial signal line and the second sub-initial signal line are electrically connected; the data line extends along the second direction; and the first sub-voltage line, the data line, and the second sub-initial signal line are on a same layer, the data line, the first sub-voltage line, and the second sub-initial signal line are arranged along the first direction, and the first sub-voltage line is between the data line and the second sub-initial signal line in the first direction.

For example, in the display substrate provided by some embodiments of the present disclosure, the plurality of sub-pixels comprises a plurality of sub-pixel pairs, and the plurality of sub-pixel pairs are arranged in an array along the first direction and the second direction; and each sub-pixel pair comprises two sub-pixels adjacent to each other in the first direction, and pixel circuits of the two sub-pixels are mirror symmetric along a symmetry axis that is parallel to the second direction.

For example, in the display substrate provided by some embodiments of the present disclosure, the initial signal line comprises a first sub-initial signal line and a second sub-initial signal line, the first sub-initial signal line extends along the first direction and the second sub-initial signal line extends along the second direction, and the first sub-initial signal line and the second sub-initial signal line are electrically connected; the data line extends along the second direction; and the first sub-voltage line, the data line, and the second sub-initial signal line are on a same layer, the data line, the first sub-voltage line, and the second sub-initial signal line are arranged along the first direction, and in the first direction, the data line is between the first sub-voltage line and the second sub-initial signal line.

For example, in the display substrate provided by some embodiments of the present disclosure, for two sub-pixel pairs, which are adjacent in the first direction, among the plurality of sub-pixel pairs, pixel circuits of two sub-pixels, which are adjacent to each other in the first direction, of the two sub-pixel pairs are electrically connected to a same first sub-voltage line.

For example, in the display substrate provided by some embodiments of the present disclosure, a shape of the first light-emitting control signal line is a curved shape or a straight shape.

For example, in the display substrate provided by some embodiments of the present disclosure, the first direction and the second direction are perpendicular to each other.

Some embodiments of the present disclosure further provide a display panel, comprising the display substrate according to any one of the above embodiments.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

Figure 1:
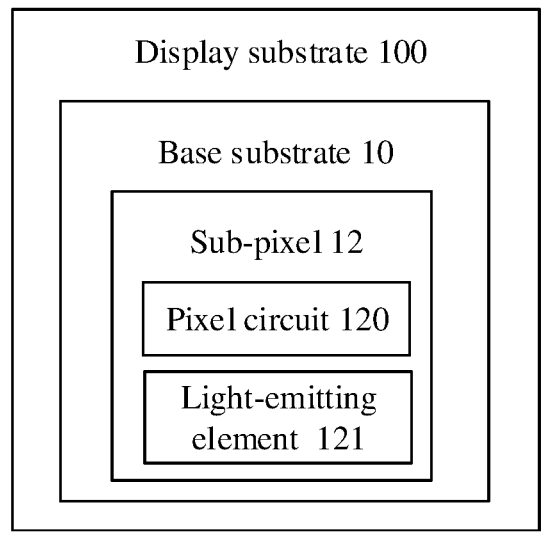
FIG. 1 is a schematic block diagram of a display substrate provided by some embodiments of the present disclosure.

In order to make objects, technical solutions, and advantages of the embodiments of the present disclosure more apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain all other embodiment(s), without any inventive work, which should be within the protection scope of the present disclosure.

Unless otherwise defined, all the technical and scientific terms used in the present disclosure have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to keep the following description of the embodiments of the present disclosure clear and concise, the present disclosure omits detailed descriptions of some known functions and components.

At least some embodiments of the present disclosure provide a display substrate and a display panel, the display substrate comprises: a base substrate, and a plurality of sub-pixels, a first voltage line, a data line, a scan signal line, a first light-emitting control signal line, and a second light-emitting control signal line, which are on the base substrate; each sub-pixel comprises a pixel circuit and a light-emitting element, and the pixel circuit comprises a driving sub-circuit, a first light-emitting control sub-circuit, a second light-emitting control sub-circuit, and a data writing sub-circuit, the first light-emitting control sub-circuit is electrically connected to a first terminal of the driving sub-circuit, a first electrode of the light-emitting element, and the first light-emitting control signal line, and is configured to control a connection between the first terminal of the driving sub-circuit and the first electrode of the light-emitting element to be turned on or off under control of a first light-emitting control signal on the first light-emitting control signal line; the second light-emitting control sub-circuit is electrically connected to a second terminal of the driving sub-circuit, the first voltage line, and the second light-emitting control signal line, and is configured to control a connection between the second terminal of the driving sub-circuit and the first voltage line to be turned on or off under control of a second light-emitting control signal on the second light-emitting control signal line; the data writing sub-circuit is electrically connected to the second terminal of the driving sub-circuit, the data line, and the scan signal line, and is configured to transmit a data voltage on the data line to the second terminal of the driving sub-circuit under control of a scan signal on the scan signal line; and the first light-emitting control signal line, the scan signal line, and the second light-emitting control signal line extend along a first direction and are arranged along a second direction that is not parallel to the first direction, and the scan signal line is between the first light-emitting control signal line and the second light-emitting control signal line in the second direction.

In the display substrate, the first light-emitting control signal line, the scan signal line, and the second light-emitting control signal line extend along the first direction and are arranged sequentially along the second direction, so that wirings can be reduced, the light-transmitting space can be increased, and a photosensitive element under the pixel circuit can be better photosensitive. In addition, the display substrate has a simple structure, is easy to design and manufacture, and has a low cost.

Some embodiments of the present disclosure will be described in detail below with reference to the accompanying drawings, but the present disclosure is not limited to these specific embodiments.

Figure 2A:
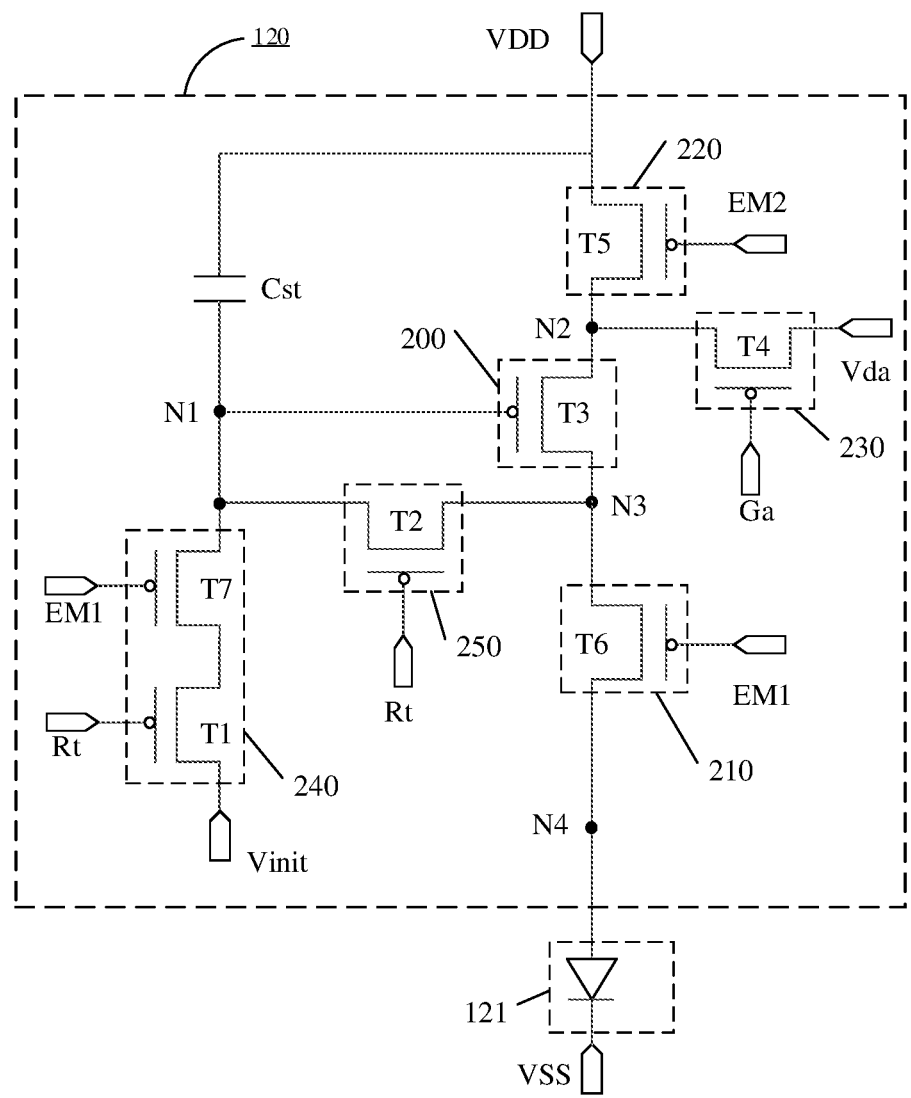
FIG. 2A is a schematic structural diagram of a pixel circuit provided by some embodiments of the present disclosure.
Figure 2B:
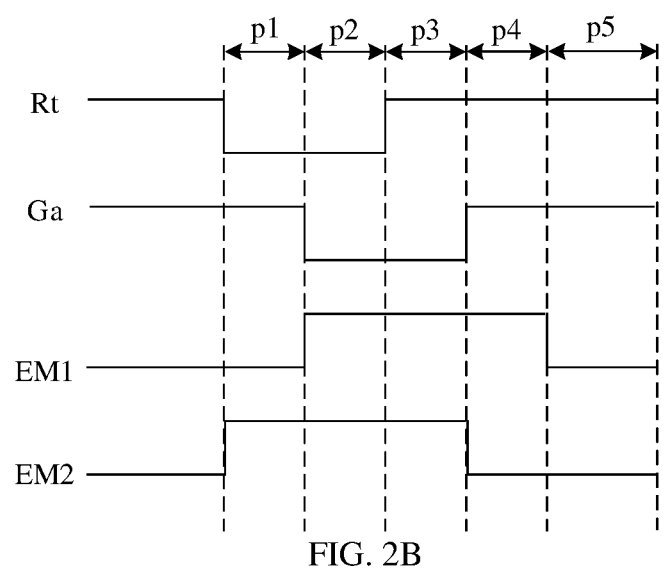
FIG. 2B is a circuit timing diagram of a pixel circuit provided by some embodiments of the present disclosure.

FIG. 1 is a schematic block diagram of a display substrate provided by some embodiments of the present disclosure, FIG. 2A is a structural schematic diagram of a pixel circuit provided by some embodiments of the present disclosure, and FIG. 2B is a circuit timing diagram of a pixel circuit provided by some embodiments of the present disclosure.

For example, as shown in FIG. 1, the display substrate 100 provided by the embodiment of the present disclosure includes a base substrate 10 and a plurality of sub-pixels 12, a first voltage line, a data line, a scan signal line, a first light-emitting control signal line, and a second light-emitting control signal line, which are arranged on the base substrate 10. It should be noted that FIG. 1 does not show the first voltage line, the data line, the scan signal line, the first light-emitting control signal line, and the second light-emitting control signal line.

For example, the display substrate 100 may be applied to a display panel, such as an active matrix organic light-emitting diode (AMOLED) display panel, and the like. The display substrate 100 may be an array substrate.

For example, the base substrate 10 may be a flexible substrate or a rigid substrate. For example, the base substrate 10 can be made of, for example, glass, plastic, quartz, or other suitable materials, and the embodiments of the present disclosure are not limited to this case.

For example, each sub-pixel 12 includes a light-emitting element 121 and a pixel circuit 120, and the light-emitting element 121 is located on a side of the pixel circuit 120 away from the base substrate 10. The pixel circuit 120 is configured to drive the light-emitting element 121 to emit light. Next, the pixel circuit and its working principle will be described in conjunction with FIG. 2A and FIG. 2B.

For example, as shown in FIG. 2A, the pixel circuit 120 includes a driving sub-circuit 200, a first light-emitting control sub-circuit 210, a second light-emitting control sub-circuit 220, and a data writing sub-circuit 230.

For example, as shown in FIG. 2A, the first light-emitting control sub-circuit 210 is electrically connected to a first terminal of the driving sub-circuit 200, a first electrode of the light-emitting element 121, and a first light-emitting control signal line EM1, and is configured to control a connection between the first terminal of the driving sub-circuit 200 and the first electrode of the light-emitting element 121 to be turned on or off under control of a first light-emitting control signal on the first light-emitting control signal line EM1.

For example, as shown in FIG. 2A, the second light-emitting control sub-circuit 220 is electrically connected to a second terminal of the driving sub-circuit 200, a first voltage line VDD, and a second light-emitting control signal line EM2, and is configured to control a connection between the second terminal of the driving sub-circuit 200 and the first voltage line VDD to be turned on or off under control of a second light-emitting control signal on the second light-emitting control signal line EM2.

For example, as shown in FIG. 2A, the data writing sub-circuit 230 is electrically connected to the second terminal of the driving sub-circuit 200, a data line Vda, and a scan signal line Ga, and is configured to transmit a data voltage on the data line Vda to the second terminal of the driving sub-circuit 200 under control of a scan signal on the scan signal line Ga.

For example, as shown in FIG. 2A, a second electrode of the light-emitting element 121 is electrically connected to a second voltage line VSS.

For example, the light-emitting element 121 may be a light-emitting diode or the like. The light-emitting diode may be a micro light-emitting diode (Micro LED), an organic light-emitting diode (OLED), or a quantum dot light-emitting diode (QLED), etc. The light-emitting element 121 is configured to receive a light-emitting signal (for example, the light-emitting signal may be a driving current) during operation, and to emit light of an intensity corresponding to the light-emitting signal. The light-emitting element 121 may include a first electrode, a second electrode, and a light-emitting layer disposed between the first electrode and the second electrode. The first electrode of the light-emitting element 121 may be an anode, and the second electrode of the light-emitting diode may be a cathode. It should be noted that in the embodiments of the present disclosure, the light-emitting layer of the light-emitting element may include an electroluminescent layer itself and other common layers, such as a hole injection layer, a hole transport layer, an electron injection layer, an electron transport layer, and so on, located on both sides of the electroluminescent layer. Generally, the light-emitting element 121 has a light-emitting threshold voltage, and emits light when the voltage between the first electrode and the second electrode of the light-emitting element 121 is greater than or equal to the light-emitting threshold voltage. In actual applications, the specific structure of the light-emitting element 121 can be designed and determined according to the actual application environment, and the present disclosure does not limit this case.

For example, as shown in FIG. 2A, the pixel circuit 120 further includes a storage capacitor Cst, a first electrode plate CC1 of the storage capacitor Cst is electrically connected to a control terminal of the driving sub-circuit 200, and a second electrode plate CC2 of the storage capacitor Cst is electrically connected to the first voltage line VDD.

For example, as shown in FIG. 2A, the display substrate 100 further includes a reset signal line Rt and an initial signal line Vinit provided on the base substrate 10. The pixel circuit 120 also includes a reset sub-circuit 240 and a threshold compensation sub-circuit 250.

For example, the reset sub-circuit 240 is electrically connected to the control terminal of the driving sub-circuit 200, the initial signal line Vinit, the first light-emitting control signal line EM1, and the reset signal line Rt, and is configured to transmit an initial voltage on the initial signal line Vinit to the control terminal of the driving sub-circuit 200 under control of the first light-emitting control signal and a reset control signal on the reset signal line Rt.

For example, the threshold compensation sub-circuit 250 is electrically connected to the control terminal and the first terminal of the driving sub-circuit 200 and the reset signal line Rt, and is configured to control a connection between the first terminal of the driving sub-circuit 200 and the control terminal of the driving sub-circuit 200 to be turned on or off under control of the reset control signal on the reset signal line Rt.

For example, when the reset sub-circuit 240 transmits the initial voltage output by the initial signal line Vinit to the control terminal of the driving sub-circuit 200 to initialize the control terminal of the driving sub-circuit 200, the threshold compensation sub-circuit 250 is configured to be turned on under control of the reset control signal, and at the same time, the first light-emitting control sub-circuit 210 is turned on under control of the first light-emitting control signal, and therefore, the initial voltage can be transmitted to the first electrode of the light-emitting element 121 via the threshold compensation sub-circuit 250 and the first light-emitting control sub-circuit 210 to initialize the first electrode of the light-emitting element 121. That is, under the control of the first light-emitting control signal and the reset control signal, the initial voltage is transmitted to the control terminal of the driving sub-circuit 200 via the reset sub-circuit 240, and the initial voltage is transmitted to the first electrode of the light-emitting element 121 via the reset sub-circuit 240, the threshold compensation sub-circuit 250, and the first light-emitting control sub-circuit 210, so that the control terminal of the driving sub-circuit 200 and the first electrode of the light-emitting element 121 can be initialized at the same time.

For example, as shown in FIG. 2A, the driving sub-circuit 200 includes a driving transistor T3, the control terminal of the driving sub-circuit 200 includes a gate electrode of the driving transistor T3, the first terminal of the driving sub-circuit 20 includes a first electrode of the driving transistor T3, and the second terminal of the driving sub-circuit 20 includes a second electrode of the driving transistor T3. The gate electrode of the driving transistor T3 is electrically connected to a first node N1, the second electrode of the driving transistor T3 is electrically connected to a second node N2, and the first electrode of the driving transistor T3 is electrically connected to a third node N3.

The first light-emitting control sub-circuit 210 includes a first light-emitting control transistor T6, a gate electrode of the first light-emitting control transistor T6 is electrically connected to the first light-emitting control signal line EM1, a first electrode of the first light-emitting control transistor T6 is electrically connected to the third node N3, that is, to the first electrode of the driving transistor T3, and a second electrode of the first light-emitting control transistor T6 is electrically connected to the fourth node N4, and the first electrode of the light-emitting element 121 is electrically connected to the fourth node N4, that is, the second electrode of the first light-emitting control transistor T6 is electrically connected to the first electrode of the light-emitting element 121.

The second light-emitting control sub-circuit 220 includes a second light-emitting control transistor T5, a gate electrode of the second light-emitting control transistor T5 is electrically connected to the second light-emitting control signal line EM, a first electrode of the second light-emitting control transistor T5 is electrically connected to the second node N2, that is, is electrically connected to the second electrode of the driving transistor T3, and a second electrode of the second light-emitting control transistor T5 is electrically connected to the first voltage line VDD.

The data writing sub-circuit 230 includes a data writing transistor T4, a gate electrode of the data writing transistor T4 is electrically connected to the scan signal line Ga, a first electrode of the data writing transistor T4 is electrically connected to the data line Vda, and a second electrode of the data writing transistor T4 is electrically connected to the second node N2, that is, electrically connected to the second electrode of the driving transistor T3.

The reset sub-circuit 240 includes a first reset transistor T1 and a second reset transistor T7, a gate electrode of the first reset transistor T1 is electrically connected to a reset signal line Rt, a first electrode of the first reset transistor T1 is electrically connected to the initial signal line Vinit, and a second electrode of the first reset transistor T1 is electrically connected to a first electrode of the second reset transistor T7; a gate electrode of the second reset transistor T7 is electrically connected to the first light-emitting control signal line EM1, and a second electrode of the second reset transistor T7 is electrically connected to the first node N1, that is, electrically connected to the gate electrode of the driving transistor T3.

The threshold compensation sub-circuit 250 includes a threshold compensation transistor T2, a gate electrode of the threshold compensation transistor T2 is electrically connected to the reset signal line Rt, a first electrode of the threshold compensation transistor T2 is electrically connected to the third node N3, that is, electrically connected to the first electrode of the driving transistor T3, and a second electrode of the threshold compensation transistor T2 is electrically connected to the first node N1, that is, electrically connected to the gate electrode of the driving transistor T3.

For example, in some embodiments, the first reset transistor T1 and the threshold compensation transistor T2 are both dual-gate transistors, so that the leakage currents of the first reset transistor T1 and the threshold compensation transistor T2 that are electrically connected to the gate electrode of the driving transistor T3 can be relatively small, and the voltage of the gate electrode of the driving transistor T3 can be ensured to be stable.

For example, one selected from a group consisting of the voltage output by the first voltage line VDD and the voltage output by the second voltage line VSS is a high voltage, and the other is a low voltage. For example, in the embodiment shown in FIG. 2A, the voltage output by the first voltage line VDD is a constant first voltage, and the first voltage is a positive voltage; the voltage output by the second voltage line VSS is a constant second voltage, and the second voltage is a negative voltage. For example, in some examples, the second voltage line VSS may be grounded.

For example, according to the characteristics of transistors, transistors can be classified into N-type transistors and P-type transistors. For the sake of clarity, the embodiments of the present disclosure describe the technical solutions of the present disclosure in detail by taking the case that the transistor is a P-type transistor (for example, a P-type MOS transistor) as an example. That is, in the description of the present disclosure, the driving transistor T3, the data writing transistor T4, the threshold compensation transistor T2, the first light-emitting control transistor T6, the second light-emitting control transistor T5, the first reset transistor T1, and the second reset transistor T7, etc. can all be P-type transistors, so that the fabrication process can be reduced. However, the transistors in the embodiments of the present disclosure are not limited to P-type transistors, and those skilled in the art can also use N-type transistors (e.g., N-type MOS transistors) to implement the functions of one or more transistors in the embodiments of the present disclosure according to actual application environment, and the present disclosure is not limited thereto.

It should be noted that, transistors used in the embodiments of the present disclosure may be thin film transistors, field effect transistors, or other switching devices with the same characteristics, the thin film transistors may include an oxide semiconductor thin film transistor, an amorphous silicon thin film transistor, a polysilicon thin film transistor, or the like. A source electrode and a drain electrode of a transistor may be symmetrical in structure, so the source electrode and the drain electrode of the transistor may have no difference in physical structure. In the embodiments of the present disclosure, in order to distinguish two electrodes of the transistor in addition to a gate electrode as a control electrode, one of the two electrodes is directly referred to as a first electrode, and the other of the two electrodes is referred to as a second electrode, and therefore, the first electrode and the second electrode of all or part of the transistors in the embodiments of the present disclosure are interchangeable as required.

For example, during specific implementation, in the embodiment of the present disclosure, the initial voltage $V_i$ output by the initial signal line Vinit and the voltage $V_s$ output by the second voltage line VSS may satisfy the following formula: $V_i - V_s <$ VEL, so that the light-emitting element 121 can be prevented from emitting light in a non-light-emitting phase (for example, an initialization phase p1 to be described below). VEL represents a light-emitting threshold voltage of the light-emitting element 121.

Next, the working process of the pixel circuit as shown in FIG. 2A will be described with reference to FIG. 2B.

For example, as shown in FIG. 2B, Rt represents the reset control signal output by the reset signal line Rt, Ga represents the scan signal output by the scan signal line Ga, EM1 represents the first light-emitting control signal output by the first light-emitting control signal line EM1, and EM2 represents the second light-emitting control signal output by the second light-emitting control signal line EM2. It should be noted that in the embodiment of the present disclosure, reference numerals Rt, Ga, EM1, EM2, Vda, and VDD represent both signal lines and signals on the signal lines.

For example, the working process of a pixel circuit in one display frame may include: an initialization phase p1, a data writing phase p2, a first buffer phase p3, a second buffer phase p4, and a light-emitting phase p5.

In the initialization phase p1, the reset control signal Rt and the first light-emitting control signal EM1 are at a low level, and the second light-emitting control signal EM2 and the scan signal Ga are at a high level, and thus, the first reset transistor T1 is turned on under the control of the low level of the reset control signal Rt, and the second reset transistor T7 is also turned on under the control of the low level of the first light-emitting control signal EM1. In this way, the initial voltage Vi output by the initial signal line Vinit can be supplied to the gate electrode of the driving transistor T3, that is, the third node N3, through the first reset transistor T1 and the second reset transistor T7 that are turned on, so that the voltage of the gate electrode of the driving transistor T3 is the initial voltage Vi, thereby achieving to initialize the gate electrode of the driving transistor T3. Meanwhile, the threshold compensation transistor T2 is turned on under the control of the low level of the reset control signal Rt, and the first light-emitting control transistor T6 is also turned on under the control of the low level of the first light-emitting control signal EM1, so that the initial voltage Vi output by the initial signal line Vinit can be provided to the first electrode of the light-emitting element 121 through the turned-on threshold compensation transistor T2 and the turned-on first light-emitting control transistor T6 to initialize the first electrode of the light-emitting element 121. The second light-emitting control transistor T5 is turned off under the control of the high level of the second light-emitting control signal EM2, and the data writing transistor T4 is turned off under the control of the high level of the scan signal Ga.

In the data writing phase p2, the reset control signal Rt and the scan signal Ga are at a low level, and the first light-emitting control signal EM1 and the second light-emitting control signal EM2 are at a high level, so that the data writing transistor T4 is turned on under the control of the low level of the scan signal Ga to supply the data voltage Vda on the data line Vda to the second electrode of the driving transistor T3, that is, to the second node N2, so that the voltage of the second electrode of the driving transistor T3 is the data voltage Vda. The threshold compensation transistor T2 is turned on under the control of the low level of the reset control signal Rt, thereby enabling the driving transistor T3 to be diode-connected, so that the voltage Vda of the second electrode of the driving transistor T3 charges the gate electrode of the driving transistor T3 until the voltage of the gate electrode of the driving transistor T3 becomes Vda+Vth, and the voltage Vda+Vth of the gate electrode of the driving transistor T3 is stored by the storage capacitor Cst. The second reset transistor T7 and the first light-emitting control transistor T6 are turned off under the control of the high level of the first light-emitting control signal EM1, and the second light-emitting control transistor T5 is turned off under the control of the high level of the second light-emitting control signal EM2.

In the first buffer phase p3, the scan signal Ga is at a low level, and the reset control signal Rt, the first light-emitting control signal EM1, and the second light-emitting control signal EM2 are at a high level, so that the data writing transistor T4 is turned on under the control of the low level of the scan signal Ga to supply the data voltage Vda on the data line Vda to the second electrode of the driving transistor T3, so that the voltage of the second electrode of the driving transistor T3 continues to be the data voltage Vda. The first reset transistor T1 and the threshold compensation transistor T2 are turned off under the control of the high level of the reset control signal Rt, the second reset transistor T7 and the first light-emitting control transistor T6 are turned off under the control of the high level of the first light-emitting control signal EM1, and the second light-emitting control transistor T5 is turned off under the control of the high level of the second light-emitting control signal EM2.

It should be noted that, by setting the scan signal Ga to be at a low level in the first buffer phase p3, the data writing transistor T4 can be continuously turned on, so as to enable the charging to be more sufficient.

In the second buffer phase p4, the second light-emitting control signal EM2 is at a low level, and the reset control signal Rt, the first light-emitting control signal EM1, and the scan signal Ga are at a high level, so that the second light-emitting control transistor T5 is turned on under the control of the high level of the second light-emitting control signal EM2, and therefore, the second light-emitting control transistor T5 can provide the first voltage VDD output by the first voltage line VDD to the second electrode of the driving transistor T3, so that the voltage of the second electrode of the driving transistor T3 is the first voltage VDD. In this way, the second electrode of the driving transistor T3 can be pre-charged through the first voltage line VDD. The first reset transistor T1 and the threshold compensation transistor T2 are turned off under the control of the high level of the reset control signal Rt, the second reset transistor T7 and the first light-emitting control transistor T6 are turned off under the control of the high level of the first light-emitting control signal EM1, and the data writing transistor T4 is turned off under the control of the high level of the scan signal Ga.

It should be noted that, by setting the first light-emitting control signal EM1 to be at a high level in the second buffer phase p4, the first light-emitting control transistor T6 can be controlled to be turned off, in this way, the voltage of the gate electrode of the driving transistor T3 can be further stabilized, that is, the current generated by the driving transistor T3 can be further stabilized before being supplied to the light-emitting element 121, thereby further improving the light-emitting stability of the light-emitting element 121.

In the light-emitting phase p5, the first light-emitting control signal EM1 and the second light-emitting control signal EM2 are at a low level, and the reset control signal Rt and the scan signal Ga are at a high level, so that the second light-emitting control transistor T5 is turned on under the control of the low level of the second light-emitting control signal EM2, thus the second light-emitting control transistor T5 can supply the first voltage VDD output by the first voltage line VDD to the second electrode of the driving transistor T3, so that the voltage of the second electrode of the driving transistor T3 is the first voltage VDD. At this time, the voltage of the second electrode of the driving transistor T3 is the first voltage VDD, and the voltage of the gate electrode of the driving transistor T3 is Vda+Vth based on the holding effect of the storage capacitor Cst, so that the driving transistor T3 can be in a saturated state, and the driving transistor T3 can generate the driving current Ids: Ids=$K*((Vda+Vth-VDD)-Vth)^2=K*(Vda-VDD)^2$, K is a structural constant related to process and design. The first light-emitting control transistor T6 is turned on under the control of the low level of the first light-emitting control signal EM1, so that the first light-emitting control transistor T6 can conduct the first electrode of the driving transistor T3 with the first electrode of the light-emitting element 121, as a result, the driving current Ids flows into the light-emitting element 121 to drive the light-emitting element 121 to emit light. The first reset transistor T1 and the threshold compensation transistor T2 are turned off under the control of the high level of the reset control signal Rt, and the data writing transistor T4 is turned off under the control of the high level of the scan signal Ga.

It should be noted that the circuit timing diagram shown in FIG. 2B provided by the present disclosure is only schematic, and the specific timing of the pixel circuit can be set according to the actual application scenario, which is not specifically limited in the present disclosure.

Figure 3:
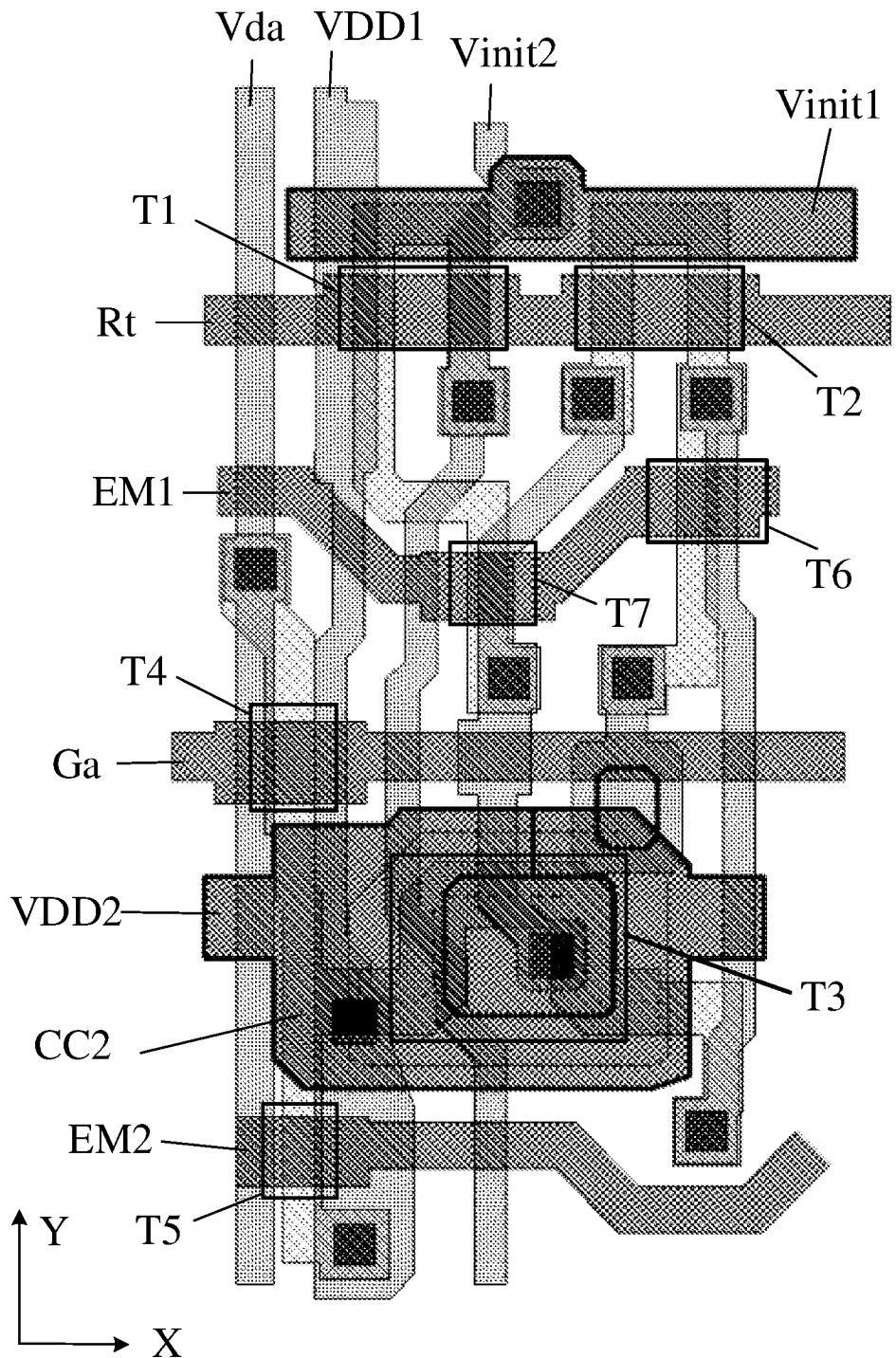
FIG. 3 is a schematic diagram of a layout of a pixel circuit provided by some embodiments of the present disclosure.

FIG. 3 is a schematic layout diagram of a pixel circuit provided by some embodiments of the present disclosure.

FIG. 3 is a schematic diagram of the layout of the pixel circuit shown in FIG. 2A. The display substrate 100 may include an active semiconductor layer, a first conductive layer, a second conductive layer, a source-drain metal layer, and an anode layer. For example, each pixel circuit 120 includes an active semiconductor layer, a first conductive layer, a second conductive layer, a source-drain metal layer, and an anode layer, for example, various elements (transistors T1-T7, storage capacitors, etc.) of the pixel circuit 120 and various signal lines are arranged in the active semiconductor layer, the first conductive layer, the second conductive layer, the source-drain metal layer, and the anode layer. In a direction perpendicular to the base substrate 10, the active semiconductor layer is located between the base substrate 10 and the first conductive layer, the first conductive layer is located between the active semiconductor layer and the second conductive layer, the second conductive layer is located between the first conductive layer and the source-drain metal layer, and the source-drain metal layer is located between the second conductive layer and the anode layer. It should be noted that FIG. 3 only shows the stacking position relationship of the active semiconductor layer, the first conductive layer, the second conductive layer, and the source-drain metal layer in one pixel circuit.

For example, as shown in FIG. 3, the first light-emitting control signal line EM1, the scan signal line Ga, and the second light-emitting control signal line EM2 extend along a first direction X and are arranged along a second direction Y that is not parallel to the first direction X. In the second direction Y, the scan signal line Ga is located between the first light-emitting control signal line EM1 and the second light-emitting control signal line EM1.

For example, in some embodiments, the first direction X and the second direction Y are perpendicular to each other. The first direction X may be parallel to a horizontal direction and the second direction Y may be parallel to a vertical direction.

For example, as shown in FIG. 3, in the second direction Y, an orthographic projection of the first light-emitting control signal line EM1 on the base substrate 10 and an orthographic projection of the second light-emitting control signal line EM2 on the base substrate 10 are located on both sides of an orthographic projection of the second electrode plate CC2 of the storage capacitor Cst on the base substrate 10.

For example, in the second direction Y, an orthographic projection of the scan signal line Ga on the base substrate and the orthographic projection of the second light-emitting control signal line EM2 on the base substrate are located on both sides of the orthographic projection of the second electrode plate CC2 of the storage capacitor Cst on the base substrate. That is, the orthographic projection of the first light-emitting control signal line EM1 on the base substrate and the orthographic projection of the scan signal line Ga on the base substrate are located on the same side, for example, an upper side in FIG. 3, of the orthographic projection of the second electrode plate CC2 of the storage capacitor Cst on the base substrate, and the orthographic projection of the second light-emitting control signal line EM2 on the base substrate is located on the other side, for example, a lower side in FIG. 3, of the orthographic projection of the second electrode plate CC2 of the storage capacitor Cst on the base substrate.

For example, as shown in FIG. 3, the reset signal line Rt extends along the first direction X. In the second direction Y, the reset signal line Rt is located on the side of the first light-emitting control signal line EM1 away from the scan signal line Ga, that is, in the second direction, the orthographic projection of the first light-emitting control signal line EM1 on the base substrate 10 is located between an orthographic projection of the reset signal line Rt on the base substrate 10 and the orthographic projection of the scan signal line Ga on the base substrate 10.

For example, as shown in FIG. 3, in the second direction Y, the reset signal line Rt, the first light-emitting control signal line EM1, the scan signal line Ga, and the second light-emitting control signal line EM2 are sequentially arranged from top to bottom. The present disclosure is not limited to this case. In other embodiments, the reset signal line Rt, the first light-emitting control signal line EM1, the scan signal line Ga, and the second light-emitting control signal line EM2 are arranged in order from bottom to top in the second direction Y.

For example, each rectangular solid-line box in FIG. 3 shows each part where the first conductive layer overlaps with the active semiconductor layer. The reset signal line Rt, the first light-emitting control signal line EM1, the scan signal line Ga, and the second light-emitting control signal line EM2 are all located in the first conductive layer. The active semiconductor layers in respective rectangular solid-line boxes are the active layers of transistors T1-T7, for example, the reset signal line Rt overlaps with the active semiconductor layer to define the active layer of the first reset transistor T1 and the active layer of the threshold compensation transistor T2, the first light-emitting control signal line EM1 overlaps with the active semiconductor layer to define the active layer of the first light-emitting control transistor T6 and the active layer of the second reset transistor T7, the scan signal line Ga overlaps with the active semiconductor layer to define the active layer of the data writing transistor T4, the second light-emitting control signal line EM2 overlaps with the active semiconductor layer to define the active layer of the second light-emitting control transistor T5, and the first electrode plate (not labeled) of the storage capacitor Cst overlaps with the active semiconductor layer to define the active layer of the driving transistor T3.

For example, as shown in FIG. 3, the initial signal line Vinit includes a first sub-initial signal line Vinit1 and a second sub-initial signal line Vinit2, the first sub-initial signal line Vinit1 extends along the first direction X, the second sub-initial signal line Vinit2 extends along the second direction Y, and the first sub-initial signal line Vinit1 and the second sub-initial signal line Vinit2 are electrically connected. The initial signal lines Vinit are wired in a grid on the base substrate, and have a mesh structure, that is to say, on the entire display substrate, the first sub-initial signal lines Vinit1 and the second sub-initial signal lines Vinit2 are arranged in a grid shape, so that the resistance of the initial signal line Vinit is relatively small and the IR drop is relatively low, so that the distribution of the initial signal lines Vinit on the base substrate is more uniform. Furthermore, the stability of the initial voltage provided by the initial signal line Vinit can be improved, and the initialization effect for the gate electrode of the driving transistor T3 and the first electrode of the light-emitting element 121 in the initialization phase p1 can be ensured.

For example, as shown in FIG. 3, the first voltage line VDD includes a first sub-voltage line VDD1 and a second sub-voltage line VDD2, the first sub-voltage line VDD1 and the second sub-voltage line VDD2 are electrically connected, the first sub-voltage line VDD1 extends along the second direction Y, and the second sub-voltage line VDD2 extends along the first direction X. The first voltage lines VDD are wired in a grid on the base substrate, that is, on the entire display substrate, the first sub-voltage lines VDD1 and the second sub-voltage lines VDD2 are arranged in a grid shape, so that the resistance of the first voltage line VDD is relatively small and the voltage drop of the first voltage line VDD is relatively low, thereby improving the stability of the power voltage provided by the first voltage line VDD.

For example, the second sub-voltage line VDD2 and the second electrode plate CC2 of the storage capacitor Cst are integrally formed.

For example, as shown in FIG. 3, the data line Vda, the first sub-voltage line VDD1, and the second sub-initial signal line Vinit2 all extend along the second direction Y and are arranged along the first direction X. In the example shown in FIG. 3, in the first direction X, the first sub-voltage line VDD1 is located between the data line Vda and the second sub-initial signal line Vinit2.

FIGS. 4A-4M are schematic layout diagrams of various structure layers of a pixel circuit provided by some embodiments of the present disclosure.

For example, in some embodiments, the pixel circuits of the plurality of sub-pixels 12 are arranged in an array along the first direction X and the second direction Y. The position relationship of various elements of the pixel circuit in this embodiment on the base substrate is described below with reference to FIGS. 4A-4M. The example shown in FIGS. 4A-4M takes the pixel circuit 120 shown in FIG. 2A as an example. In FIGS. 4A-4M, the part represented by the rectangular dotted-line box is a region corresponding to one pixel circuit 120, and FIGS. 4A-4M show the layout of the region corresponding to eight pixel circuits arranged in two rows and four columns.

For example, as shown in FIGS. 4A-4M, each pixel circuit 120 may include an active semiconductor layer 310, a first insulation layer (not shown), a first conductive layer 320, a second insulation layer (not shown), a second conductive layer 330, a third insulation layer 410, a source-drain metal layer 340, a planarization layer 420, and an anode layer 350. The active semiconductor layer 310, the first insulation layer (not shown), the first conductive layer 320, the second insulation layer (not shown), the second conductive layer 330, the third insulation layer 410, the source-drain metal layer 340, the planarization layer 420, and the anode layer 350 are sequentially disposed on the base substrate. That is to say, in a direction perpendicular to the base substrate, the active semiconductor layer 310 is located between the base substrate and the first conductive layer 320, the first conductive layer 320 is located between the active semiconductor layer 310 and the second conductive layer 330, the second conductive layer 330 is located between the first conductive layer 320 and the source-drain metal layer 340, the planarization layer 420 is located on the side of the source-drain metal layer 340 away from the base substrate, that is, between the source-drain metal layer 340 and the anode layer 350, the anode layer 350 is located on the side of the planarization layer 420 away from the source-drain metal layer 340. The first insulation layer is located between the active semiconductor layer 310 and the first conductive layer 320, the second insulation layer is located between the first conductive layer 320 and the second conductive layer 330, and the third insulation layer 410 is located between the second conductive layer 330 and the source-drain metal layer 340.

For example, the first insulation layer, the second insulation layer, the third insulation layer 410, and the planarization layer 420 are all made of insulation materials, such as inorganic insulation materials such as silicon nitride, silicon oxide, silicon oxynitride, or other suitable materials. The manufacturing material of the first insulation layer, the manufacturing material of the second insulation layer, the manufacturing material of the third insulation layer 410, and the manufacturing material of the planarization layer 420 may be the same, or the manufacturing materials of at least some of the first insulation layer, the second insulation layer, the third insulation layer 410, and the planarization layer 420 are different, the present disclosure is not limited to this case.

Figure 4A:
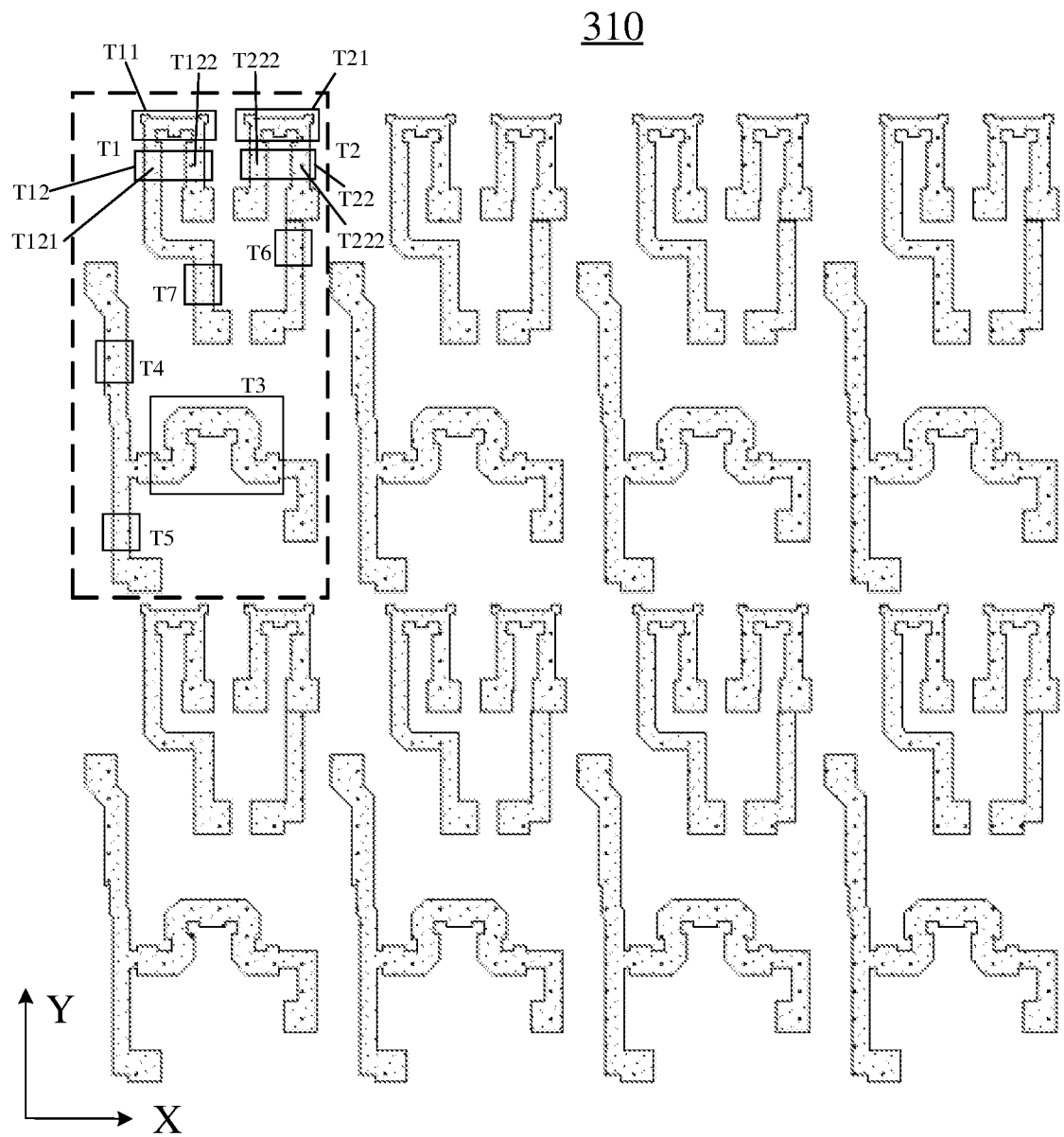
FIGS. 4A-4M are schematic layout diagrams of various structure layers of a pixel circuit provided by some embodiments of the present disclosure.

FIG. 4A shows the active semiconductor layer 310 of the pixel circuits 120. The active semiconductor layer 310 can be formed on the base substrate by patterning a semiconductor material. The active semiconductor layer 310 can be used to manufacture the active layer of the driving transistor T3, the active layer of the first reset transistor T1, the active layer of the threshold compensation transistor T2, the active layer of the data writing transistor T4, the active layer of the second light-emitting control transistor T5, the active layer of the first light-emitting control transistor T6, and the active layer of the second reset transistor T7. The active layer of each transistor can include a source region, a drain region, and a channel region between the source region and the drain region, and the channel region is used to form a channel of the transistor.

For example, respective rectangular solid-line boxes in FIG. 4A shows the active layers of the respective transistors T1-T7. As shown in FIG. 4A, the active layers of the respective transistor T1-T7 are arranged on the same layer, the active layer of the first reset transistor T1 and the active layer of the second reset transistor T7 are integrally arranged, the active layer of the threshold compensation transistor T2 and the active layer of the first light-emitting control transistor T6 are integrally arranged, and the active layer of the driving transistor T3, the active layer of the data writing transistor T4, and the active layer of the second light-emitting control transistor T5 are integrally arranged.

For example, as shown in FIG. 4A, in the second direction Y, the active layer of the first reset transistor T1, the active layer of the threshold compensation transistor T2, the active layer of the data writing transistor T4, the active layer of the first light-emitting control transistor T6, and the active layer of the second reset transistor T7 are all located on a first side, for example, an upper side as shown in FIG. 4A, of the active layer of the driving transistor T3; and the active layer of the second light-emitting control transistor T5 is located on a second side, for example, a lower side shown in FIG. 4A, of the active layer of the driving transistor T3.

For example, the active semiconductor layer 310 can be made of amorphous silicon, polysilicon, oxide semiconductor materials, or the like. It should be noted that, the above-mentioned source region and the above-mentioned drain region may be regions doped with n-type impurities or p-type impurities. In the embodiment of the present disclosure, the doped source region corresponds to a source electrode of the transistor (for example, the first electrode of the transistor), and the doped drain region corresponds to a drain electrode of the transistor (for example, the second electrode of the transistor).

Figure 4B:
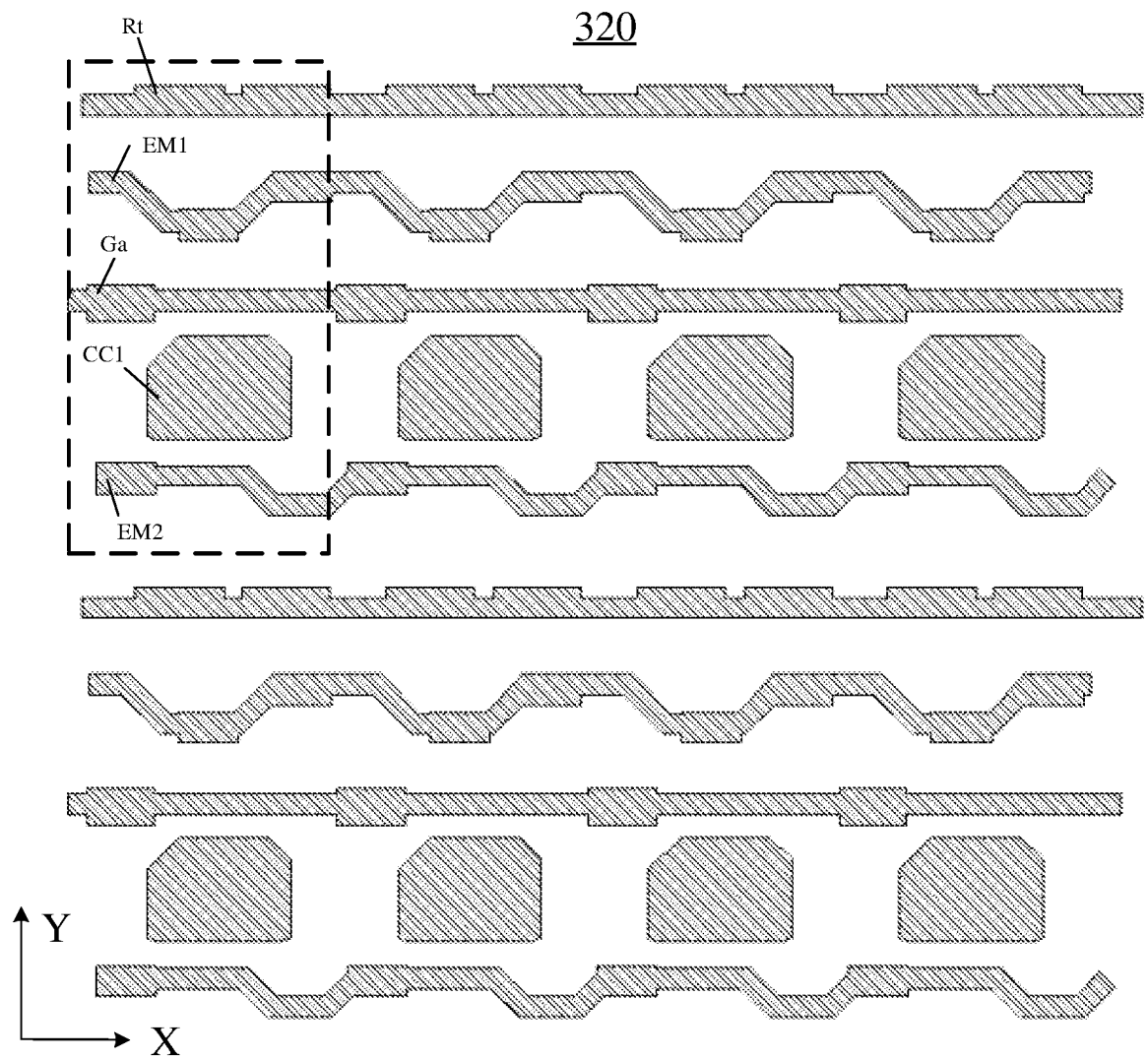

For example, a first insulation layer (not shown) is formed on a side of the above-mentioned active semiconductor layer 310 away from the base substrate to protect the above-mentioned active semiconductor layer 310. FIG. 4B shows the first conductive layer 320 of the pixel circuit 120, the first conductive layer 320 is disposed on a side of the first insulation layer away from the active semiconductor layer 310 so as to be insulated from the active semiconductor layer 310. It should be noted that respective rectangular solid-line boxed in FIG. 4A shows respective parts where the first conductive layer 320 overlaps with the active semiconductor layer 310.

For example, the reset signal line Rt, the first light-emitting control signal line EM1, the scan signal line Ga, and the second light-emitting control signal line EM2 are all located in the first conductive layer 320. In addition, the first conductive layer 320 may further include the first electrode plate CC1 of the storage capacitor Cst, the gate electrode of the first reset transistor T1, the gate electrode of the threshold compensation transistor T2, the gate electrode of the data writing transistor T4, the gate electrode of the second light-emitting control transistor T5, the gate electrode of the first light-emitting control transistor T6, the gate electrode of the second reset transistor T7, and the gate electrode of the driving transistor T3.

For example, as shown in FIG. 4B, the reset signal line Rt, the first light-emitting control signal line EM1, the scan signal line Ga, and the second light-emitting control signal line EM2 all extend substantially along the first direction X. In the second direction Y, the reset signal line Rt, the first light-emitting control signal line EM1, the scan signal line Ga, and the second light-emitting control signal line EM2 are arranged in turn. That is, the first light-emitting control signal line EM1 is located between the reset signal line Rt and the scan signal line Ga, and the scan signal line Ga is located between the first light-emitting control signal line EM1 and the second light-emitting control signal line EM2.

For example, as shown in FIG. 4B, a shape of the reset signal line Rt and a shape of the scan signal line Ga are substantially in a straight line shape, and a shape of the first light-emitting control signal line EM1 and a shape of the second light-emitting control signal line EM2 are substantially in a curved shape, for example, a shape of a wavy line.

For example, the reset signal line Rt is electrically connected to the gate electrode of the first reset transistor T1 and the gate electrode of the threshold compensation transistor T2 for controlling the first reset transistor T1 and the threshold compensation transistor T2 to be turned on or off; the first light-emitting control signal line EM1 is electrically connected to the gate electrode of the first light-emitting control transistor T6 and the gate electrode of the second reset transistor T7 for controlling the first light-emitting control transistor T6 and the second reset transistor T7 to be turned on or off; the scan signal line Ga is electrically connected to the gate electrode of the data writing transistor T4 for controlling the data writing transistor T4 to be turned on or off; the second light-emitting control signal line EM2 is electrically connected to the gate electrode of the second light-emitting control transistor T5 for controlling the second light-emitting control transistor T5 to be turned on or off.

Figure 4C:
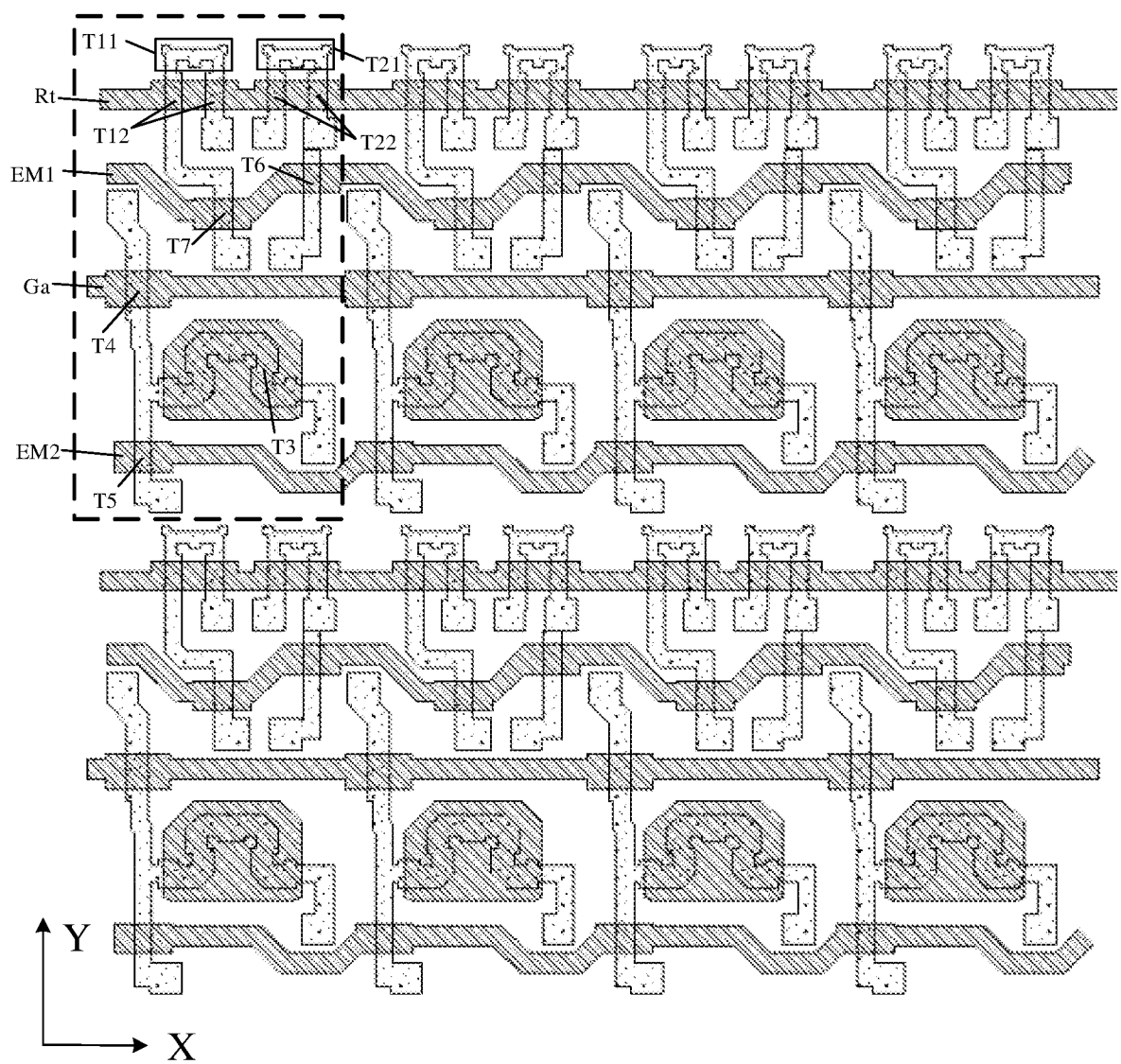

FIG. 4C is a schematic diagram of the stacking position relationship between the active semiconductor layer 310 and the first conductive layer 320.

For example, in the direction perpendicular to the base substrate, the reset signal line Rt at least partially overlaps with the active layer of the first reset transistor T1 and the active layer of the threshold compensation transistor T2; the first light-emitting control signal line EM1 at least partially overlaps with the active layer of the first light-emitting control transistor T6 and the active layer of the second reset transistor T7; the scan signal line Ga at least partially overlaps with the active layer of the data writing transistor T4; the second light-emitting control signal line EM2 at least partially overlaps with the active layer of the second light-emitting control transistor T5.

As shown in FIG. 4C, the reset signal line Rt, the gate electrode of the first reset transistor T1, and the gate electrode of the threshold compensation transistor T2 are integrally provided, and the parts of the reset signal line Rt that overlaps with the active semiconductor layer 310 are the gate electrode of the first reset transistor T1 and the gate electrode of the threshold compensation transistor T2; the first light-emitting control signal line EM1, the gate electrode of the first light-emitting control transistor T6, and the gate electrode of the second reset transistor T7 are integrally provided, and the parts of the first light-emitting control signal line EM1 overlapping with the active semiconductor layer 310 are the gate electrode of the first light-emitting control transistor T6 and the gate electrode of the second reset transistor T7; the scan signal line Ga and the gate electrode of the data writing transistor T4 are integrally provided, and the part of the scan signal line Ga overlapping with the active semiconductor layer 310 is the gate electrode of the data writing transistor T4; the second light-emitting control signal line EM2 and the gate electrode of the second light-emitting control transistor T5 are integrally provided, and the part of the second light-emitting control signal line EM2 overlapping with the active semiconductor layer 310 is the gate electrode of the second light-emitting control transistor T5. The gate electrode of the driving transistor T3 may be the first electrode plate CC1 of the storage capacitor Cst.

For example, as shown in FIG. 4B, the first electrode plate CC1 of the storage capacitor Cst is located between the second light-emitting control signal line EM2 and the scan signal line Ga. For example, as shown in FIG. 4C, in the direction perpendicular to the base substrate, the part, covered by the first electrode plate CC1 of the storage capacitor Cst of the first conductive layer 320, of the active semiconductor layer 310 is the active layer of the driving transistor T3, and the shape of the active layer of the driving transistor T3 is the shape of the Chinese character " 几 ".

For example, the active layer of the first reset transistor T1 is a reset active layer, that is, the first reset transistor T1 includes the reset active layer, and the reset active layer includes a first reset active layer portion T11 and a second reset active layer portion T12. For example, as shown in FIG. 4C, an orthographic projection of the second reset active layer portion T12 on the base substrate and the orthographic projection of the reset signal line Rt on the base substrate at least partially overlap.

For example, as shown in FIGS. 4A and 4C, in the direction perpendicular to the base substrate, the part, covered by the reset signal line Rt of the first conductive layer 320, of the active semiconductor layer 310 includes the second reset active layer portion T12, the second reset active layer portion T12 includes two parts spaced apart from each other, that is, the first reset transistor T1 is a double-gate transistor. The first reset active layer portion T11 and the second reset active layer portion T12 generally form a U-shape as a whole, that is, the first reset transistor T1 is a U-shaped double-gate transistor.

For example, the active layer of the threshold compensation transistor T2 is a compensation active layer, that is, the threshold compensation transistor T2 includes the compensation active layer, and the compensation active layer includes a first compensation active layer portion T21 and a second compensation active layer portion T22. For example, as shown in FIG. 4C, an orthographic projection of the second compensation active layer portion T22 on the base substrate and the orthographic projection of the reset signal line Rt on the base substrate at least partially overlap.

For example, as shown in FIGS. 4A and 4C, in the direction perpendicular to the base substrate, the part, covered by the reset signal line Rt of the first conductive layer 320, of the active semiconductor layer 310 includes the second compensation active layer portion T22, the second compensation active layer portion T22 includes two parts spaced apart from each other, that is, the threshold compensation transistor T2 is a double-gate transistor. The first compensation active layer portion T21 and the second compensation active layer portion T22 generally form a U shape as a whole, that is, the threshold compensation transistor T2 is a U-shaped double-gate transistor.

For example, as shown in FIG. 4A and FIG. 4C, the first reset active layer portion T11 and the first compensation active layer portion T21 are sequentially arranged in the first direction X, and a center of the first reset active layer portion T11 and a center of the first compensation active layer portion T21 are substantially located on the same straight line, for example, the same straight line is parallel to the first direction X.

For example, the shape of the first reset active layer portion T11 and the shape of the first compensation active layer portion T21 are approximately the same.

For example, the first reset transistor T1 includes two gate electrodes, and the threshold compensation transistor T2 includes two gate electrodes. As shown in FIG. 4C, the reset signal line Rt and the active semiconductor layer 310 overlap each other in the direction perpendicular to the base substrate to form four overlapping parts, and the four overlapping parts are the two gate electrodes of the first reset transistor T1 and the two gate electrodes of the threshold compensation transistor T2, respectively.

For example, as shown in FIG. 4A, the second reset active layer portion T12 includes a first sub-portion T121 and a second sub-portion T122 spaced apart from each other, and the second compensation active layer portion T22 includes a third sub-portion T221 and a fourth sub-portion T222 spaced apart from each other. For example, the first sub-portion T121, the second sub-portion T122, the third sub-portion T221, and the fourth sub-portion T222 are arranged in sequence in the first direction X, a center of the first sub-portion T121, a center of the second sub-portion T122, a center of the third sub-portion T221, and a center of the fourth sub-portion T222 are substantially located on the same straight line, for example, the same straight line is parallel to the first direction X. In the second direction Y, a length of the first sub-portion T121, a length of the second sub-portion T122, a length of the third sub-portion T221, and a length of the fourth sub-portion T222 are approximately equal.

For example, in the first direction X, the length of the first sub-portion T121 is slightly smaller than the length of the second sub-portion T122, and the length of the third sub-portion T221 is slightly smaller than the length of the fourth sub-portion T222.

For example, the shape of the first sub-portion T121, the shape of the second sub-portion T122, the shape of the third sub-portion T221, and the shape of the fourth sub-portion T222 are all rectangular.

For example, as shown in FIG. 4C, in the direction perpendicular to the base substrate, the parts, covered by the first light-emitting control signal line EM1 of the first conductive layer 320, of the active semiconductor layer 310 are the active layer of the first light-emitting control transistor T6 and the active layer of the second reset transistor T7, and the shape of the active layer of the first light-emitting control transistor T6 and the shape of the active layer of the second reset transistor T7 are both rectangular.

For example, as shown in FIG. 4C, in the direction perpendicular to the base substrate, the part, covered by the scan signal line Ga of the first conductive layer 320, of the active semiconductor layer 310 is the active layer of the data writing transistor T4, and the shape of the active layer of the data writing transistor T4 is rectangular.

For example, as shown in FIG. 4C, in the direction perpendicular to the base substrate, the part, covered by the second light-emitting control signal line EM2 of the first conductive layer 320, of the active semiconductor layer 310 is the active layer of the second light-emitting control transistor T5, and the shape of the active layer of the second light-emitting control transistor T5 is rectangular.

For example, as shown in FIG. 4C, in the second direction Y, the gate electrode of the first reset transistor T1, the gate electrode of the threshold compensation transistor T2, the gate electrode of the data writing transistor T4, the gate electrode of the first light-emitting control transistor T6, and the gate electrode of the second reset transistor T7 are all located on the first side, for example, the upper side as shown in FIG. 4C, of the gate electrode of the driving transistor T3; the gate electrode of the second light-emitting control transistor T5 is located on the second side, for example, the lower side shown in FIG. 4C, of the gate electrode of the driving transistor T3.

Figure 4D:
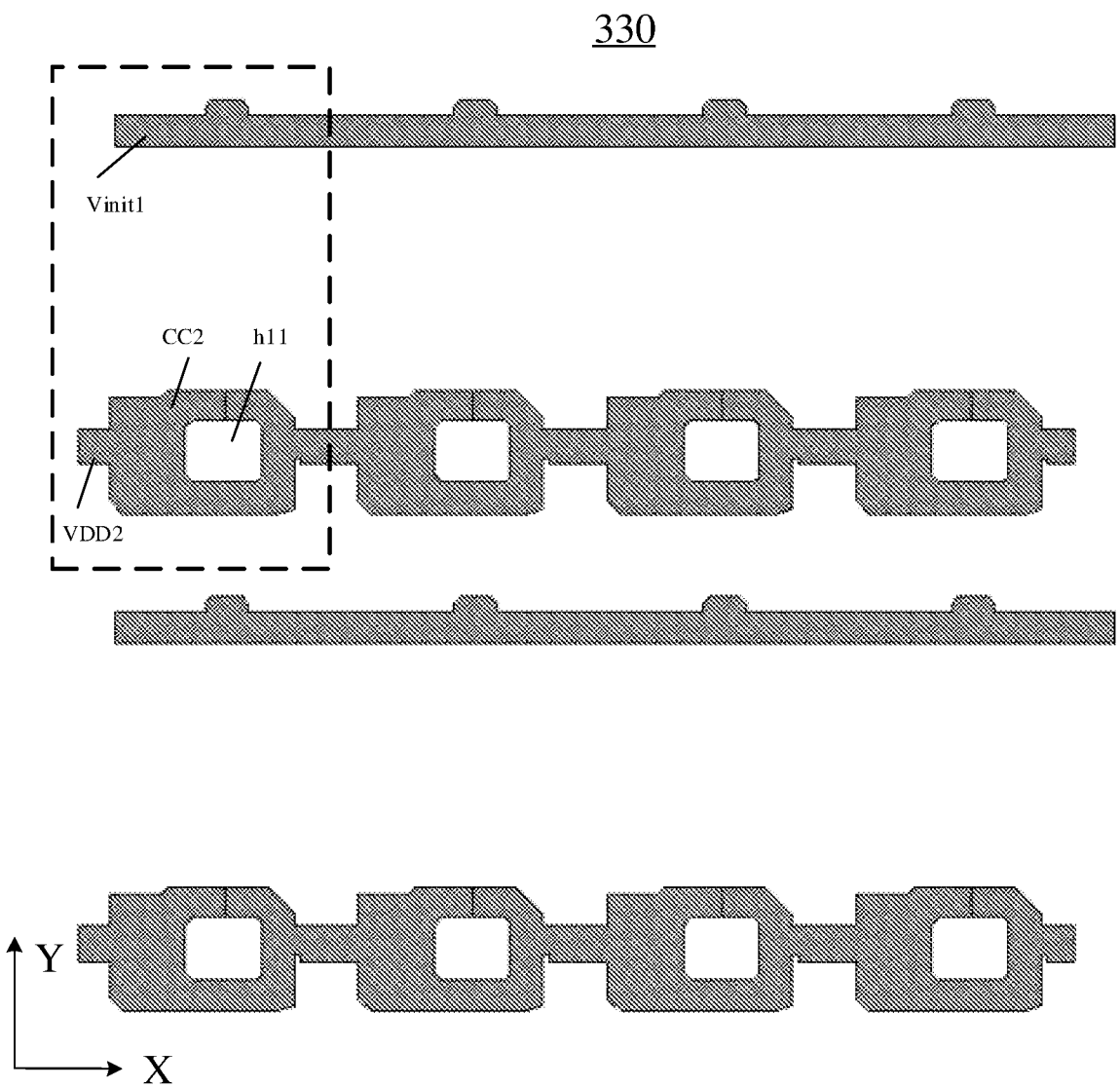
Figure 4E:
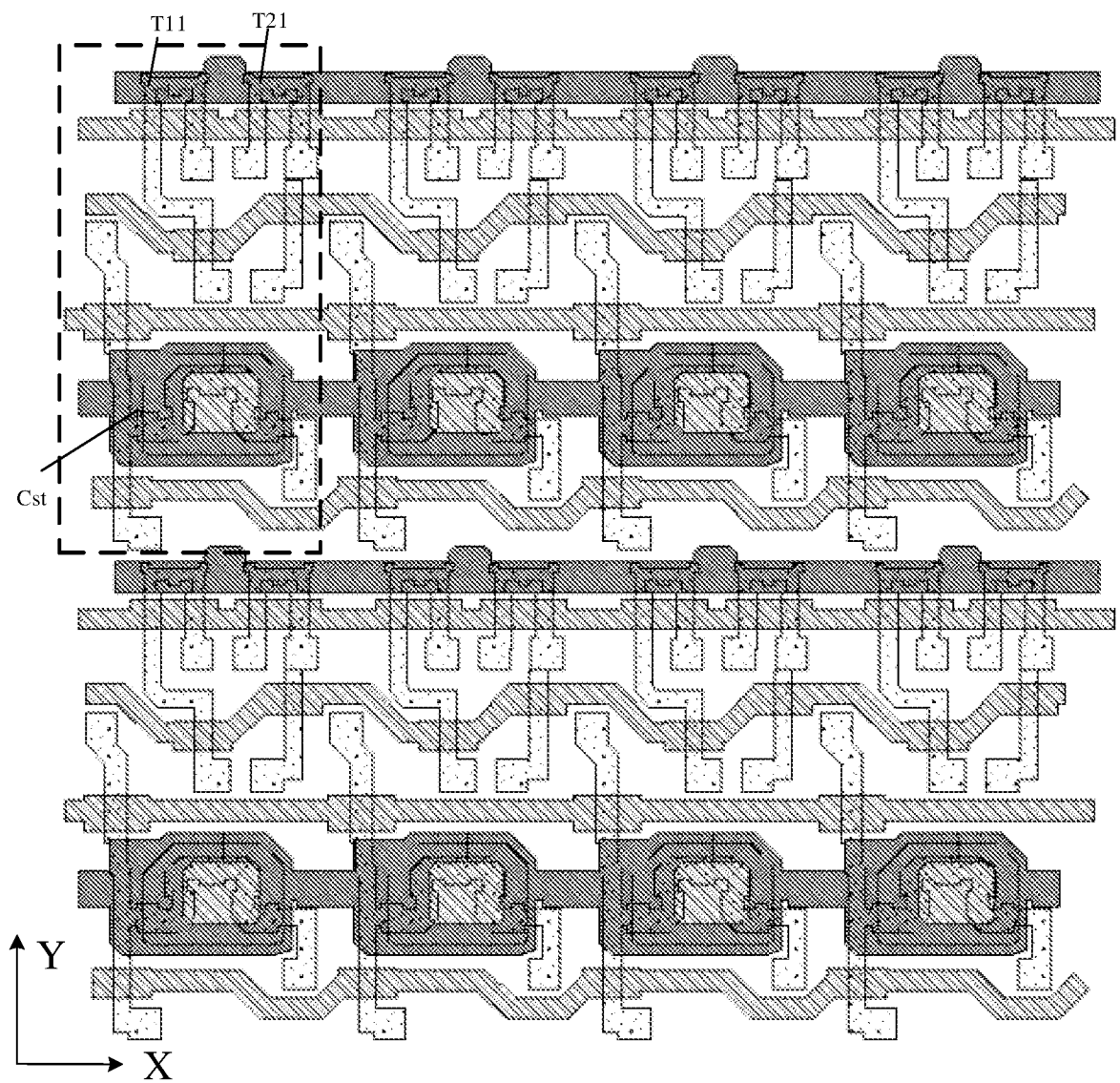

FIG. 4E is a schematic diagram of the stacking position relationship of the active semiconductor layer 310, the first conductive layer 320, and the second conductive layer 330.

For example, a second insulation layer (not shown) is formed on the side of the first conductive layer 320 away from the first insulation layer for protecting the first conductive layer 320. FIG. 4D shows the second conductive layer 330 of the pixel circuit 120. The second conductive layer 330 is formed on the side of the second insulation layer away from the first conductive layer 320. The second conductive layer 330 includes the second electrode plate CC2 of the storage capacitor Cst, the first sub-initial signal line Vinit1, and the second sub-voltage line VDD2. As shown in FIG. 4E, both the first sub-initial signal line Vinit1 and the second sub-voltage line VDD2 extend along the first direction X and are arranged along the second direction Y. In the direction perpendicular to the base substrate, the first electrode plate CC1 of the storage capacitor Cst and the second electrode plate CC2 of the storage capacitor Cst at least partially overlap to form the storage capacitor Cst. For example, the second sub-voltage line VDD2 is integrally formed with the second electrode plate CC2 of the storage capacitor Cst.

For example, as shown in FIG. 4D and FIG. 4E, the second electrode plate CC2 of the storage capacitor Cst includes a conductive layer hole h11, and the second electrode of the threshold compensation transistor T2 and the second electrode of the second reset transistor T7 are electrically connected to the first electrode plate CC1 of the storage capacitor Cst, that is, the gate electrode of the driving transistor T3, through conductive layer hole h11.

For example, an orthographic projection of the first reset active layer portion T11 on the base substrate at least partially overlaps with an orthographic projection of the initial signal line Vinit on the base substrate, and an orthographic projection of the first compensation active layer portion T21 on the base substrate at least partially overlaps with the orthographic projection of the initial signal line Vinit on the base substrate.

For example, as shown in FIG. 4D and FIG. 4E, the initial signal line Vinit includes a first sub-initial signal line Vinit1, and the orthographic projection of the first reset active layer portion T11 on the base substrate and the orthographic projection of the first compensation active layer portion T21 on the base substrate are both located within the orthographic projection of the first sub-initial signal line Vinit1 on the base substrate. In the embodiment of the present disclosure, the first sub-initial signal line Vinit1 shields the part, that is not shielded by the reset signal line Rt, of the active layer of the first reset transistor T1 and the part, that is not shielded by the reset signal line Rt, of the active layer of the threshold compensation transistor T2 at the same time, a shielding layer does not need to be separately set to shield them, and at the same time, the wiring on the display substrate can be reduced and the cost can be reduced. In addition, shielding the part, that is not shielded by the reset signal line Rt, of the active layer of the first reset transistor T1 and the part, that is not shielded by the reset signal line Rt, of the active layer of the threshold compensation transistor T2 through the first sub-initial signal line Vinit1 can make the first reset transistor T1 and the threshold compensation transistor T2 more stable.

Figure 4F:
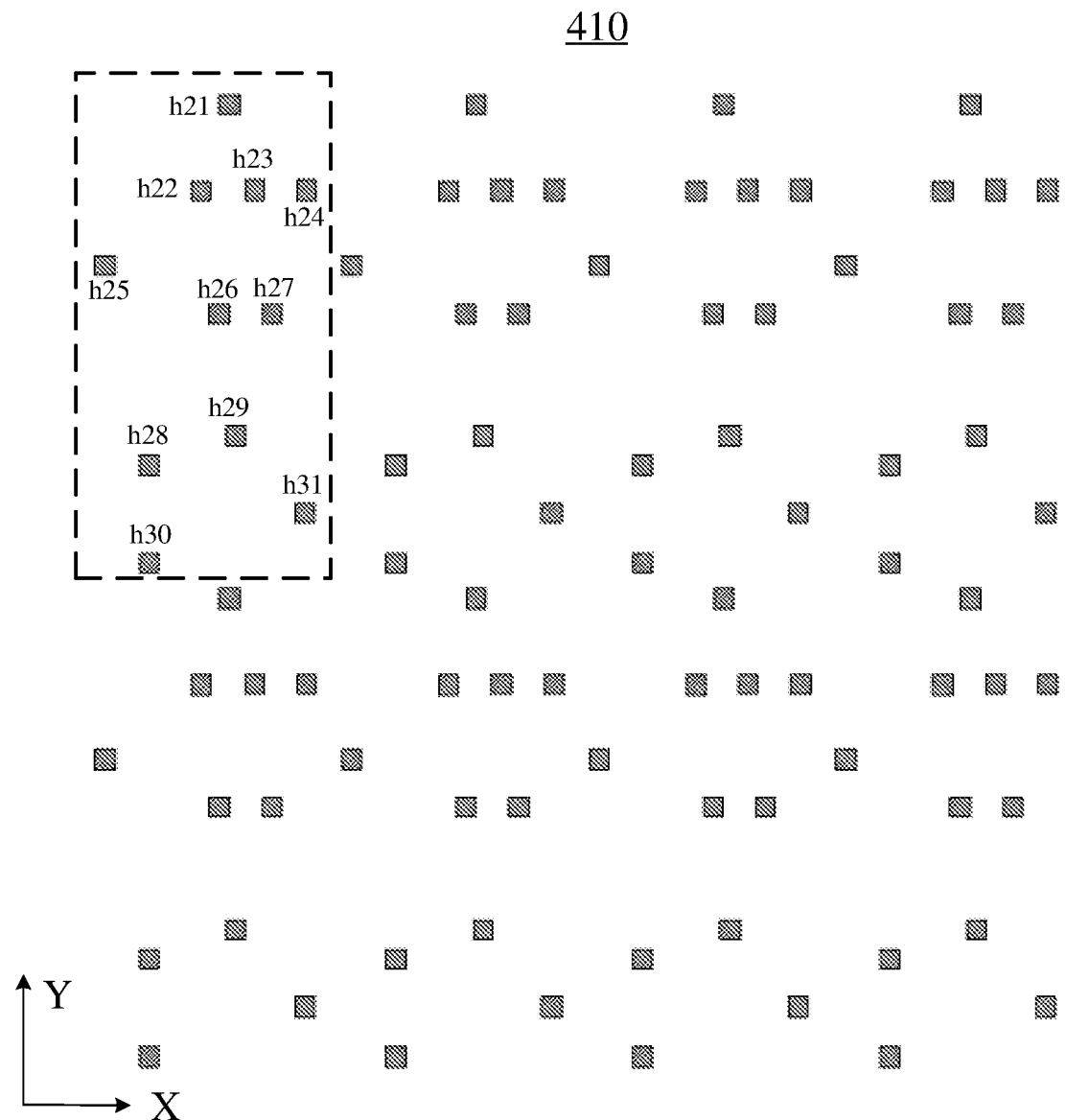
Figure 4G:
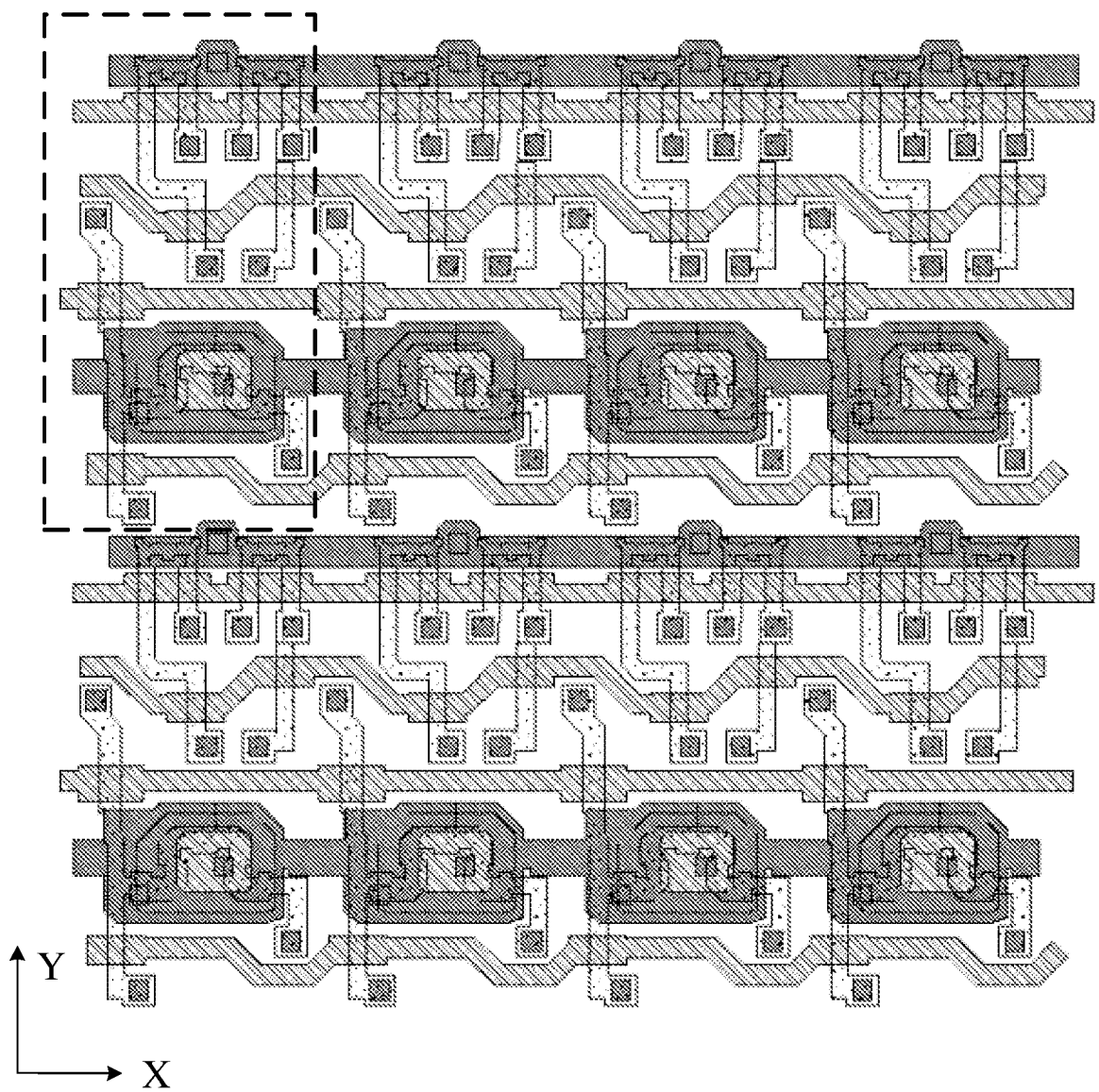

FIG. 4G is a schematic diagram of the stacking position relationship of the active semiconductor layer 310, the first conductive layer 320, the second conductive layer 330, and the third insulation layer 410.

For example, as shown in FIG. 4F, a third insulation layer 410 is formed on the side of the second conductive layer 330 away from the second insulation layer to protect the second conductive layer 330. A plurality of insulation layer holes h21-h31 are formed in the third insulation layer 410. The plurality of insulation layer holes h21-h31 correspond to one pixel circuit.

For example, as shown in FIGS. 4F and 4G, the insulation layer hole h21 penetrates through the third insulation layer 410 to expose a part of the first sub-initial signal line Vinit1; the insulation layer holes h22-27 and the insulation layer holes h30-31 penetrate through the first insulation layer, the second insulation layer, and the third insulation layer 410 to expose parts of the active semiconductor layer 310; the insulation layer hole h28 penetrates through the third insulation layer 410 to expose a part of the second electrode plate CC2 of the storage capacitor Cst; the insulation layer hole h29 penetrates through the second insulation layer and the third insulation layer 410 to expose a part of the first electrode plate CC1 of the storage capacitor Cst. For example, an orthographic projection of the insulation layer hole h29 on the base substrate is located within an orthographic projection of the conductive layer hole h11 on the base substrate.

Figure 4H:
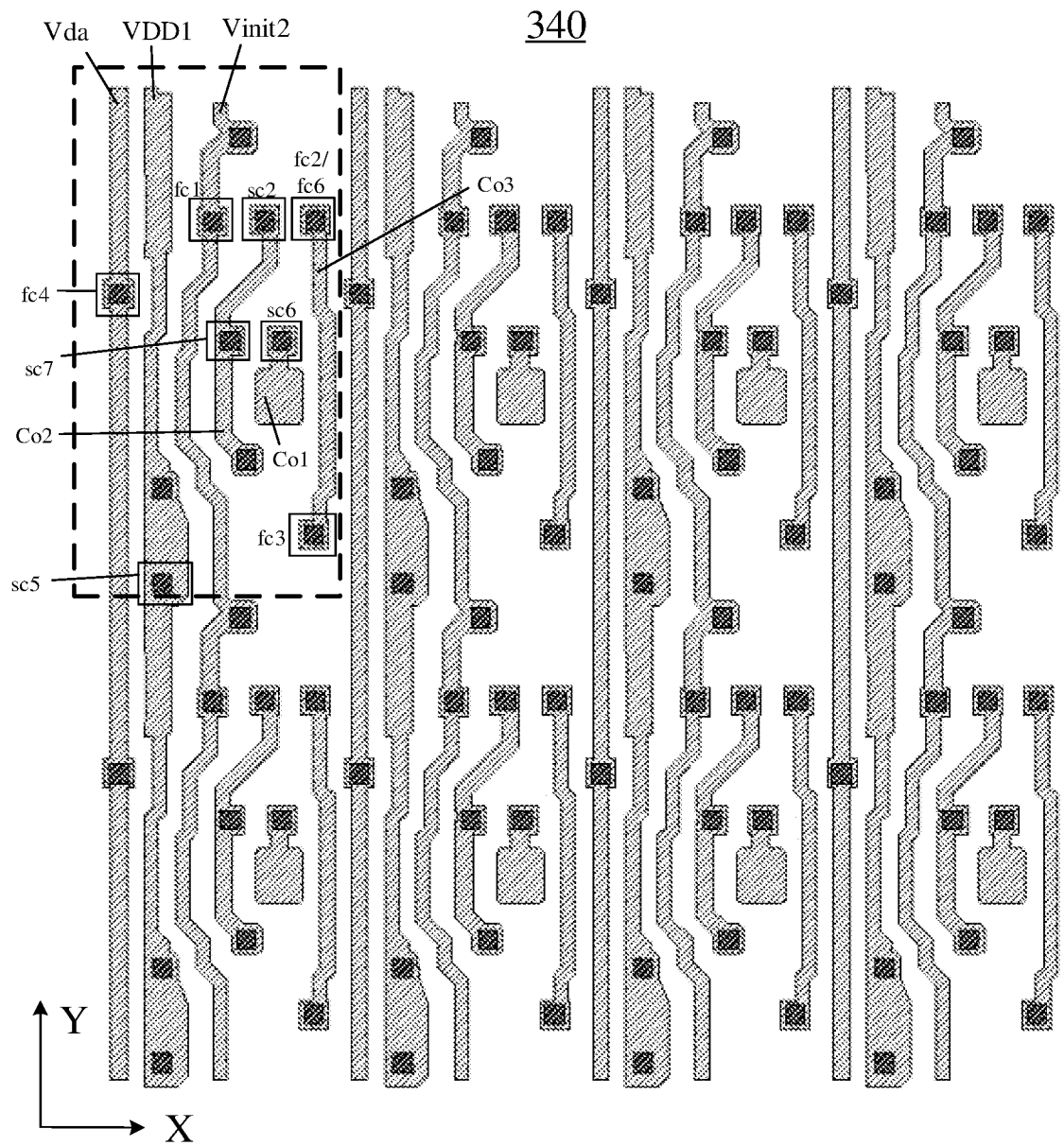
Figure 4I:
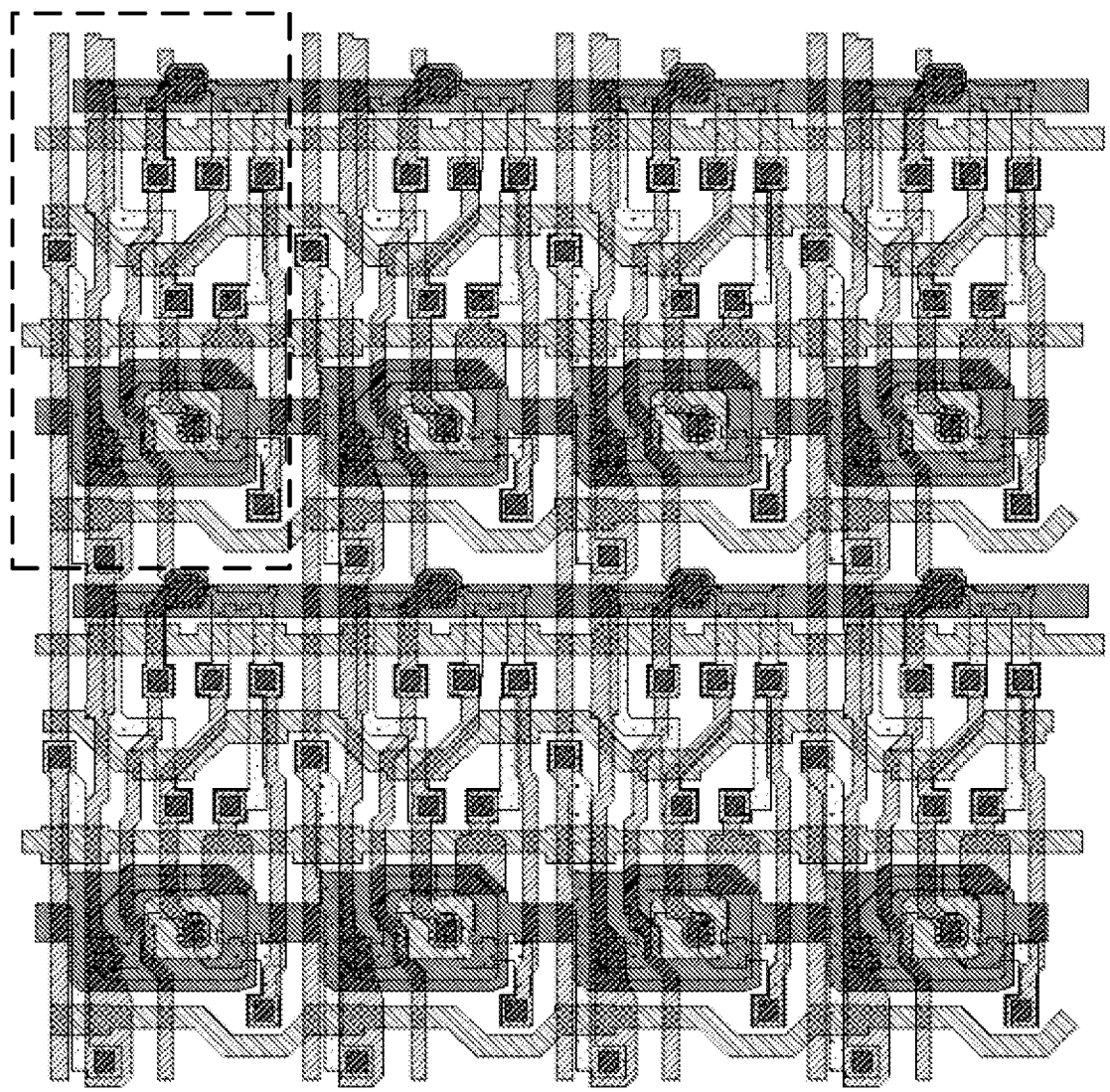

FIG. 4H shows the source-drain metal layer 340 of the pixel circuit 120. The source-drain metal layer 340 is arranged on the side of the third insulation layer 410 away from the second conductive layer 330. FIG. 4I shows a schematic diagram of the stacking position relationship of the active semiconductor layer 310, the first conductive layer 320, the second conductive layer 330, the third insulation layer 410, and the source-drain metal layer 340.

For example, as shown in FIG. 4H, the source-drain metal layer 340 includes the data line Vda, the first sub-voltage line VDD1, the second sub-initial signal line Vinit2, the first electrode fc1 of the first reset transistor T1, the first electrode fc2 and the second electrode sc2 of the threshold compensation transistor T2, the first electrode fc3 of the driving transistor T3, the first electrode fc4 of the data writing transistor T4, the second electrode sc5 of the second light-emitting control transistor T5, the first electrode fc6 and the second electrode sc6 of the first light-emitting control transistor T6, the second electrode sc7 of the second reset transistor T7, a first connection electrode Co1, a second connection electrode Co2, and a third connection electrode Co3.

For example, as shown in FIGS. 4F, 4H, and 4I, the first electrode fc1 of the first reset transistor T1 is connected to the second sub-initial signal line Vinit2, for example, the first electrode fc1 of the first reset transistor T1 is a part of the second sub-initial signal line Vinit2. The first electrode fc1 of the first reset transistor T1 is connected to a source region or a drain region, corresponding to the first reset transistor T1, in the active semiconductor layer 310 through the insulation layer hole h22.

For example, as shown in FIGS. 4F, 4H, and 4I, the first electrode fc2 of the threshold compensation transistor T2 and the first electrode fc6 of the first light-emitting control transistor T6 are the same electrode, and are connected to a source region or a drain region, corresponding to the threshold compensation transistor T2 and the first light-emitting control transistor T6, in the active semiconductor layer 310 through the insulation layer hole h24. The second electrode sc2 of the threshold compensation transistor T2 is connected to a source region or a drain region, corresponding to the threshold compensation transistor T2, in the active semiconductor layer 310 through the insulation layer hole h23.

For example, the first electrode fc2 of the threshold compensation transistor T2 and the first electrode fc6 of the first light-emitting control transistor T6 are a part of the third connection electrode Co3. The second electrode sc2 of the threshold compensation transistor T2 is a part of the second connection electrode Co2.

For example, the second electrode sc6 of the first light-emitting control transistor T6 is connected to the first connection electrode Co1, for example, the second electrode sc6 of the first light-emitting control transistor T6 is a part of the first connection electrode Co1. For example, the second electrode sc6 of the first light-emitting control transistor T6 is connected to a source region or a drain region, corresponding to the first light-emitting control transistor T6, in the active semiconductor layer 310 through the insulation layer hole h27.

For example, as shown in FIGS. 4F, 4H, and 4I, the first electrode fc4 of the data writing transistor T4 is connected to the data line Vda, for example, the first electrode fc4 of the data writing transistor T4 is a part of the data line Vda, the first electrode fc4 of the data writing transistor T4 is connected to a source region or a drain region, corresponding to the data writing transistor T4, in the active semiconductor layer 310 through the insulation layer hole h25.

For example, as shown in FIGS. 4F, 4H, and 4I, the first electrode fc5 of the second light-emitting control transistor T5 is connected to the first sub-voltage line VDD1, for example, the first electrode fc5 of the second light-emitting control transistor T5 is a part of the first sub-voltage line VDD1. The first electrode fc5 of the second light-emitting control transistor T5 is connected to a source region or a drain region, corresponding to the second light-emitting control transistor T5, in the active semiconductor layer 310 through the insulation layer hole h30.

For example, as shown in FIGS. 4F, 4H, and 4I, the second electrode sc7 of the second reset transistor T7 is connected to a source region or a drain region, corresponding to the second reset transistor T7, in the active semiconductor layer 310 through the insulation layer hole h26. The second electrode sc7 of the second reset transistor T7 is connected to the second connection electrode Co2, for example, the second electrode sc7 of the second reset transistor T7 is a part of the second connection electrode Co2.

For example, as shown in FIGS. 4F, 4H, and 4I, the first electrode fc3 of the driving transistor T3 is connected to a source region or a drain region, corresponding to the driving transistor T3, in the active semiconductor layer 310 through the insulation layer hole h31. The first electrode fc3 of the driving transistor T3 is connected to the third connection electrode Co3, for example, the first electrode fc3 of the driving transistor T3 is a part of the third connection electrode Co3.

For example, as shown in FIGS. 4F and 4H, the second connection electrode Co2 is connected to the first electrode plate CC1 of the storage capacitor Cst, that is, the gate electrode of the driving transistor T3, through the insulation layer hole h29.

For example, as shown in FIGS. 4F and 4H, the second sub-initial signal line Vinit2 is electrically connected to the first sub-initial signal line Vinit1 through the insulation layer via h21.

For example, as shown in FIGS. 4F and 4H, the first sub-voltage line VDD1 is electrically connected to the second sub-voltage line VDD2 through the insulation layer hole h28.

For example, the second electrode of the data writing transistor T4, the first electrode of the second light-emitting control transistor T5, and the second electrode of the driving transistor T3 are integrally provided.

For example, as shown in FIGS. 4D and 4H, the first sub-voltage line VDD1 and the second sub-voltage line VDD2 are located in different layers, the second sub-voltage line VDD2 is located in the second conductive layer 330, and the first sub-voltage line VDD1 is located in the source-drain metal layer 340. The first sub-initial signal line Vinit1 and the second sub-initial signal line Vinit2 are located in different layers, the first sub-initial signal line Vinit1 is located in the second conductive layer 330, and the second sub-initial signal line Vinit2 is located in the source-drain metal layer 340.

For example, as shown in FIG. 4H, the data line Vda generally extends along the second direction Y. The first sub-voltage line VDD1, the data line Vda, and the second sub-initial signal line Vinit2 are located in the same layer, that is, the source-drain metal layer 340. The first sub-voltage line VDD1, the data line Vda, and the second sub-initial signal line Vinit2 are arranged along the first direction X, and in the first direction X, the first sub-voltage line VDD1 is located between the data line Vda and the second sub-initial signal line Vinit2.

Figure 4J:
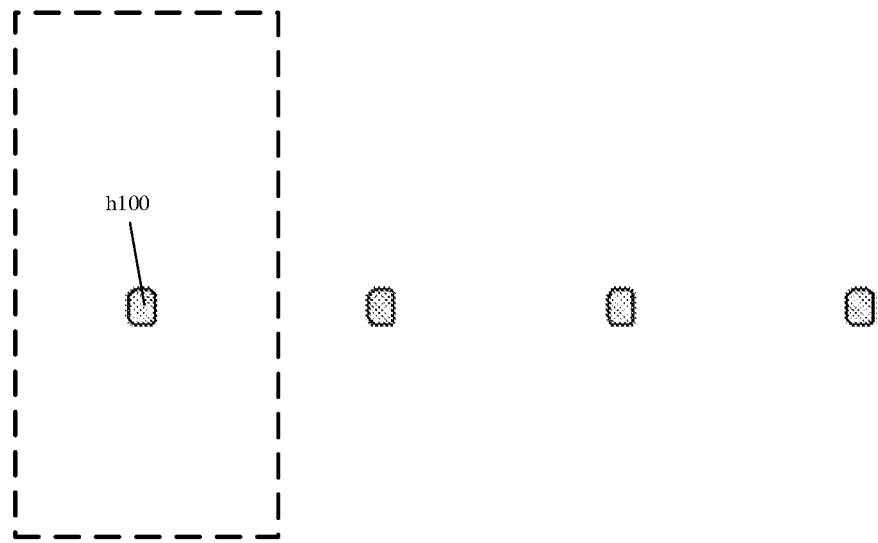
Figure 4J:
Figure 4J:
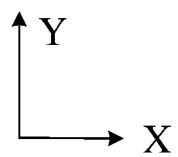

For example, a planarization layer 420 is formed on the side of the source-drain metal layer 340 away from the third insulation layer 410 to protect the source-drain metal layer 340. As shown in FIG. 4J, the planarization layer 420 includes a first hole h100, and the first hole h100 penetrates through the planarization layer 420. For example, the second electrode of the first light-emitting control transistor T6 is electrically connected to the first electrode of the light-emitting element 121 through the first hole h100 penetrating through the planarization layer 420.

Figure 4K:
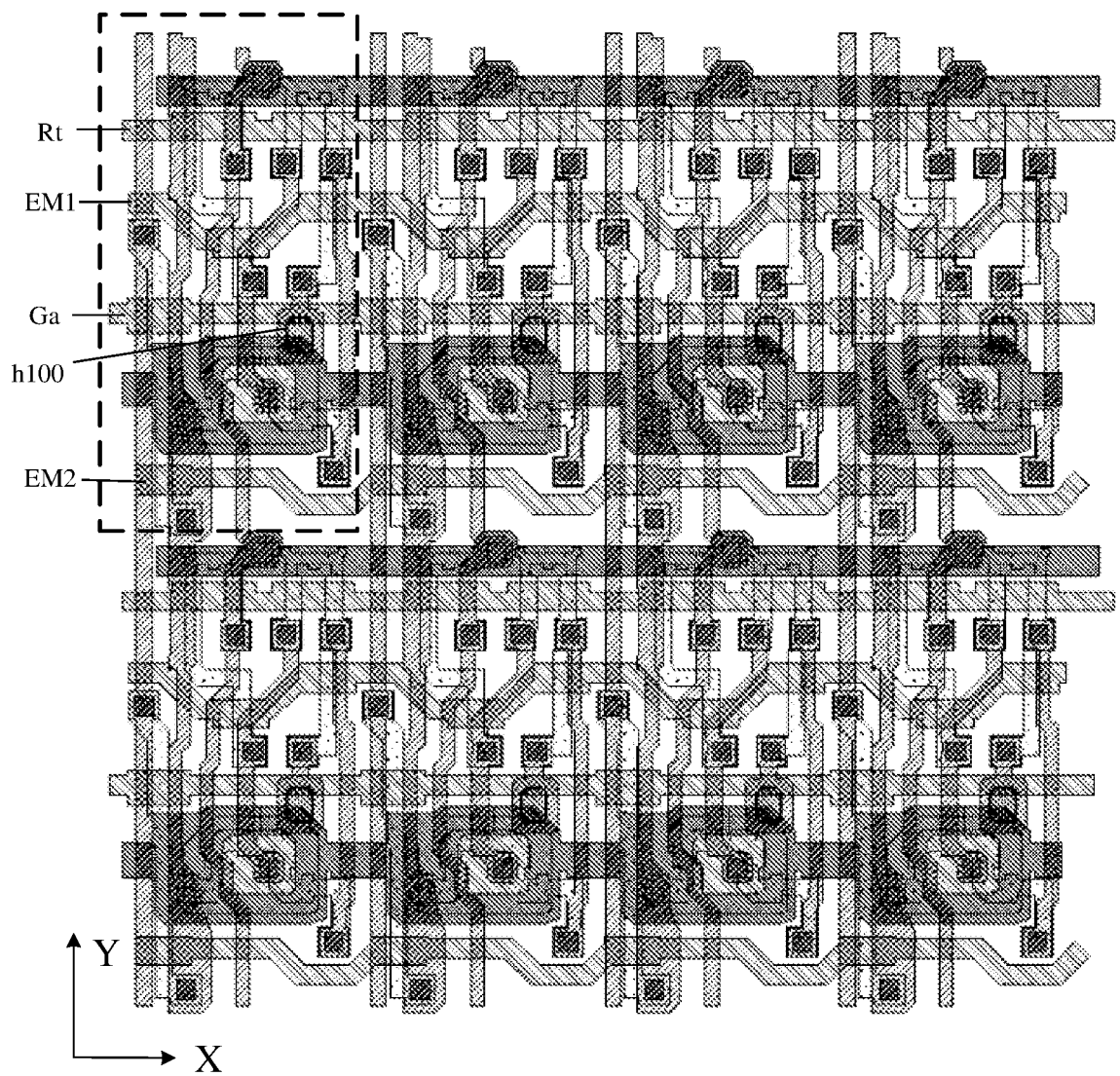

FIG. 4K is a schematic diagram of the stacking position relationship of the active semiconductor layer 310, the first conductive layer 320, the second conductive layer 330, the third insulation layer 410, the source-drain metal layer 340, and the planarization layer 420.

For example, as shown in FIG. 4K, in the second direction Y, an orthographic projection of the first hole h100 on the base substrate is located between the orthographic projection of the reset signal line Rt on the base substrate and the orthographic projection of the second light-emitting control signal line EM2 on the base substrate. In the second direction Y, the first hole h100 can be arranged at any position between the reset signal line Rt and the second light-emitting control signal line EM2, that is, in the embodiment of the present disclosure, the setting position of the first hole h100 is more flexible, which can be adapted to pixel circuits with various pixel arrangements. In addition, the position of the first hole h100 can be flexibly adjusted according to the setting position of the first electrode of the light-emitting element 121, so that the first hole h100 is closer to the first electrode of the light-emitting element 121, the routing of the first electrode of the light-emitting element 121 is reduced, and the connection between the first electrode of the light-emitting element 121 and the second electrode of the first light-emitting control transistor T6 is more flexible.

As shown in FIG. 4K, the first hole h100 is located near the scan signal line Ga, and in the second direction Y, the orthographic projection of the first hole h100 on the base substrate is roughly located between the orthographic projection of the scan signal line Ga on the base substrate and the orthographic projection of the second light-emitting control signal line EM2 on the base substrate.

For example, the orthographic projection of the first hole h100 on the base substrate is located within the orthographic projection of the first connection electrode Co1 on the base substrate, that is, the first hole h100 exposes a part of the first connection electrode Co1, and the first electrode of the light-emitting element 121 can be connected to the first connection electrode Co1 through the first hole h100.

Figure 4L:
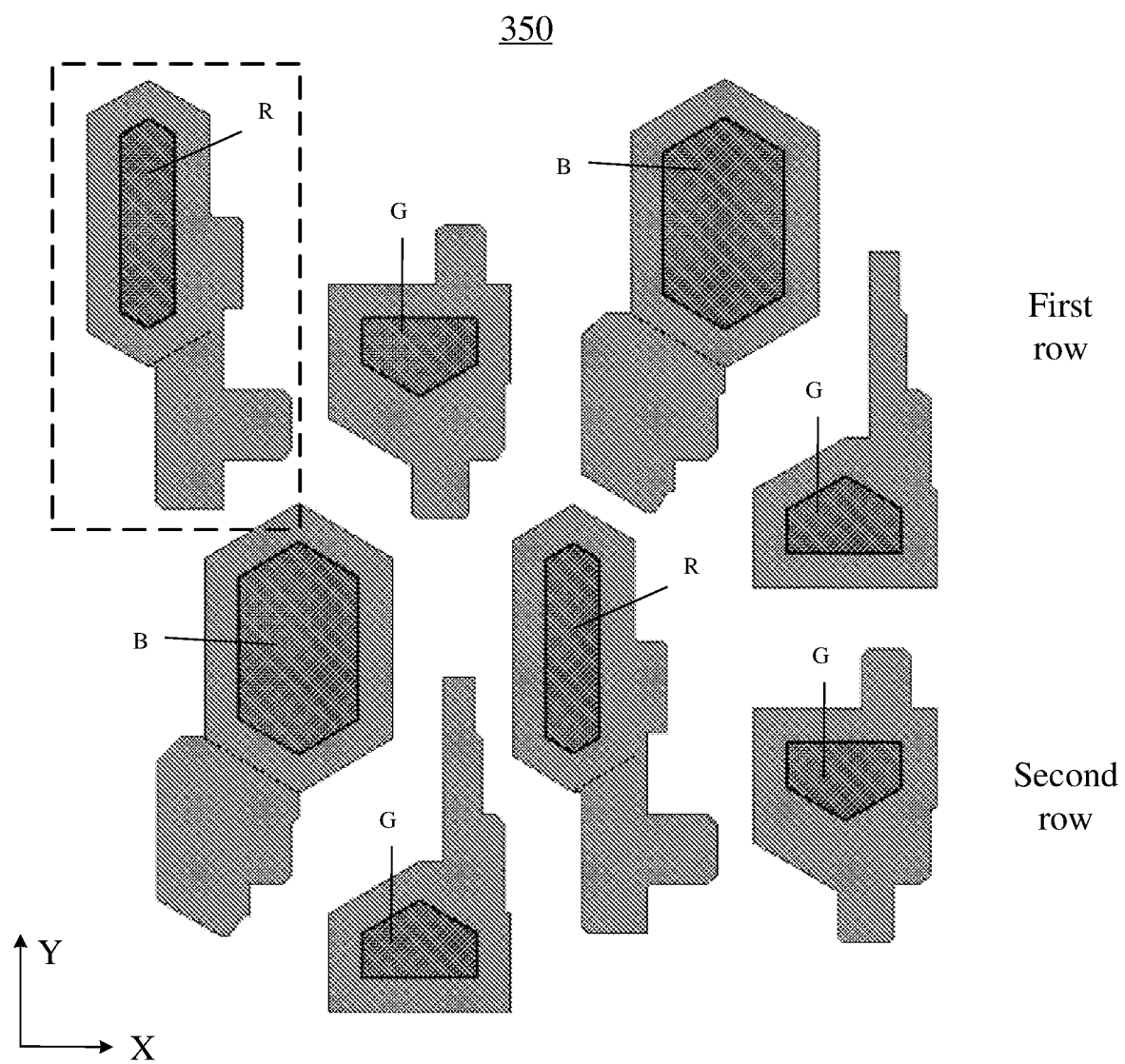
Figure 4M:
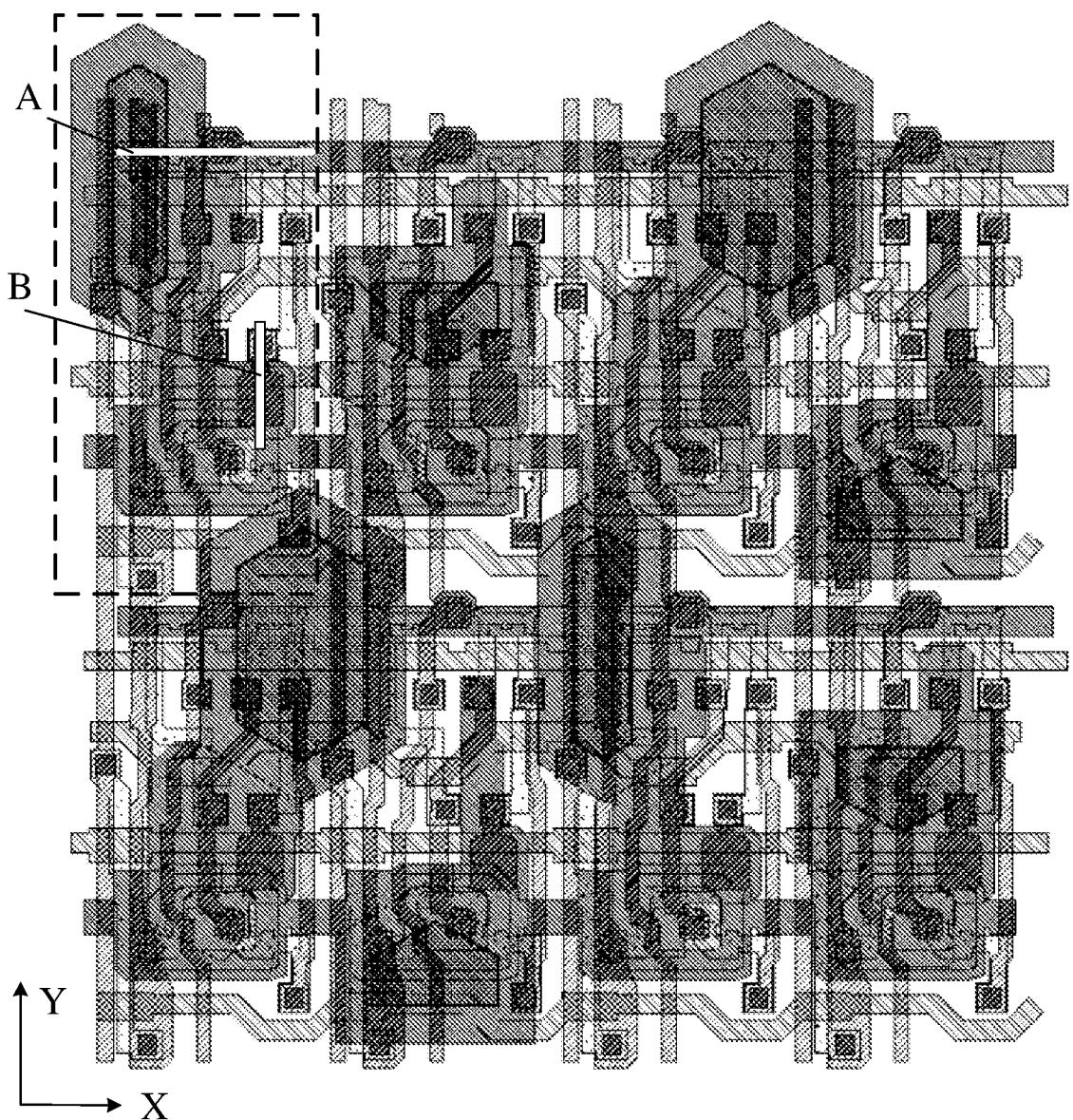
Figure 4N:
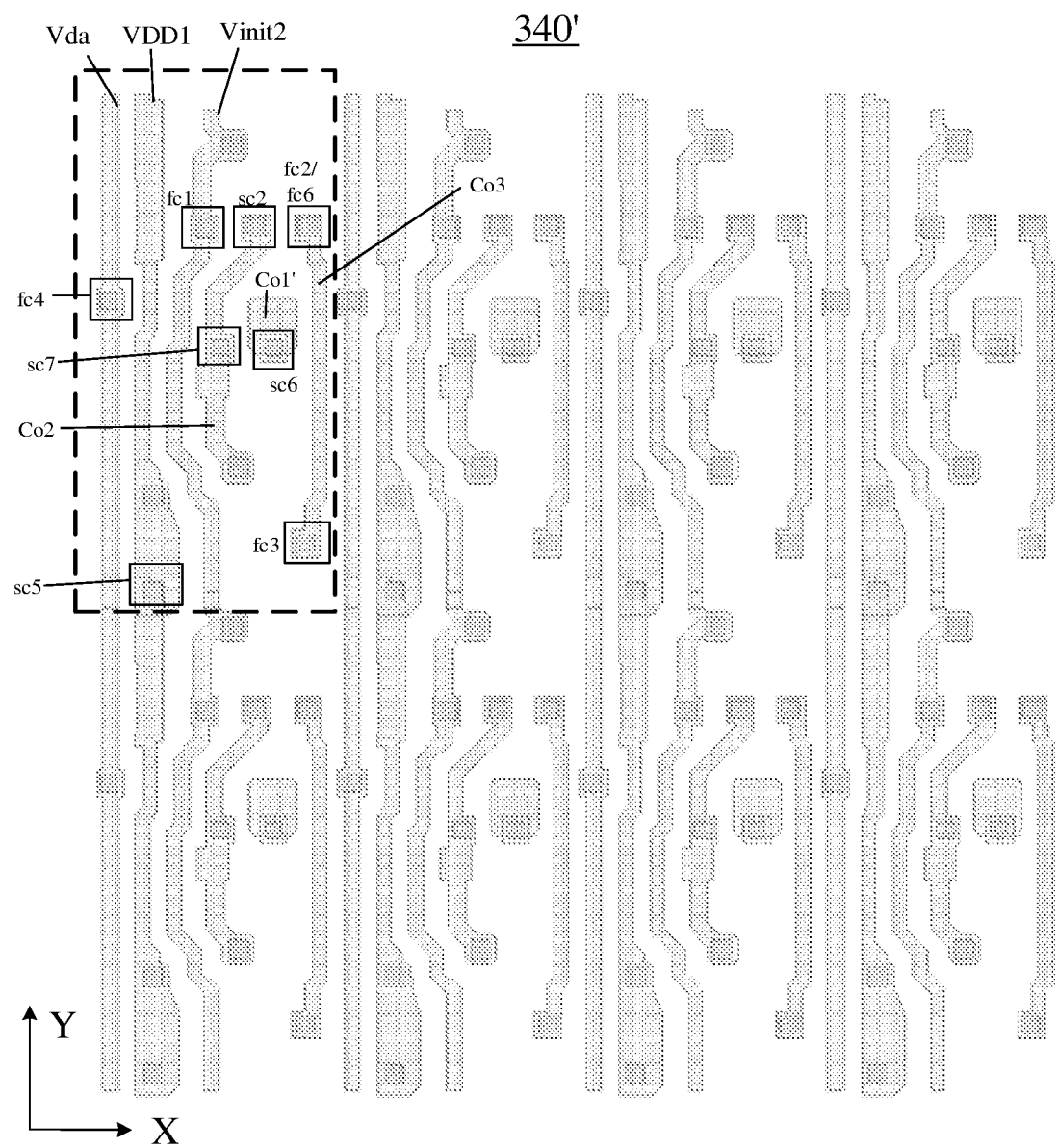
FIG. 4N is a structural schematic diagram of a source-drain metal layer provided by other embodiments of the present disclosure.
Figure 4O:
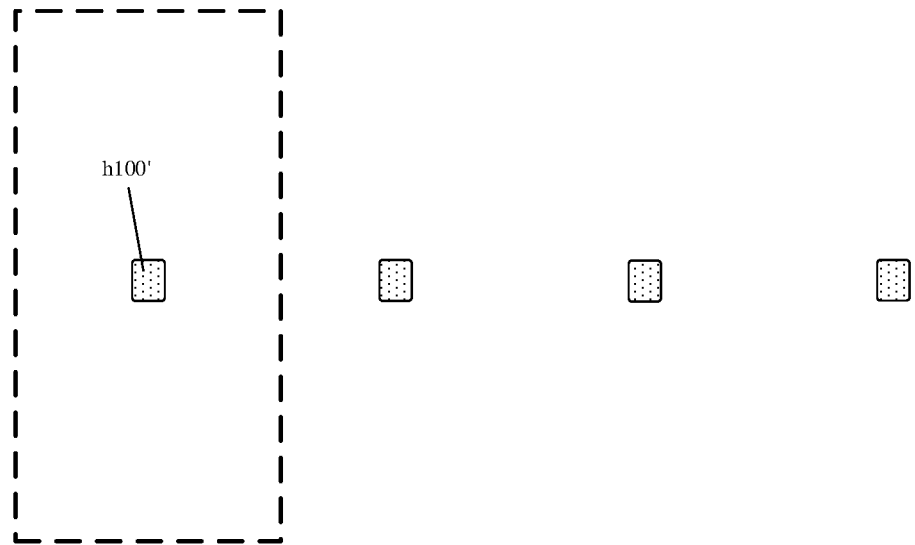
FIG. 4O is a structural schematic diagram of a planarization layer provided by other embodiments of the present disclosure.
Figure 4P:
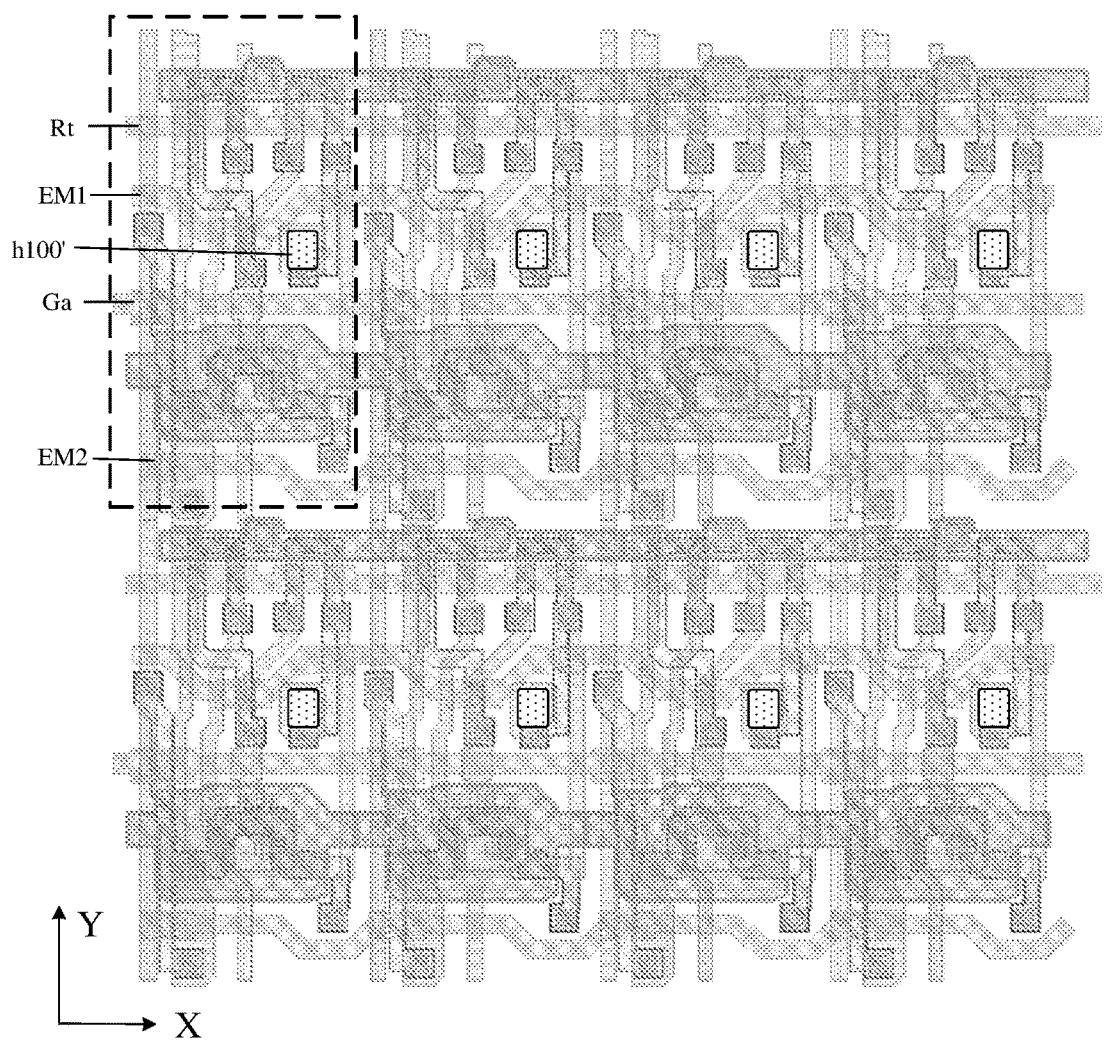
FIG. 4P is a schematic diagram of a stacking position relationship of an active semiconductor layer, a first conductive layer, a second conductive layer, a third insulation layer, a source-drain metal layer, and a planarization layer provided by other embodiments of the present disclosure.

FIG. 4N is a structural schematic diagram of a source-drain metal layer provided by other embodiments of the present disclosure, FIG. 4O is a structural schematic diagram of a planarization layer provided by other embodiments of the present disclosure, and FIG. 4P is a schematic diagram of a stacking position relationship of an active semiconductor layer, a first conductive layer, a second conductive layer, a third insulation layer, a source-drain metal layer, and a planarization layer provided by other embodiments of the present disclosure.

For example, in other embodiments, in the second direction Y, the orthographic projection of the first hole on the base substrate is between the orthographic projection of the scan signal line on the base substrate and the orthographic projection of the first light-emitting control signal line on the base substrate. For example, as shown in FIG. 4P, in the second direction Y, the orthographic projection of the first hole h100' on the base substrate is located between the orthographic projection of the scan signal line Ga on the base substrate and the orthographic projection of the first light-emitting control signal line EM1 on the base substrate.

FIG. 4N and FIG. 4O show the structural schematic diagrams of the source-drain metal layer and the planarization layer in this embodiment.

Based on the change of the position of the first hole h100', the layout design of one or more layers in the pixel circuit can be correspondingly changed. For example, compared with the source-drain metal layer 340 shown in FIG. 4H, as shown in FIG. 4N, the position of the first connection electrode Co1' in the source-drain metal layer 340' is correspondingly changed. In order to adapt to the change of the position of the first hole h100', compared with the first connection electrode Co1 shown in FIG. 4H, as shown in FIG. 4N, on the whole, the first connection electrode Co1' is closer to the upper side, that is, the side where the first electrode fc2 of the threshold compensation transistor T2 and the first electrode fc6 of the first light-emitting control transistor T6 are located, of the figure.

A planarization layer 420' is formed on the side of the source-drain metal layer 340' shown in FIG. 4N away from the third insulation layer to protect the source-drain metal layer 340'. As shown in FIG. 4O, the planarization layer 420' includes a first hole h100', and the first hole h100' penetrates through the planarization layer 420'. For example, the second electrode of the first light-emitting control transistor T6 is electrically connected to the first electrode of the light-emitting element 121 through the first hole h100' penetrating through the planarization layer 420'.

For example, as shown in FIG. 4P, the orthographic projection of the first hole h100' on the base substrate is located within the orthographic projection of the first connection electrode Co1' on the base substrate, that is, the first hole h100' exposes a part of the first connection electrode Co1'. The specific position of the first connection electrode Co1' can be set according to the actual situation, as long as the position of the first connection electrode Co1' can meet the condition that the orthographic projection of the first hole h100' on the base substrate is located within the orthographic projection of the first connection electrode Co1' on the base substrate.

It should be noted that the positions of elements in the other layers can be set according to the actual situation, and the present disclosure will not repeat them in detail.

FIG. 4L shows the anode layer 350 of the pixel circuit 120, and the anode layer 350 includes the first electrode (i.e., the anode) R/G/B of the light-emitting element 121. It should be noted that, in FIG. 4L, only the electroluminescent layer in the light-emitting layer is shown, and the other common layers are not shown.

For example, in some embodiments, a plurality of sub-pixels in each row are arranged in a manner of RGBGRGBG, and the sub-pixels of two adjacent rows are staggered by two sub-pixels, for example, as shown in FIG. 4L, a plurality of sub-pixels located in an odd-numbered row (a first row) are arranged in the manner of RGBGRGBG, and a plurality of sub-pixels located in an even-numbered row (a second row) are arranged in the manner of BGRGRGBG. It should be noted that the plurality of sub-pixels in the display panel may include red sub-pixels, blue sub-pixels, and green sub-pixels, in FIG. 4L, B represents the first electrode of the light-emitting element in the blue sub-pixel, G represents the first electrode of the light-emitting element in the green sub-pixel, and R represents the first electrode of the light-emitting element in the red sub-pixel. For example, the area of the first electrode of the blue sub-pixel B is larger than the area of the first electrode of the green sub-pixel G, and is larger than the area of the first electrode of the red sub-pixel R.

FIG. 4M is a schematic diagram of the stacking position relationship of the active semiconductor layer 310, the first conductive layer 320, the second conductive layer 330, the third insulation layer 410, the source-drain metal layer 340, the planarization layer 420, and the anode layer 350. For example, as shown in FIG. 4M, the first electrode of the light-emitting element 121 is connected to the first connection electrode Co1 through the first hole h100. The first connection electrode Co1 is connected to the second electrode sc6 of the first light-emitting control transistor T6, so that the first electrode of the light-emitting element 121 is electrically connected to the second electrode sc6 of the first light-emitting control transistor T6.

Figure 5A:
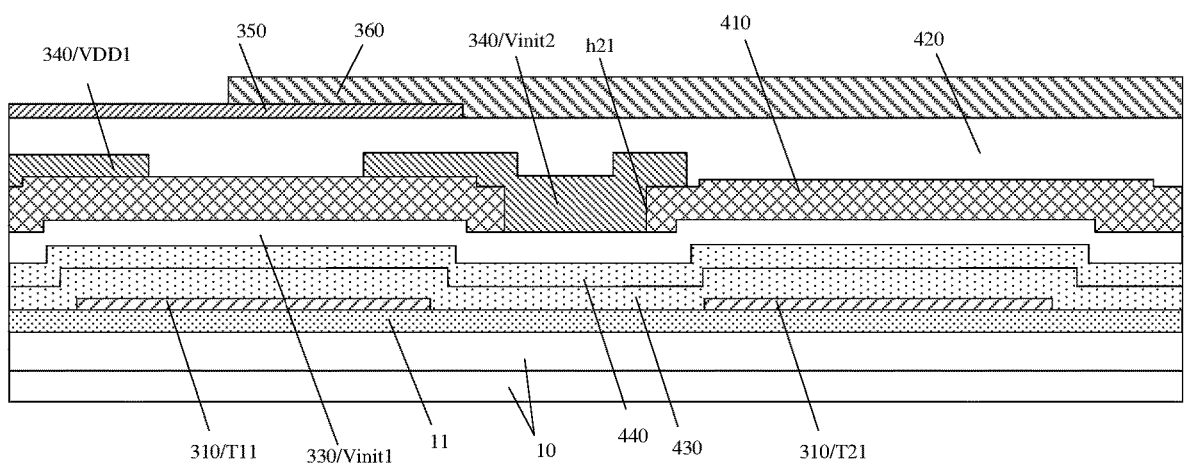
FIG. 5A is a schematic diagram of a cross-sectional structure at a line A in FIG. 4M.
Figure 5B:
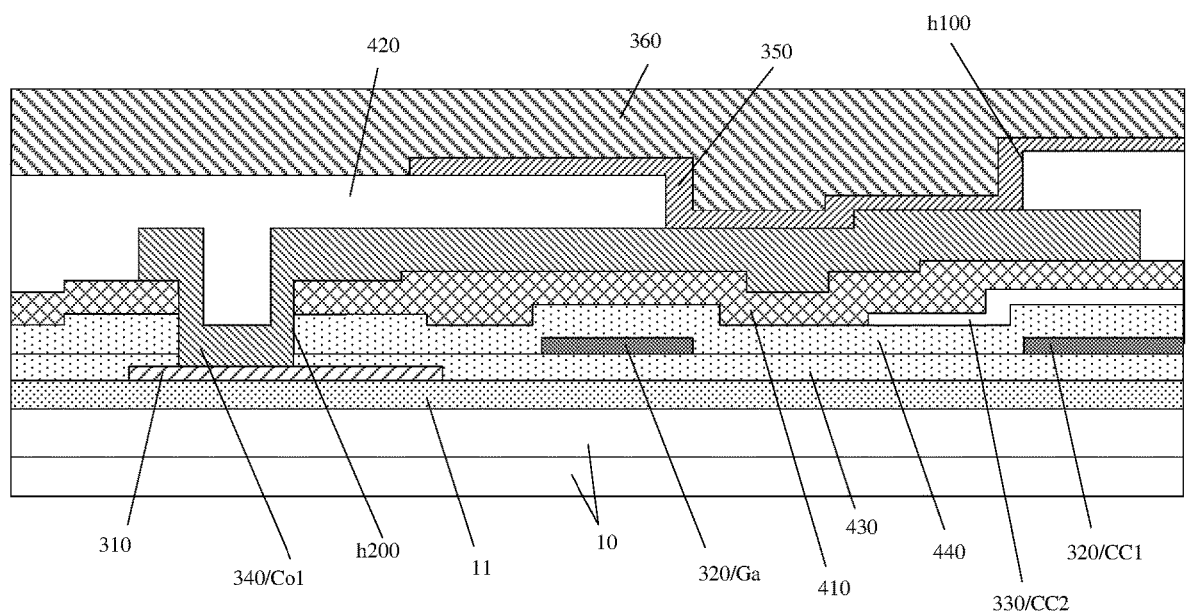
FIG. 5B is a schematic diagram of a cross-sectional structure at a line B in FIG. 4M.

FIG. 5A is a schematic diagram of a cross-sectional structure at a line A in FIG. 4M, and FIG. 5B is a schematic diagram of a cross-sectional structure at a line B in FIG. 4M.

For example, as shown in FIG. 5A and FIG. 5B, the base substrate 10 includes a structure of a plurality of layers (e.g., FIG. 5A shows a structure of two layers), and the plurality of layers in the structure are all made of flexible materials.

For example, as shown in FIG. 5A and FIG. 5B, a buffer layer 11 is formed on the base substrate 10 to prevent external water vapor, oxygen, and impurities from entering the pixel circuit 120. For example, the material of the buffer layer 11 may include inorganic insulation materials such as silicon oxide, silicon nitride, and silicon oxynitride, or other suitable materials. Because the silicon nitride material has a high dielectric constant and a good hydrophobic function, the silicon nitride material can well protect the pixel circuit from being corroded by water vapor.

For example, as shown in FIGS. 5A and 5B, the active semiconductor layer 310 is formed on the side of the buffer layer 11 away from the base substrate 10, the active semiconductor layer 310 shown in FIG. 5A includes the first reset active layer portion T11 and the first compensation active layer portion T21. The active semiconductor layer 310 shown in FIG. 5B includes a portion, corresponding to the second electrode of the first light-emitting control transistor T6, of the active semiconductor layer 310.

For example, as shown in FIGS. 5A and 5B, the first insulation layer 430 is formed on the side of the active semiconductor layer 310 away from the buffer layer 11, and the first conductive layer 320 (not shown in FIG. 5A) is formed on the side of the first insulation layer 430 away from the active semiconductor layer 310. The first conductive layer 320 shown in FIG. 5B includes the scan signal line Ga and a part of the first electrode plate CC1 of the storage capacitor Cst.

For example, as shown in FIGS. 5A and 5B, the second insulation layer 440 is formed on the side of the first conductive layer 320 away from the first insulation layer 430, and the second conductive layer 330 is formed on the side of the second insulation layer 440 away from the first conductive layer 320. The second conductive layer 330 shown in FIG. 5A includes the first sub-initial signal line Vinit1. The orthographic projection of the first reset active layer portion T11 on the base substrate 10 and the orthographic projection of the first compensation active layer portion T21 on the base substrate 10 are both located within the orthographic projection of the first sub-initial signal line Vinit1 on the base substrate 10, so that the first sub-initial signal line Vinit1 can shield the first reset active layer portion T11 and the first compensation active layer portion T21 in the direction perpendicular to the base substrate 10. The second conductive layer 330 shown in FIG. 5B includes a part of the second electrode plate CC2 of the storage capacitor Cst.

For example, as shown in FIGS. 5A and 5B, the third insulation layer 410 is formed on the side of the second conductive layer 330 away from the second insulation layer 440, and the source-drain metal layer 340 is formed on the side of the third insulation layer 410 away from the second conductive layer 330. The source-drain metal layer 340 shown in FIG. 5A includes a first sub-voltage line VDD1 and a second sub-initial signal line Vinit2. The second sub-initial signal line Vinit2 is connected to the first sub-initial signal line Vinit1 through the insulation layer hole h21 penetrating through the third insulation layer 410, so that the first sub-initial signal line Vinit1 and the second sub-initial signal line Vinit2 are electrically connected to each other. The source-drain metal layer 340 shown in FIG. 5B includes the first connection electrode Co1, the first connection electrode Co1 is electrically connected to the part, corresponding to the second electrode of the first light-emitting control transistor T6, of the active semiconductor layer 310 through the second hole h200 penetrating through the first insulation layer 430, the second insulation layer 440, and the third insulation layer 410.

For example, as shown in FIGS. 5A and 5B, the planarization layer 420 is formed on the side of the source-drain metal layer 340 away from the third insulation layer 410, the anode layer 350 is formed on the side of the planarization layer 420 away from the source-drain metal layer 340, and a pixel defining layer 360 is formed on the side of the anode layer 350 away from the planarization layer 420 and is formed on the planarization layer 420. The pixel defining layer 360 includes a plurality of pixel openings. In the direction perpendicular to the base substrate, each pixel opening exposes at least a part of the first electrode R/G/B of the corresponding light-emitting element. For example, the area of the pixel opening of one blue sub-pixel is larger than the area of the pixel opening of one green sub-pixel, and is larger than the area of the pixel opening of one red sub-pixel. In some embodiments, the area of the pixel opening of one green sub-pixel may be approximately equal to the area of the pixel opening of one red sub-pixel. In other embodiments, the area of the pixel opening of one green sub-pixel is smaller than the area of the pixel opening of one red sub-pixel.

For example, the first connection electrode Co1 and the second electrode of the first light-emitting control transistor T6 are electrically connected, for example, are provided integrally. As shown in FIG. 5B, the first connection electrode Co1 is electrically connected to the first electrode of the light-emitting element 120 in the anode layer 350 through the first hole h100. Therefore, jumper design is performed at the fourth node N4, that is, the part, corresponding to the second electrode of the first light-emitting control transistor T6, of the active semiconductor layer 310 is first connected to the first connection electrode Co1 through the second hole h200, and then the first connection electrode Co1 is electrically connected to the first electrode of the light-emitting element 120 in the anode layer 350 through the first hole h100, so that the setting position of the first hole h100 can be more flexible.

For example, in some other embodiments, the plurality of sub-pixels 12 includes a plurality of sub-pixel pairs, the plurality of sub-pixel pairs are arranged in an array along the first direction X and the second direction Y, each sub-pixel pair includes two sub-pixels that are adjacent in the first direction X, and the pixel circuits of the two sub-pixels are mirror-symmetrical along a symmetry axis parallel to the second direction Y.

FIGS. 6A-6M are schematic layout diagrams of various structure layers of a pixel circuit provided by other embodiments of the present disclosure.

Next, the position relationship of the respective elements of the pixel circuit in this embodiment on the base substrate will be described with reference to FIGS. 6A-6M, and the example shown in FIGS. 6A-6M takes the pixel circuit 120 shown in FIG. 2A as an example. In FIGS. 6A-6M, the part indicated by the rectangular dotted-line box is the region corresponding to one pixel circuit 120, and the part indicated by the rectangular dot-dash line box is the region corresponding to the pixel circuits 120 of one sub-pixel pair. FIGS. 6A-6M show the layout of the region corresponding to the pixel circuits of four sub-pixel pairs arranged in two rows and two columns, that is, the layout of the region corresponding to eight pixel circuits arranged in two rows and four columns is shown.

It should be noted that the example shown in FIGS. 6A-6M is basically the same as the example shown in FIGS. 4A-4M, except that the example shown in FIGS. 4A-4M has a plurality of sub-pixels which are arranged in an array, while the example shown in FIGS. 6A-6M has a plurality of sub-pixel pairs which are arranged in an array, and the pixel circuits of two sub-pixels in each sub-pixel pair are mirror-symmetrically arranged. Only the parts of the example shown in FIGS. 6A-6M that are different from those shown in FIGS. 4A-4M will be described below, and similar descriptions will not be repeated.

For example, as shown in FIGS. 6A-6M, each pixel circuit 120 may include an active semiconductor layer 510, a first insulation layer (not shown), a first conductive layer 520, a second insulation layer (not shown), a second conductive layer 530, a third insulation layer 610, a source-drain metal layer 540, a planarization layer 620, and an anode layer 550. The active semiconductor layer 510, the first insulation layer (not shown), the first conductive layer 520, the second insulation layer (not shown), the second conductive layer 530, the third insulation layer 610, the source-drain metal layer 540, the planarization layer 620, and the anode layer 550 are sequentially disposed on the base substrate.

For example, the first insulation layer, the second insulation layer, the third insulation layer 610, and the planarization layer 620 are all made of insulation materials, such as inorganic insulation materials such as silicon nitride, silicon oxide, and silicon oxynitride, or other suitable materials.

Figure 6A:
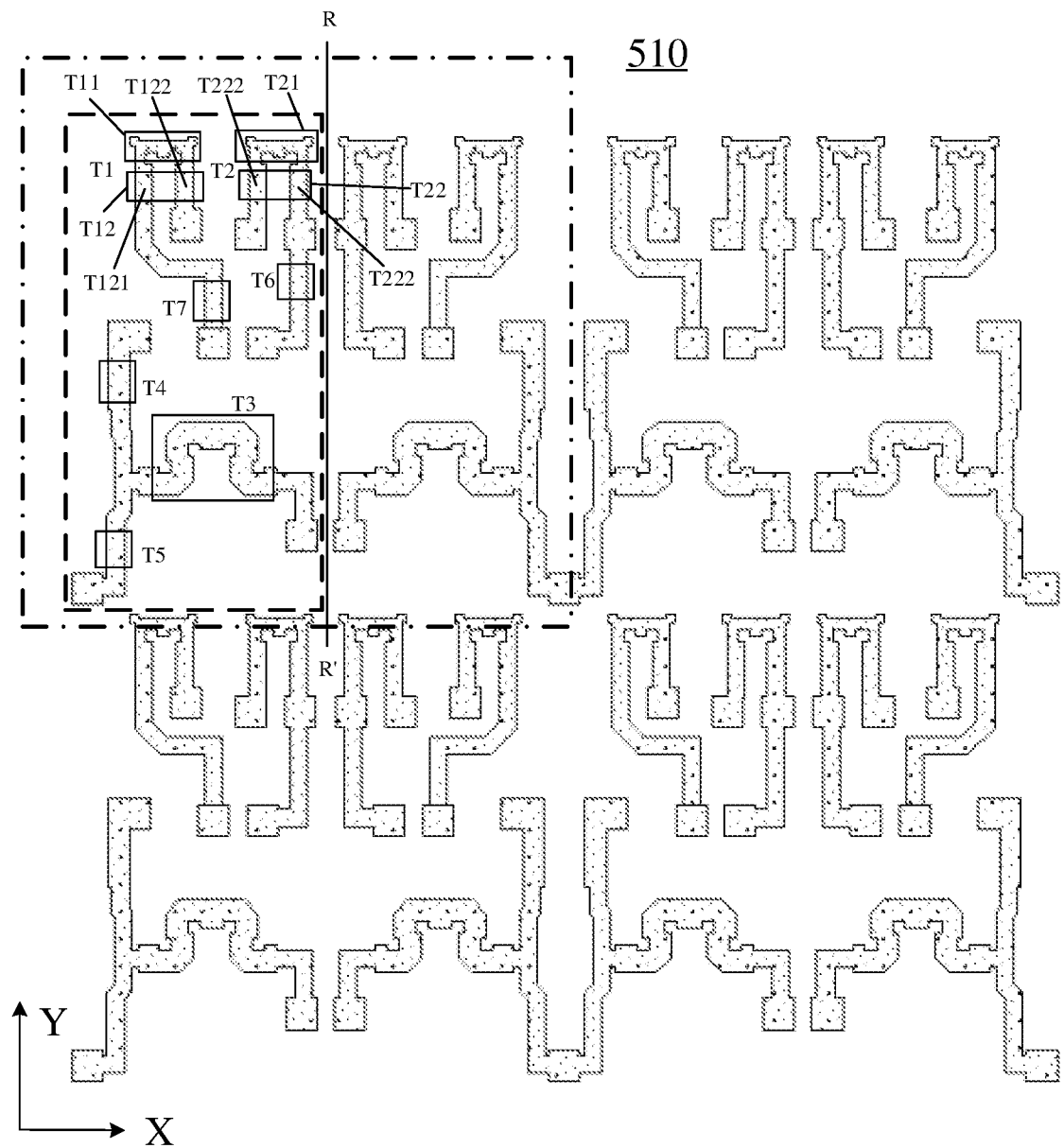
FIGS. 6A-6M are schematic layout diagrams of various structure layers of a pixel circuit provided by other embodiments of the present disclosure.

FIG. 6A shows the active semiconductor layer 510 of a plurality of pixel circuits 120, and the rectangular dotted-line box shown in FIG. 6A shows the active semiconductor layer 510 of one sub-pixel in a sub-pixel pair. The active semiconductor layer 510 can be used to fabricate the active layer of the driving transistor T3, the active layer of the first reset transistor T1, the active layer of the threshold compensation transistor T2, the active layer of the data writing transistor T4, the active layer of the second light-emitting control transistor T5, the active layer of the first light-emitting control transistor T6, and the active layer of the second reset transistor T7. The respective rectangular solid-line boxes in FIG. 6A show the active layers of the respective transistors T1-T7. The relative positions of the active layers of the transistors T1-T7 in the pixel circuit of each sub-pixel in the sub-pixel pair are the same as those of the embodiment shown in FIG. 4A, and the duplicated parts will not be repeated herein again.

For example, as shown in FIG. 6A, the pixel circuits of two sub-pixels in each sub-pixel pair are mirror symmetric with respect to a symmetry axis RR', and the symmetry axis RR' is parallel to the second direction Y.

Figure 6B:
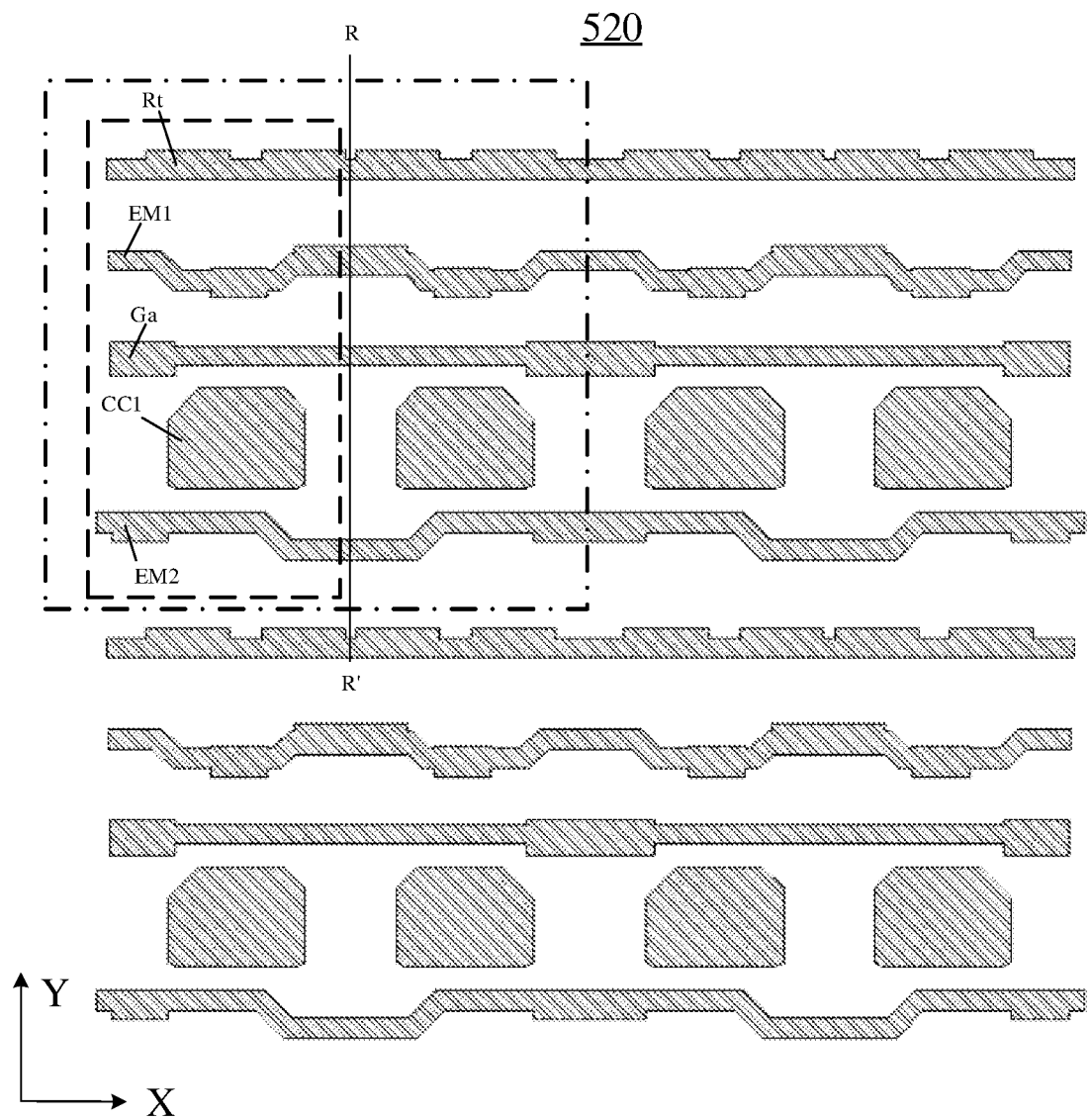

For example, the first insulation layer (not shown) is formed on the side of the above-mentioned active semiconductor layer 510 away from the base substrate to protect the above-mentioned active semiconductor layer 510. FIG. 6B shows the first conductive layer 520 of the pixel circuit 120, the first conductive layer 520 is arranged on the side of the first insulation layer away from the active semiconductor layer 510, so as to be insulated from the active semiconductor layer 510. It should be noted that the respective rectangular solid-line boxes in FIG. 6A show respective parts where the first conductive layer 520 overlaps with the active semiconductor layer 510.

For example, the reset signal line Rt, the first light-emitting control signal line EM1, the scan signal line Ga, and the second light-emitting control signal line EM2 are all located in the first conductive layer 520. In addition, the first conductive layer 520 may further include the first electrode plate CC1 of the storage capacitor Cst and the gate electrode of the first reset transistor T1, the gate electrode of the threshold compensation transistor T2, the gate electrode of the data writing transistor T4, the gate electrode of the second light-emitting control transistor T5, the gate electrode of the first light-emitting control transistor T6, the gate electrode of the second reset transistor T7, and the gate electrode of the driving transistor T3.

For example, as shown in FIG. 6B, the reset signal line Rt, the first light-emitting control signal line EM1, the scan signal line Ga, and the second light-emitting control signal line EM2 all extend substantially along the first direction X. In the second direction Y, the reset signal line Rt, the first light-emitting control signal line EM1, the scan signal line Ga, and the second light-emitting control signal line EM2 are arranged in sequence.

Figure 6C:
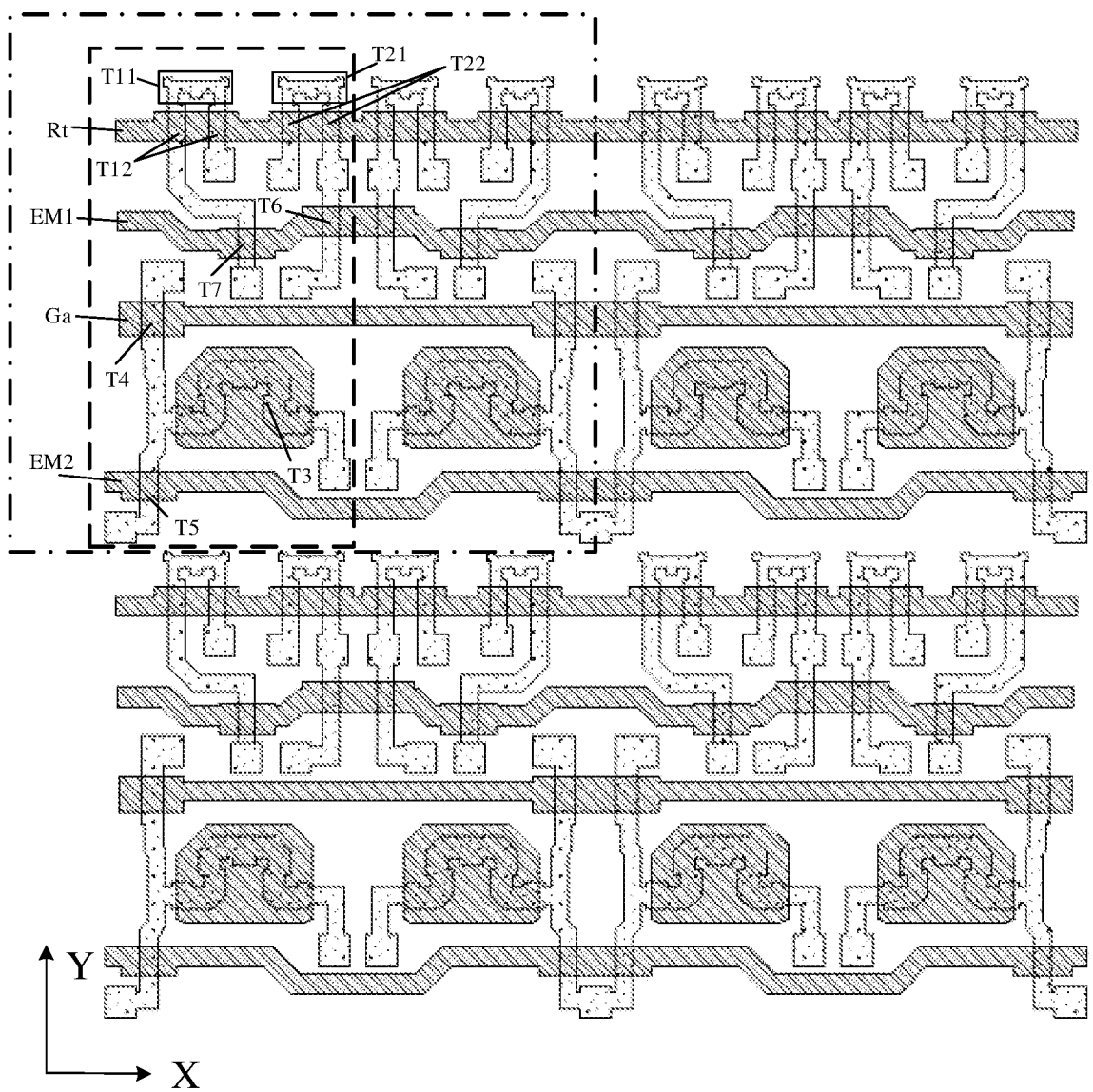

FIG. 6C is a schematic diagram of the stacking position relationship between the active semiconductor layer 510 and the first conductive layer 520.

For example, the active layer of the first reset transistor T1 is a reset active layer, that is, the first reset transistor T1 includes the reset active layer, and the reset active layer includes a first reset active layer portion T11 and a second reset active layer portion T12. For example, as shown in FIG. 6C, an orthographic projection of the second reset active layer portion T12 on the base substrate and an orthographic projection of the reset signal line Rt on the base substrate at least partially overlap.

For example, as shown in FIGS. 6A and 6C, in the direction perpendicular to the base substrate, the part, covered by the reset signal line Rt of the first conductive layer 520, of the active semiconductor layer 510 includes the second reset active layer portion T12, and the second reset active layer portion T12 includes two parts spaced apart from each other. The first reset active layer portion T11 and the second reset active layer portion T12 generally form a U-shape as a whole, that is, the first reset transistor T1 is a U-shaped double-gate transistor.

For example, the active layer of the threshold compensation transistor T2 is a compensation active layer, that is, the threshold compensation transistor T2 includes the compensation active layer, and the compensation active layer includes a first compensation active layer portion T21 and a second compensation active layer portion T22. For example, as shown in FIG. 6C, an orthographic projection of the second compensation active layer portion T22 on the base substrate and the orthographic projection of the reset signal line Rt on the base substrate at least partially overlap.

For example, as shown in FIGS. 6A and 6C, in the direction perpendicular to the base substrate, the part, covered by the reset signal line Rt of the first conductive layer 520, of the active semiconductor layer 510 includes the second compensation active layer portion T22, and the second compensation active layer portion T22 includes two parts spaced apart from each other. The first compensation active layer portion T21 and the second compensation active layer portion T22 generally form a U-shape as a whole, that is, the threshold compensation transistor T2 is a U-shaped double-gate transistor.

For example, the shape of the first reset active layer portion T11 and the shape of the first compensation active layer portion T21 are approximately the same.

For example, as shown in FIG. 6A, the second reset active layer portion T12 includes a first sub-portion T121 and a second sub-portion T122 spaced from each other, and the second compensation active layer portion T22 includes a third sub-portion T221 and a fourth sub-portion T222 spaced from each other. For example, the first sub-portion T121, the second sub-portion T122, the third sub-portion T221, and the fourth sub-portion T222 are arranged in sequence in the first direction X, and the center of the first sub-portion T121, the center of the second sub-portion T122, the center of the third sub-portion T221, and the center of the fourth sub-portion T222 are substantially located on the same straight line, for example, the straight line is parallel to the first direction X.

Figure 6D:
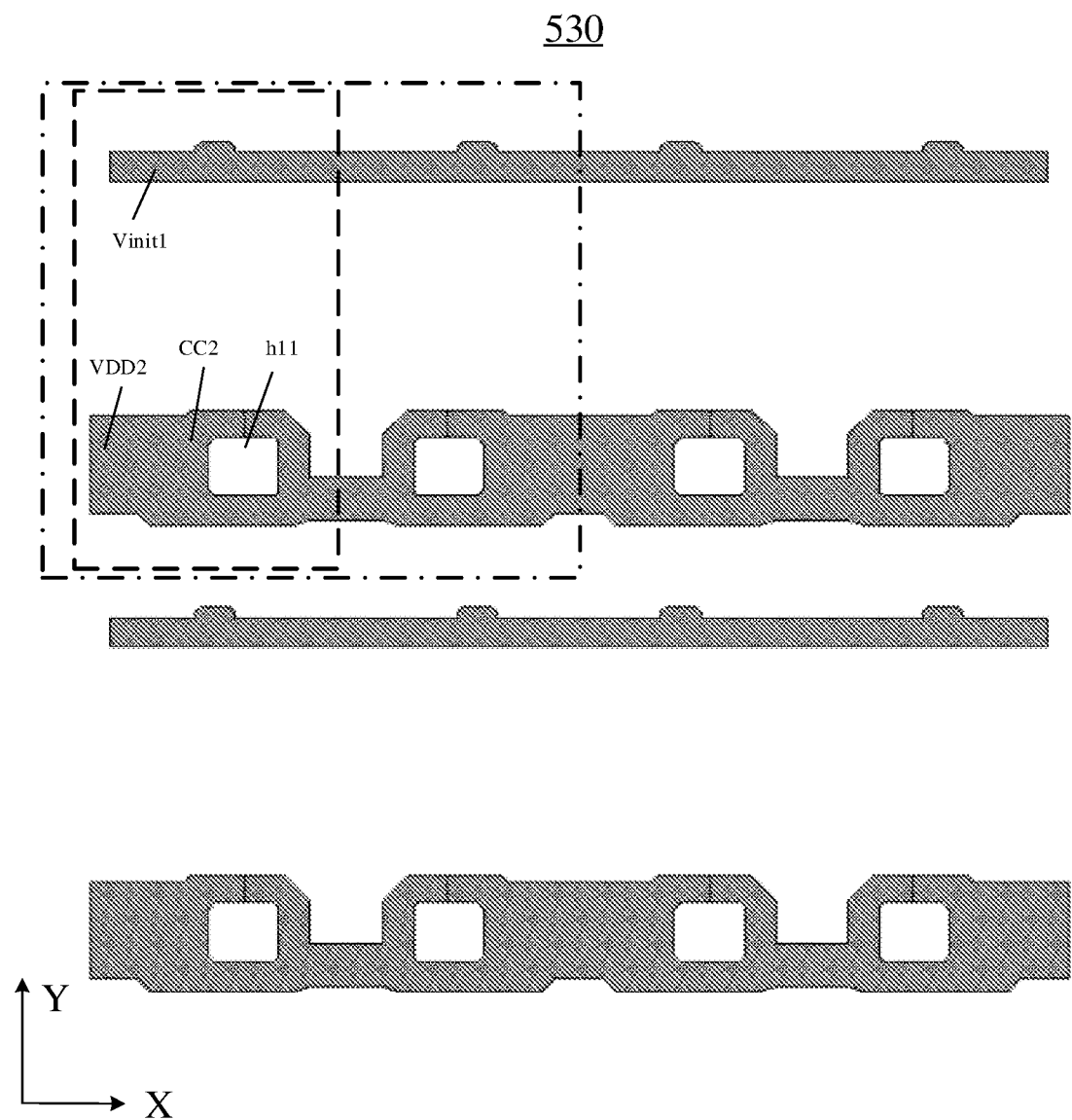
Figure 6E:
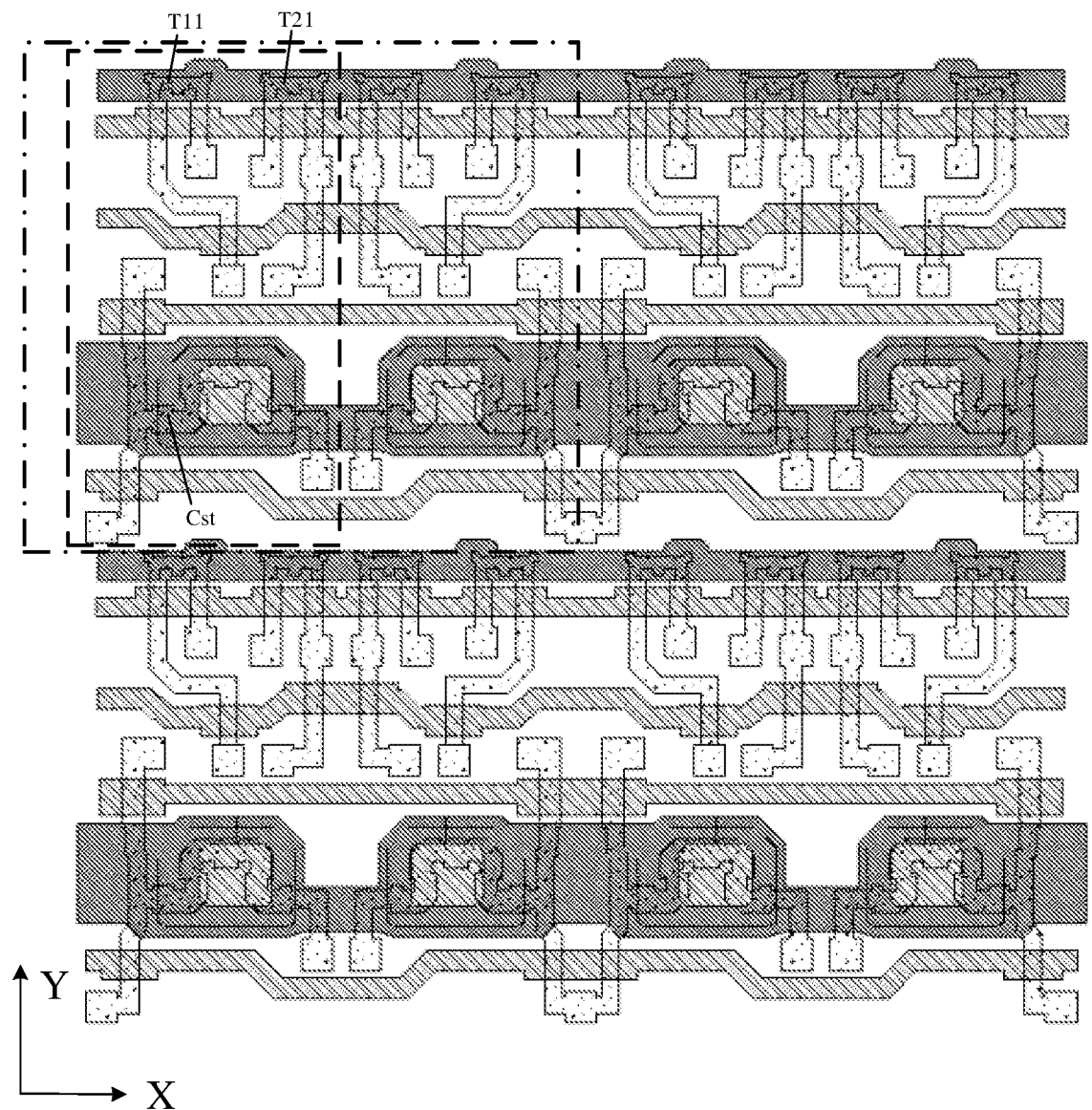

FIG. 6E is a schematic diagram of the stacking position relationship of the active semiconductor layer 510, the first conductive layer 520, and the second conductive layer 530.

For example, the second insulation layer (not shown) is formed on the side of the above-mentioned first conductive layer 520 away from the first insulation layer to protect the above-mentioned first conductive layer 520. FIG. 6D shows the second conductive layer 530 of the pixel circuit 120. The second conductive layer 530 is formed on the side of the second insulation layer away from the first conductive layer 520. The second conductive layer 530 includes the second electrode plate CC2 of the storage capacitor Cst, the first sub-initial signal line Vinit1, and the second sub-voltage line VDD2. As shown in FIG. 6E, both the first sub-initial signal line Vinit1 and the second sub-voltage line VDD2 extend along the first direction X and are arranged along the second direction Y. In the direction perpendicular to the base substrate, the first electrode plate CC1 of the storage capacitor Cst and the second electrode plate CC2 of the storage capacitor Cst at least partially overlap to form the storage capacitor Cst. For example, the second sub-voltage line VDD2 is integrally formed with the second electrode plate CC2 of the storage capacitor Cst.

For example, as shown in FIGS. 6D and 6E, the second electrode plate CC2 of the storage capacitor Cst includes a conductive layer hole h11, and through the conductive layer hole h11, the second electrode of the threshold compensation transistor T2 and the second electrode of the second reset transistor T7 are electrically connected to the first electrode plate CC1 of the storage capacitor Cst, that is, the gate electrode of the driving transistor T3.

For example, as shown in FIG. 6D and FIG. 6E, the initial signal line Vinit includes the first sub-initial signal line Vinit1, and the orthographic projection of the first reset active layer portion T11 on the base substrate and the orthographic projection of the first compensation active layer portion T21 on the base substrate are both located within the orthographic projection of the first sub-initial signal line Vinit1 on the base substrate. In the embodiment of the present disclosure, the first sub-initial signal line Vinit1 shields the part, that is not shielded by the reset signal line Rt, of the active layer of the first reset transistor T1 and the part, that is not shielded by the reset signal line Rt, of the active layer of the threshold compensation transistor T2 at the same time, the shielding layer does not need to be separately set to shield them, which can reduce the wiring on the display substrate, reduce the cost, and make the first reset transistor T1 and the threshold compensation transistor T2 more stable.

Figure 6F:
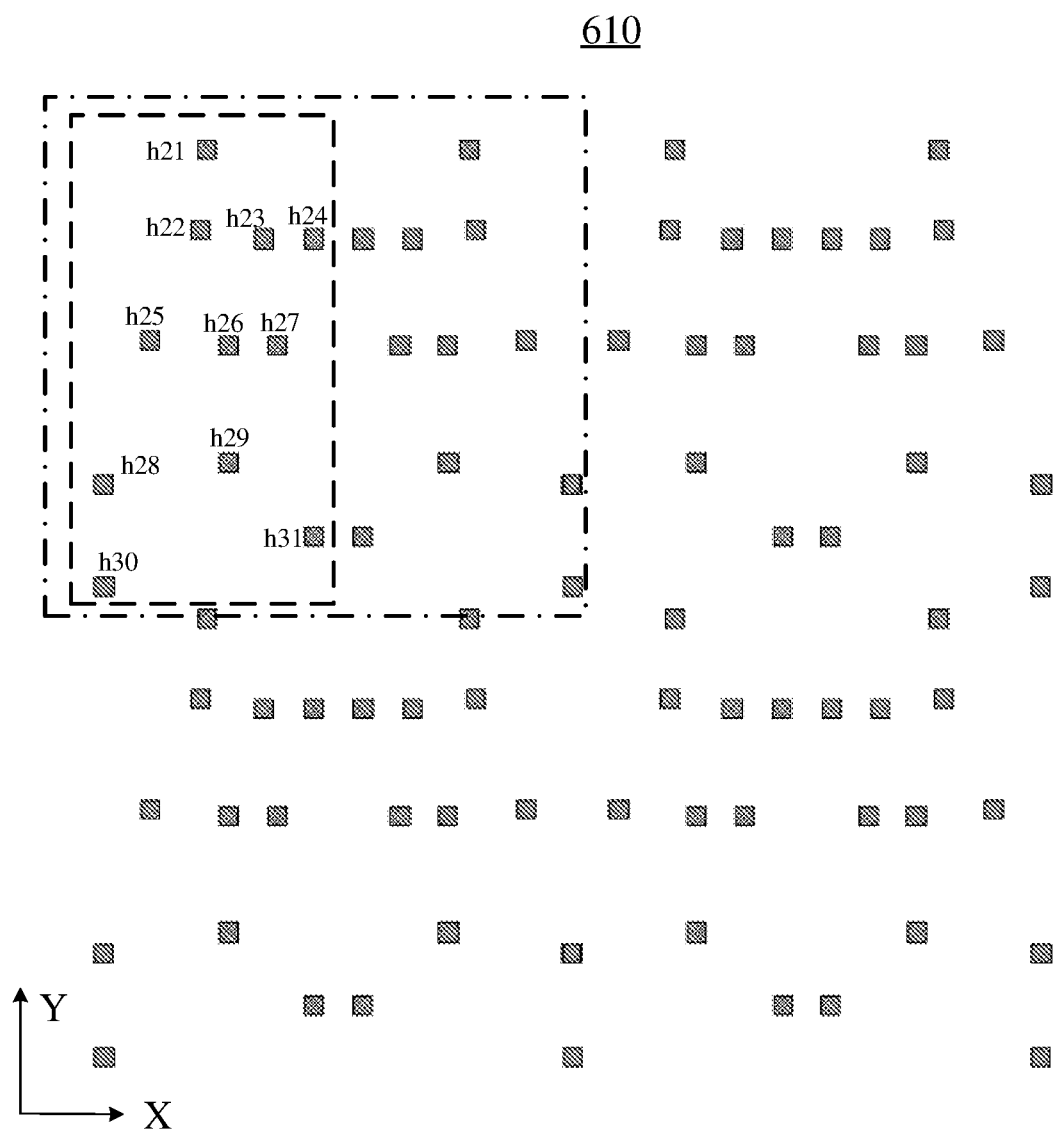
Figure 6G:
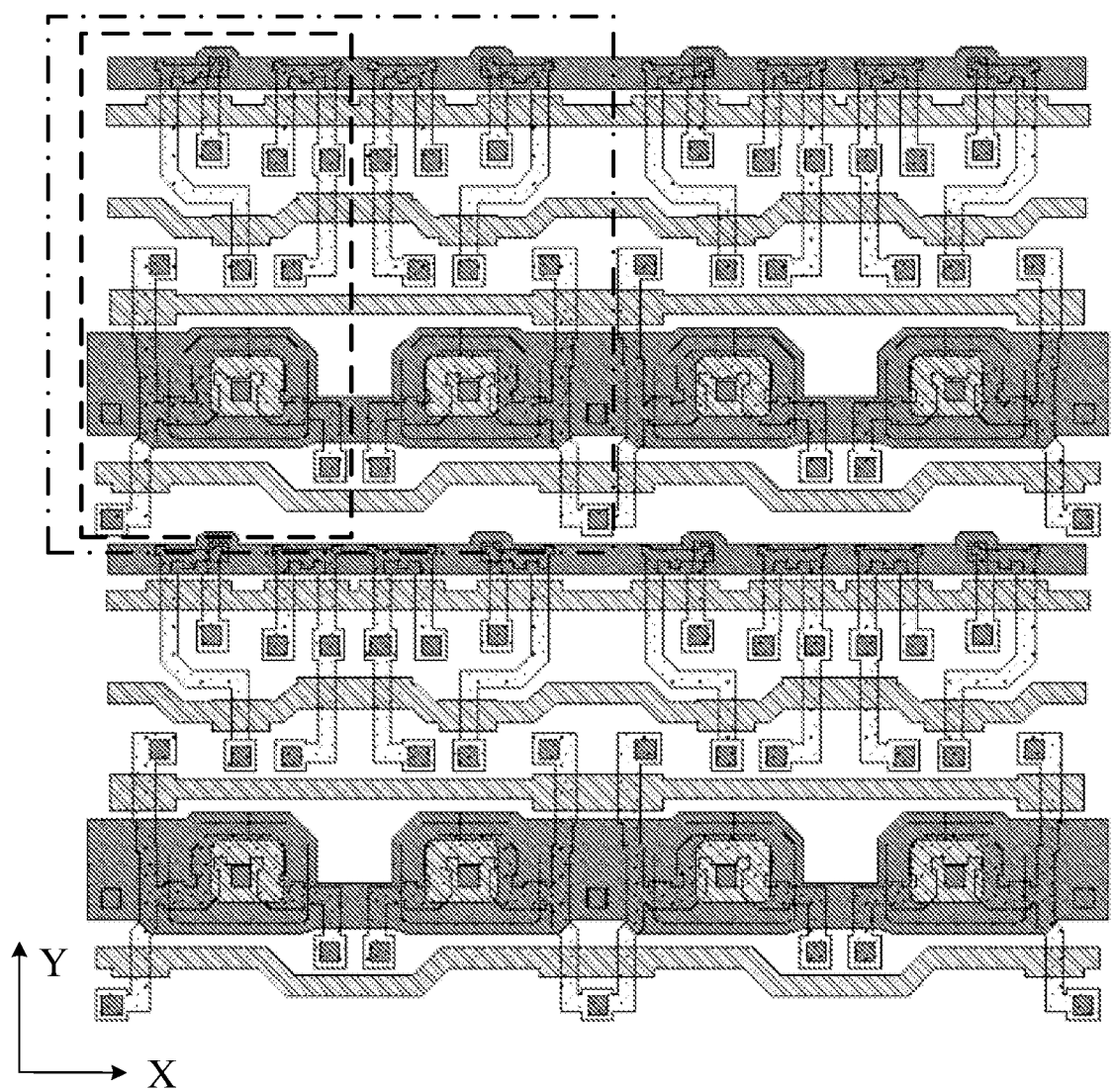

FIG. 6G is a schematic diagram of the stacking position relationship of the active semiconductor layer 510, the first conductive layer 520, the second conductive layer 530, and the third insulation layer 610.

For example, as shown in FIG. 6F, the third insulation layer 610 is formed on the side of the above-mentioned second conductive layer 530 away from the second insulation layer to protect the above-mentioned second conductive layer 530. A plurality of insulation layer holes h21-h31 are formed in the third insulation layer 610. The plurality of insulation layer holes h21-h31 correspond to one pixel circuit.

For example, as shown in FIGS. 6F and 6G, the insulation layer hole h21 penetrates through the third insulation layer 610 to expose a part of the first sub-initial signal line Vinit1; the insulation layer holes h22-27 and the insulation layer holes 30-31 penetrate through the first insulation layer, the second insulation layer, and the third insulation layer 610 to expose parts of the active semiconductor layer 510; the insulation layer hole h28 penetrates through the third insulation layer 610 to expose a part of the second electrode plate CC2 of the storage capacitor Cst; the insulation layer hole h29 penetrates through the second insulation layer and the third insulation layer 610 to expose a part of the first electrode plate CC1 of the storage capacitor Cst. For example, the orthographic projection of the insulation layer hole h29 on the base substrate is located within the orthographic projection of the conductive layer hole h11 on the base substrate.

Figure 6H:
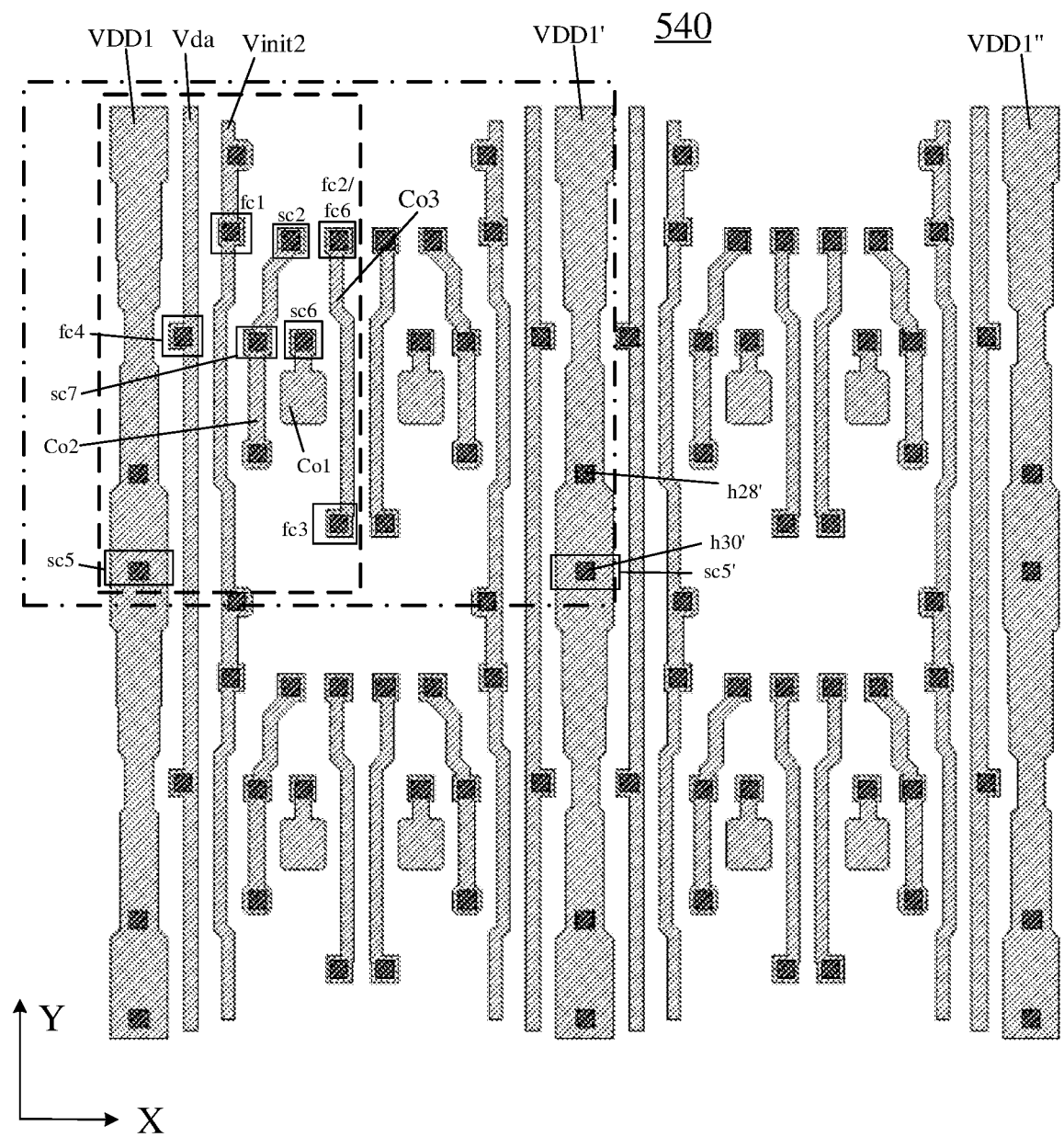
Figure 6I:
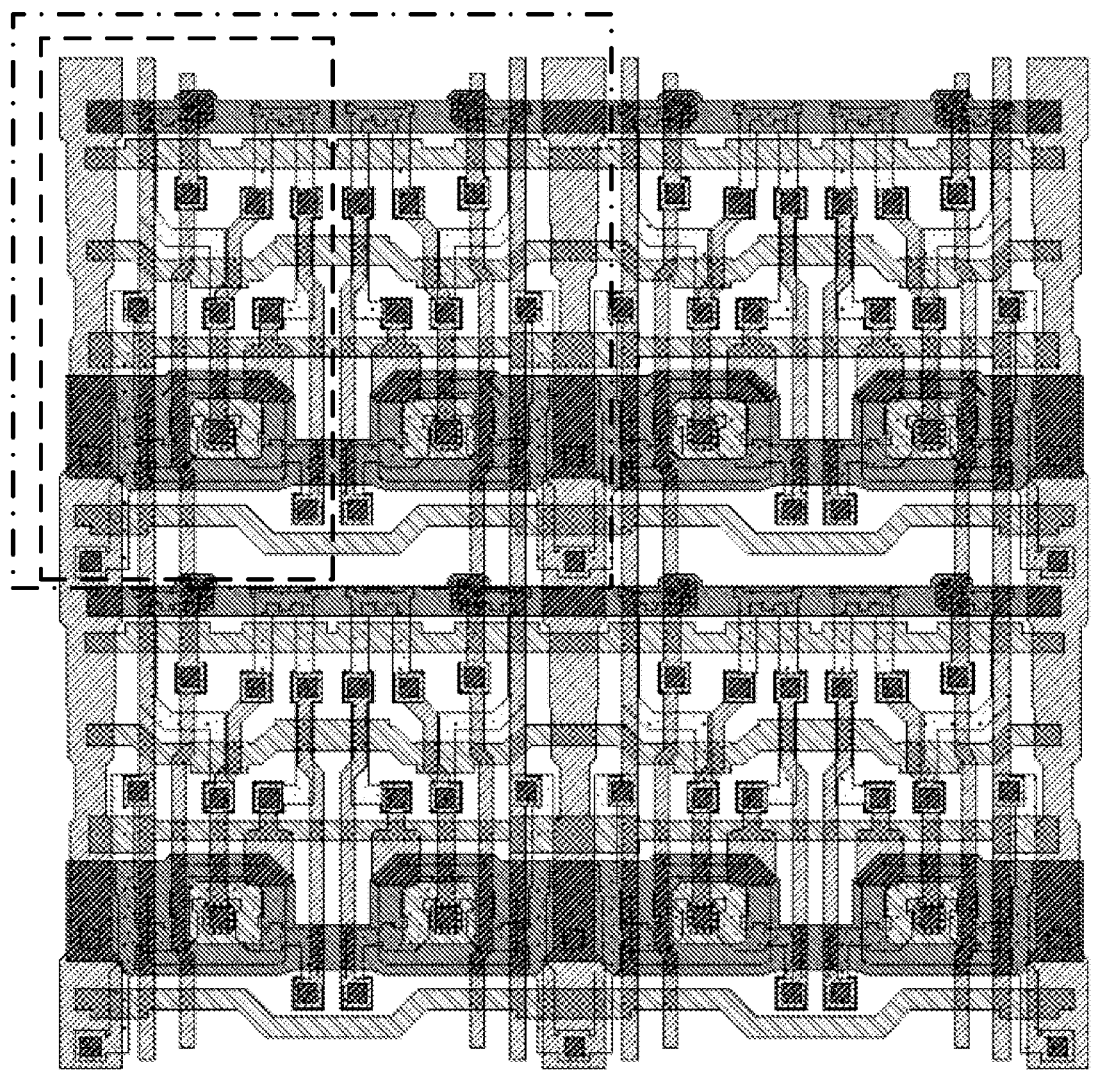

FIG. 6H shows the source-drain metal layer 540 of the pixel circuit 120. The source-drain metal layer 540 is arranged on the side of the third insulation layer 610 away from the second conductive layer 530. FIG. 6I shows a schematic diagram of the stacking position relationship of the active semiconductor layer 510, the first conductive layer 520, the second conductive layer 530, the third insulation layer 610, and the source-drain metal layer 540.

For example, as shown in FIGS. 6H and 6I, the source-drain metal layer 540 includes the data line Vda, the first sub-voltage line VDD1, the second sub-initial signal line Vinit2, the first electrode fc1 of the first reset transistor T1, the first electrode fc2 and the second electrode sc2 of the threshold compensation transistor T2, the first electrode fc3 of the driving transistor T3, the first electrode fc4 of the data writing transistor T4, the second electrode sc5 of the second light-emitting control transistor T5, the first electrode fc6 and the second electrode sc6 of the first light-emitting control transistor T6, the second electrode sc7 of the second reset transistor T7, the first connection electrode Co1, the second connection electrode Co2, and the third connection electrode Co3.

For example, the data line Vda, the first sub-voltage line VDD1, and the second sub-initial signal line Vinit2 are located in the same layer, that is, the source-drain metal layer 540. The data line Vda, the first sub-voltage line VDD1, and the second sub-initial signal line Vinit2 are arranged along the first direction X and all extend along the second direction Y. In the first direction X, the data line Vda is located between the first sub-voltage line VDD1 and the second sub-initial signal line Vinit2. It should be noted that the present disclosure is not limited to this case. In other embodiments, the first sub-voltage line VDD1 is located between the data line Vda and the second sub-initial signal line Vinit2.

Figure 6J:
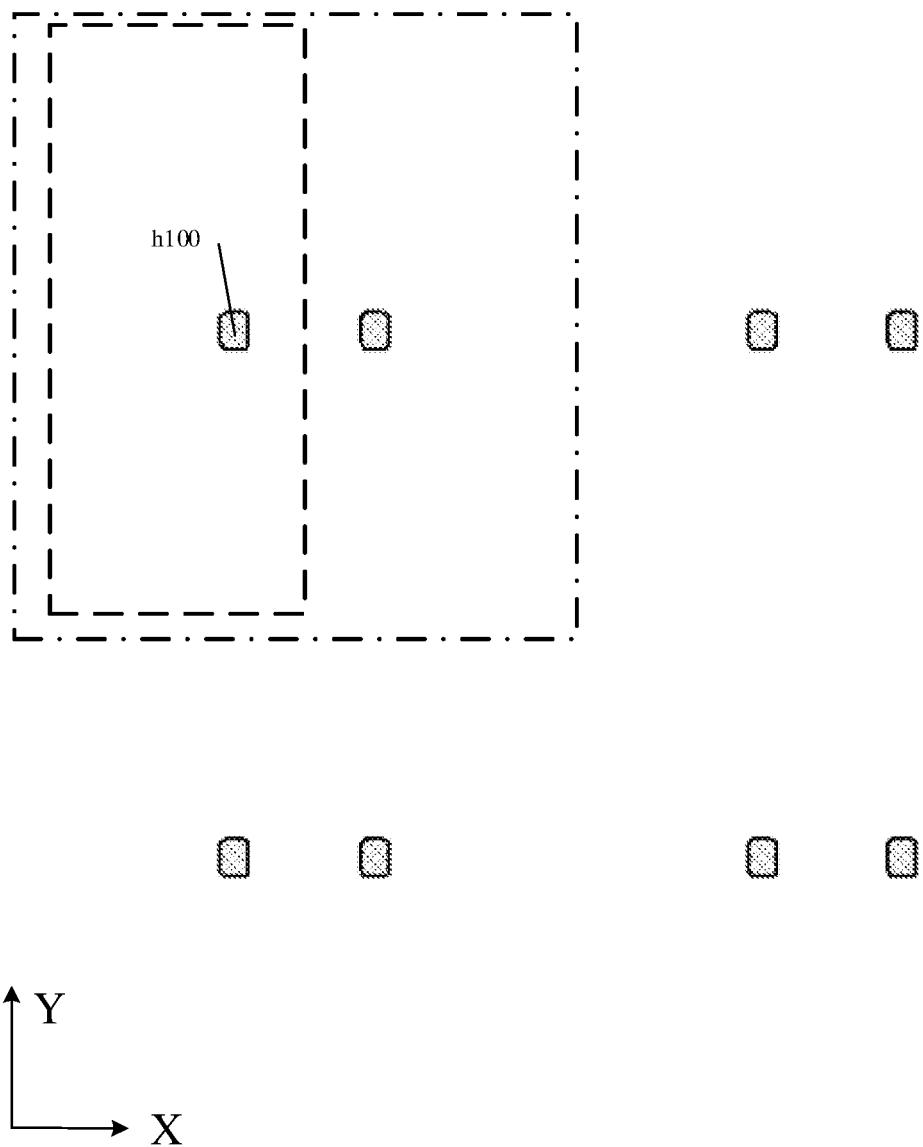

For example, the planarization layer 620 is formed on the side of the above-mentioned source-drain metal layer 540 away from the third insulation layer 610 to protect the above-mentioned source-drain metal layer 540. As shown in FIG. 6J, the planarization layer 620 includes a first hole h100, the first hole h100 penetrates through the planarization layer 420. For example, the second electrode of the first light-emitting control transistor T6 is electrically connected to the first electrode of the light-emitting element 121 through the first hole h100 penetrating through the planarization layer 420.

Figure 6K:
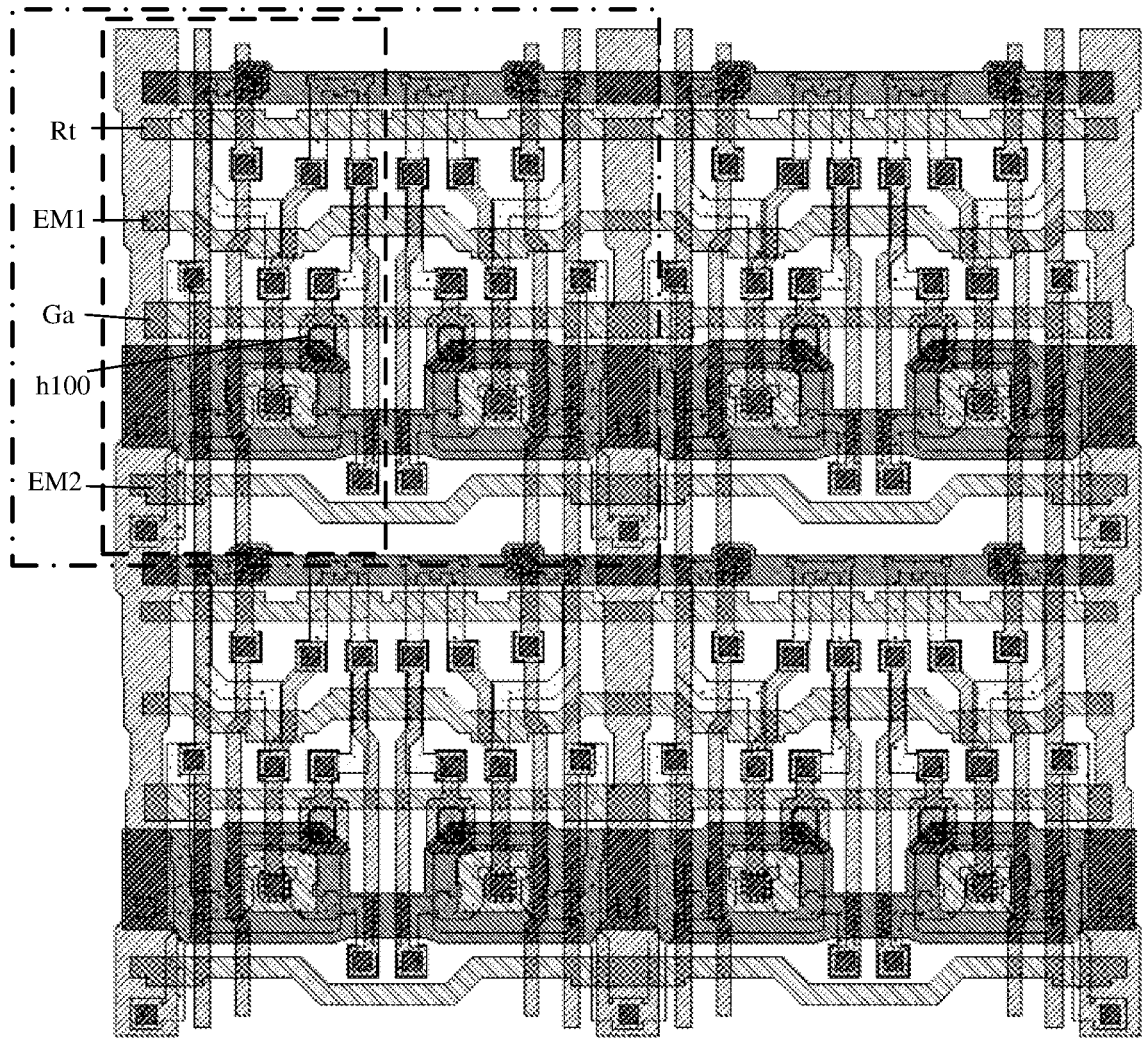

FIG. 6K is a schematic diagram of the stacking position relationship of the active semiconductor layer 510, the first conductive layer 520, the second conductive layer 530, the third insulation layer 610, the source-drain metal layer 540, and the planarization layer 620.

For example, as shown in FIG. 6K, in the second direction Y, the orthographic projection of the first hole h100 on the base substrate is located between the orthographic projection of the reset signal line Rt on the base substrate and the orthographic projection of the second light-emitting control signal line EM2 on the base substrate. That is to say, in the embodiment of the present disclosure, the setting position of the first hole h100 is more flexible and can be adapted to pixel circuits of various pixel arrangements. In addition, the position of the first hole h100 can be flexibly adjusted according to the setting position of the first electrode of the light-emitting element, so that the first hole h100 is closer to the first electrode of the light-emitting element, the routing of the first electrode of the light-emitting element is reduced, and the connection between the first electrode of the light-emitting element and the second electrode of the first light-emitting control transistor T6 is more flexible. As shown in FIG. 6K, the first hole h100 is located near the scan signal line Ga, and in the second direction Y, the orthographic projection of the first hole h100 on the base substrate is roughly located between the orthographic projection of the scan signal line Ga on the base substrate and the orthographic projection of the second light-emitting control signal line EM2 on the base substrate.

For example, in other embodiments, in the second direction Y, the orthographic projection of the first hole h100 on the base substrate is located between the orthographic projection of the scan signal line Ga on the base substrate and the orthographic projection of the first light-emitting control signal line EM1 on the base substrate.

Figure 6L:
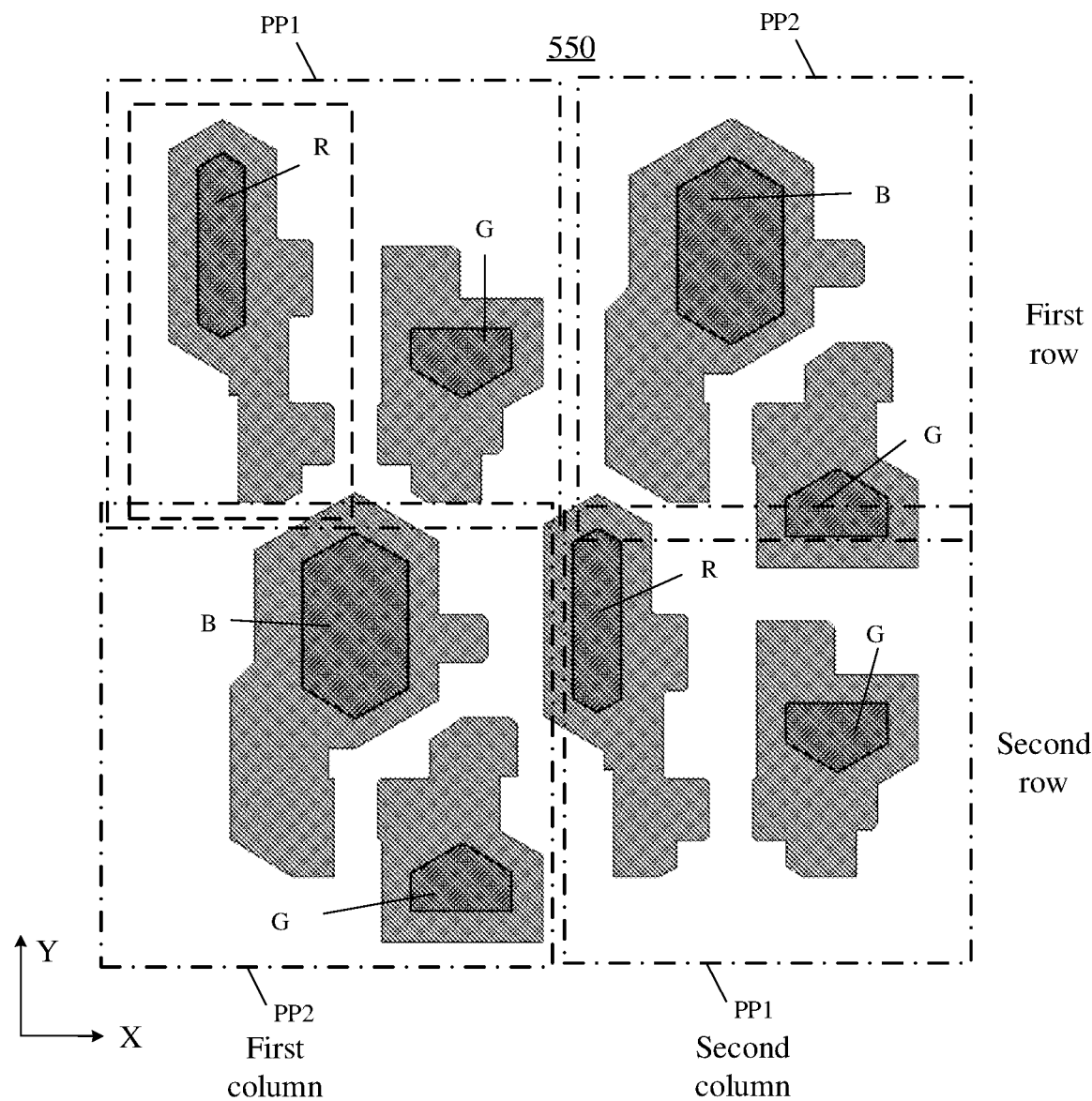

FIG. 6L shows the anode layer 650 of the pixel circuit 120, and the anode layer 650 includes the first electrode (i.e., the anode) R/G/B of the light-emitting element 121. It should be noted that in FIG. 6L, only the electroluminescent layer in the light-emitting layer is shown, and the other common layers are not shown.

For example, a plurality of sub-pixel pairs include a plurality of first sub-pixel pairs and a plurality of second sub-pixel pairs, each first sub-pixel pair includes a first sub-pixel and a second sub-pixel, each second sub-pixel pair includes a first sub-pixel and a third sub-pixel, the first sub-pixel can be a green sub-pixel, the second sub-pixel can be a red sub-pixel, and the third sub-pixel can be a blue sub-pixel. In each sub-pixel row (parallel to the first direction X), the plurality of first sub-pixel pairs and the plurality of second sub-pixel pairs are alternately arranged, and in each sub-pixel column (parallel to the second direction Y), the plurality of first sub-pixel pairs and the plurality of second sub-pixel pairs are also alternately arranged.

For example, as shown in FIG. 6L, the four sub-pixel pairs located in two rows and two columns include two first sub-pixel pairs PP1 and two second sub-pixel pairs PP2. The two first sub-pixel pairs PP1 are located in the first row and the first column, and the second row and the second column, respectively, and the two second sub-pixel pairs PP2 are located in the first row and the second column, and the second row and the first column, respectively. The first sub-pixel pair PP1 includes a red sub-pixel R and a green sub-pixel G, and the second sub-pixel pair PP2 includes a blue sub-pixel B and a green sub-pixel G. That is, as shown in FIG. 6L, the plurality of sub-pixel pairs located in an odd-numbered row (the first row) are sequentially arranged in the manner of RG (the first sub-pixel pair PP1) BG (the second sub-pixel pair PP2) RG (the first sub-pixel pair PP1) BG (the second sub-pixel pair PP2), and the plurality of sub-pixel pairs located in an even-numbered row (the second row) are sequentially arranged in the manner of BG (the second sub-pixel pair PP2) RG (the first sub-pixel pair PP1) BG (the second sub-pixel pair PP2) RG (the first sub-pixel pair PP1).

For example, in the case where the data line Vda is located between the first sub-voltage line VDD1 and the second sub-initial signal line Vinit2 in the first direction X, for two sub-pixel pairs, which are adjacent in the first direction X, among the plurality of sub-pixel pairs, the pixel circuits of two sub-pixels adjacent to each other in the first direction X of the two sub-pixel pairs are electrically connected to the same first sub-voltage line. As shown in FIG. 6H and FIG. 6L, in an example, the two sub-pixel pairs adjacent to each other in the first direction X are respectively the first sub-pixel pair PP1 and the second sub-pixel pair PP2 located in the first row, and two sub-pixels adjacent to each other in the first direction X of the first sub-pixel pair PP1 and the second sub-pixel pair PP2 are respectively a green sub-pixel G in the first sub-pixel pair PP1 and a blue sub-pixel B in the second sub-pixel pair PP2. The pixel circuit of the green sub-pixel G and the pixel circuit of the blue sub-pixel B are electrically connected to the same first sub-voltage line VDD1', and the first sub-voltage line VDD1' is located between the pixel circuit of the green sub-pixel G and the pixel circuit of the blue sub-pixel B. In the embodiments of the present disclosure, by electrically connecting the pixel circuits of adjacent sub-pixels with the same first sub-voltage line, the wiring can be saved.

For example, the pixel circuit of the blue sub-pixel B in the first sub-pixel pair PP1 and the pixel circuit of the green sub-pixel G in the second sub-pixel pair located on the side of the first sub-pixel pair PP1 away from the second sub-pixel pair PP2 are electrically connected to the same first sub-voltage line VDD1. For example, the pixel circuit of the green sub-pixel G in the second sub-pixel pair PP2 and the pixel circuit of the red sub-pixel R in the first sub-pixel pair located on the side of the second sub-pixel pair PP2 away from the first sub-pixel pair PP1 are electrically connected to the same first sub-voltage line VDD1".

For example, as shown in FIG. 6H and FIG. 6L, in another example, the two sub-pixel pairs adjacent to each other in the first direction X are respectively the first sub-pixel pair PP1 and the second sub-pixel pair PP2 located in the second row, and the two sub-pixels adjacent to each other in the first direction X of the first sub-pixel pair PP1 and the second sub-pixel pair PP2 are respectively a green sub-pixel G in the second sub-pixel pair PP2 and a red sub-pixel R in the first sub-pixel pair PP1, and the pixel circuit of the green sub-pixel G and the pixel circuit of the red sub-pixel R are electrically connected to the same first sub-voltage line VDD1'.

For example, as shown in FIG. 6H and FIG. 6L, in the first row, the second electrode of the second light-emitting control transistor in the pixel circuit of the green sub-pixel G electrically connected to the first sub-voltage line VDD1' and the second electrode of the second light-emitting control transistor in the pixel circuit of the blue sub-pixel B are the same, that is, the electrode sc5' as shown in FIG. 6H. In addition, the holes h28' and h30' corresponding to the first sub-voltage line VDD1' are also shared by the pixel circuit of the green sub-pixel G in the first sub-pixel pair PP1 and the pixel circuit of the blue sub-pixel B in the second sub-pixel pair PP2, and the pixel circuit of the green sub-pixel G in the first sub-pixel pair PP1 and the pixel circuit of the blue sub-pixel B in the second sub-pixel pair PP2 are electrically connected to the first sub-voltage line VDD1'.

For example, as shown in FIG. 6H and FIG. 6L, the pixel circuits of the first sub-pixel pair PP1 located in the first row and the pixel circuits of the second sub-pixel pair PP2 located in the first row are approximately mirror symmetrical with respect to the first sub-voltage line VDD1', and the pixel circuits of the first sub-pixel pair PP1 located in the second row and the pixel circuits of the second sub-pixel pair PP2 located in the second row are approximately mirror symmetrical with respect to the first sub-voltage line VDD1'. That is, the pixel circuits located in the first column and the pixel circuits located in the second column are approximately mirror symmetrical with respect to the first sub-voltage line VDD1'.

Figure 6M:
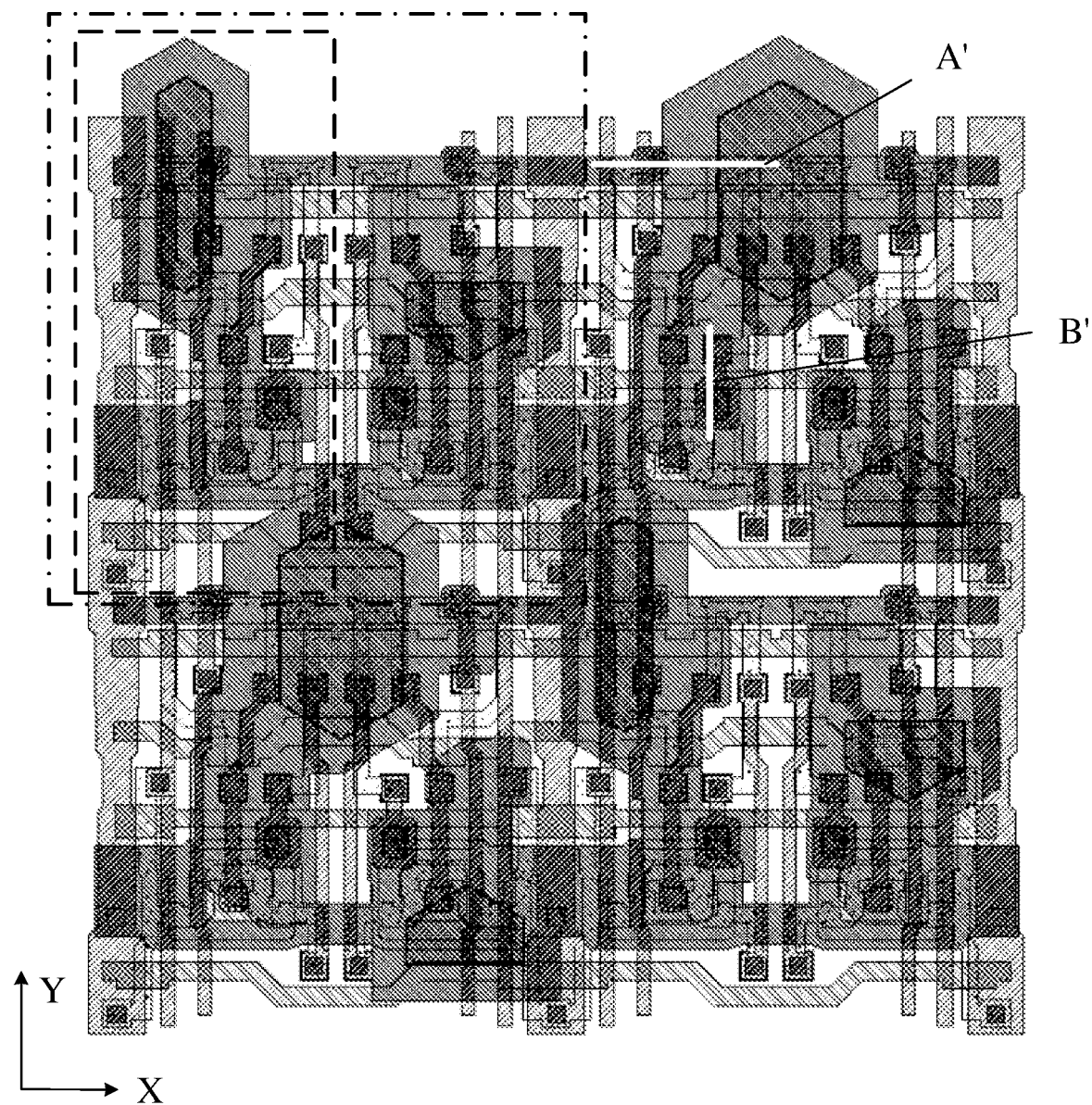

FIG. 6M is a schematic diagram of the stacking position relationship of the active semiconductor layer 510, the first conductive layer 520, the second conductive layer 530, the third insulation layer 610, the source-drain metal layer 540, the planarization layer 620, and the anode layer 550. For example, as shown in FIG. 6M, the first electrode of the light-emitting element 121 is connected to the first connection electrode Co1 through the first hole h100. The first connection electrode Co1 is connected to the second electrode sc6 of the first light-emitting control transistor T6, so that the first electrode of the light-emitting element 121 is electrically connected to the second electrode sc6 of the first light-emitting control transistor T6.

Figure 7A:
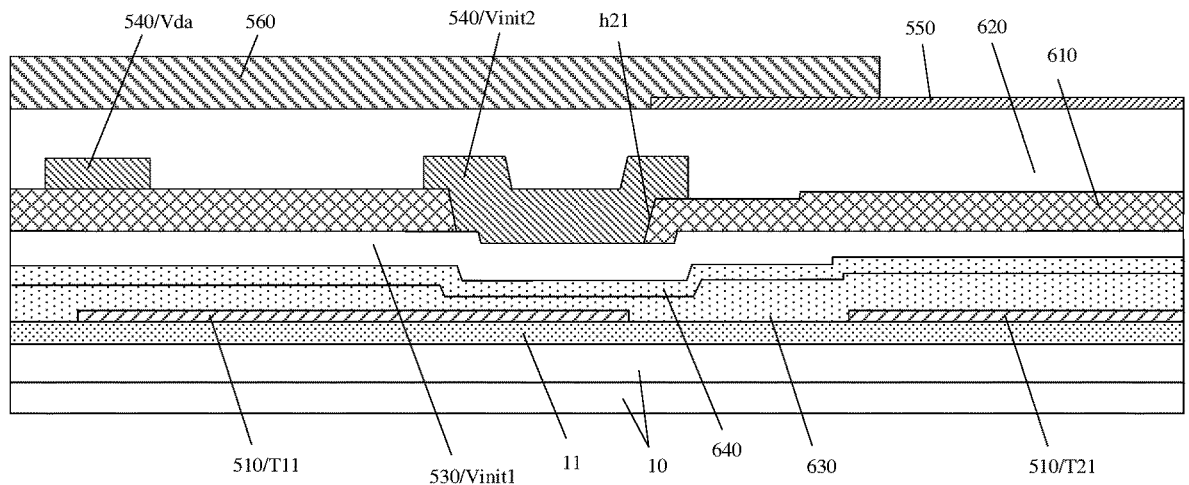
FIG. 7A is a schematic diagram of a cross-sectional structure at a line A' in FIG. 6M.
Figure 7B:
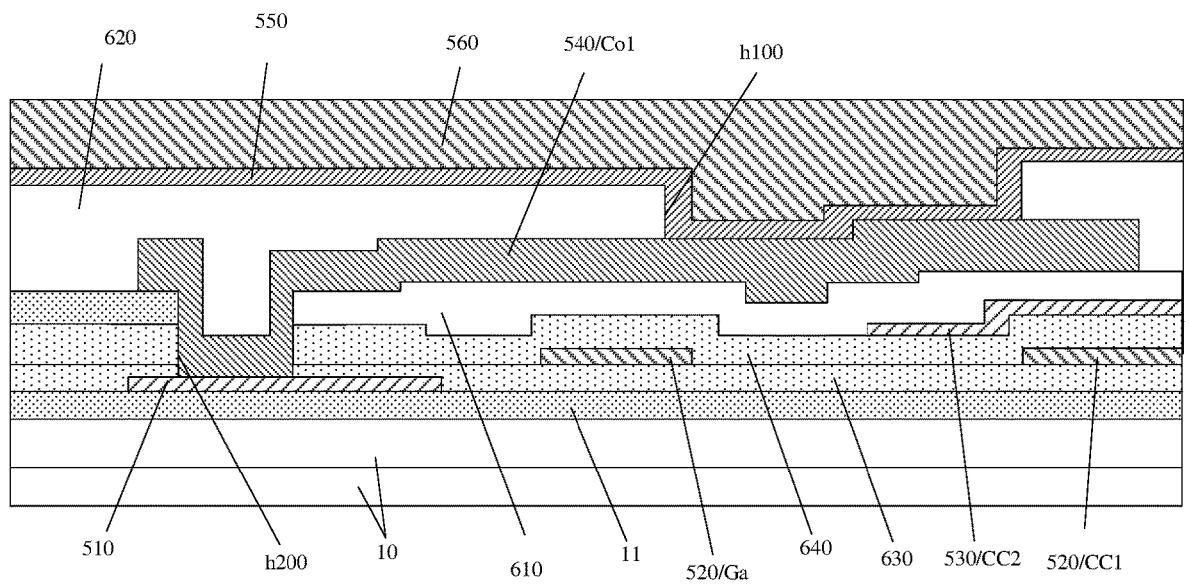
FIG. 7B is a schematic diagram of a cross-sectional structure at a line B' in FIG. 6M.

FIG. 7A is a schematic diagram of a cross-sectional structure at a line A' in FIG. 6M, and FIG. 7B is a schematic diagram of a cross-sectional structure at a line B' in FIG. 6M.

For example, as shown in FIGS. 7A and 7B, the base substrate 10 includes a structure of a plurality of layers (for example, a structure of two layers as shown in FIG. 7A), and the plurality of layers in the structure are all made of flexible materials.

For example, as shown in FIGS. 7A and 7B, a buffer layer 11 is formed on the base substrate 10 to prevent external water vapor, oxygen, and impurities from entering the pixel circuit 120. For example, the material of the buffer layer 11 may include inorganic insulation materials, such as silicon oxide, silicon nitride, and silicon oxynitride, or other suitable materials.

For example, as shown in FIGS. 7A and 7B, the active semiconductor layer 510 is formed on the side of the buffer layer 11 away from the base substrate 10. The active semiconductor layer 510 as shown in FIG. 7A includes a first reset active layer portion T11 and a first compensation active layer portion T21. The active semiconductor layer 510 shown in FIG. 7B includes a part, corresponding to the second electrode of the first light-emitting control transistor T6, of the active semiconductor layer 510.

For example, as shown in FIGS. 7A and 7B, a first insulation layer 630 is formed on the side of the active semiconductor layer 510 away from the buffer layer 11, and a first conductive layer 520 (not shown in FIG. 7A) is formed on the side of the first insulation layer 630 away from the active semiconductor layer 510. The first conductive layer 520 shown in FIG. 7B includes the scan signal line Ga and apart of the first electrode plate CC1 of the storage capacitor Cst.

For example, as shown in FIGS. 7A and 7B, a second insulation layer 640 is formed on the side of the first conductive layer 520 away from the first insulation layer 630, and the second conductive layer 530 is formed on the side of the second insulation layer 640 away from the first conductive layer 520. The second conductive layer 530 shown in FIG. 7A includes the first sub-initial signal line Vinit1. The orthographic projection of the first reset active layer portion T11 on the base substrate 10 and the orthographic projection of the first compensation active layer portion T21 on the base substrate 10 are both located in the orthographic projection of the first sub-initial signal line Vinit1 on the base substrate 10, so that the first sub-initial signal line Vinit1 can shield the first reset active layer portion T11 and the first compensation active layer portion T21 in the direction perpendicular to the base substrate 10.

The second conductive layer 530 shown in FIG. 7B includes a part of the second electrode plate CC2 of the storage capacitor Cst.

For example, as shown in FIGS. 7A and 7B, the third insulation layer 610 is formed on the side of the second conductive layer 530 away from the second insulation layer 640, and the source-drain metal layer 540 is formed on the side of the third insulation layer 610 away from the second conductive layer 530. The source-drain metal layer 540 shown in FIG. 7A includes the data line Vda and the second sub-initial signal line Vinit2. The second sub-initial signal line Vinit2 is connected to the first sub-initial signal line Vinit1 through the insulation layer hole h21 penetrating through the third insulation layer 610, so that the first sub-initial signal line Vinit1 and the second sub-initial signal line Vinit2 are electrically connected to each other. The source-drain metal layer 540 shown in FIG. 7B includes the first connection electrode Co1, the first connection electrode Co1 is electrically connected to the part, corresponding to the second electrode of the first light-emitting control transistor T6, of the active semiconductor layer 510 through the second hole h200 penetrating through the first insulation layer 630, the second insulation layer 640, and the third insulation layer 610.

For example, as shown in FIGS. 7A and 7B, the planarization layer 620 is formed on the side of the source-drain metal layer 540 away from the third insulation layer 610, the anode layer 550 is formed on the side of the planarization layer 620 away from the source-drain metal layer 540, and a pixel defining layer 560 is formed on the side of the anode layer 550 away from the planarization layer 620 and on the planarization layer 620. The pixel defining layer 560 includes a plurality of pixel openings. In the direction perpendicular to the base substrate, each pixel opening exposes at least a part of the first electrode R/G/B of the corresponding light-emitting element.

For example, the first connection electrode Co1 and the second electrode of the first light-emitting control transistor T6 are electrically connected, for example, are provided integrally. As shown in FIG. 7B, the first connection electrode Co1 is electrically connected to the first electrode of the light-emitting element 120 in the anode layer 550 through the first hole h100. Therefore, jumper design is carried out at the fourth node N4, that is, the part, corresponding to the second electrode of the first light-emitting control transistor T6, of the active semiconductor layer 510 is first connected to the first connection electrode Co1 through the second hole h200, and then the first connection electrode Co1 is electrically connected to the first electrode of the light-emitting element 120 in the anode layer 550 through the first hole h100, so that the setting position of the first hole h100 can be more flexible.

Figure 8:
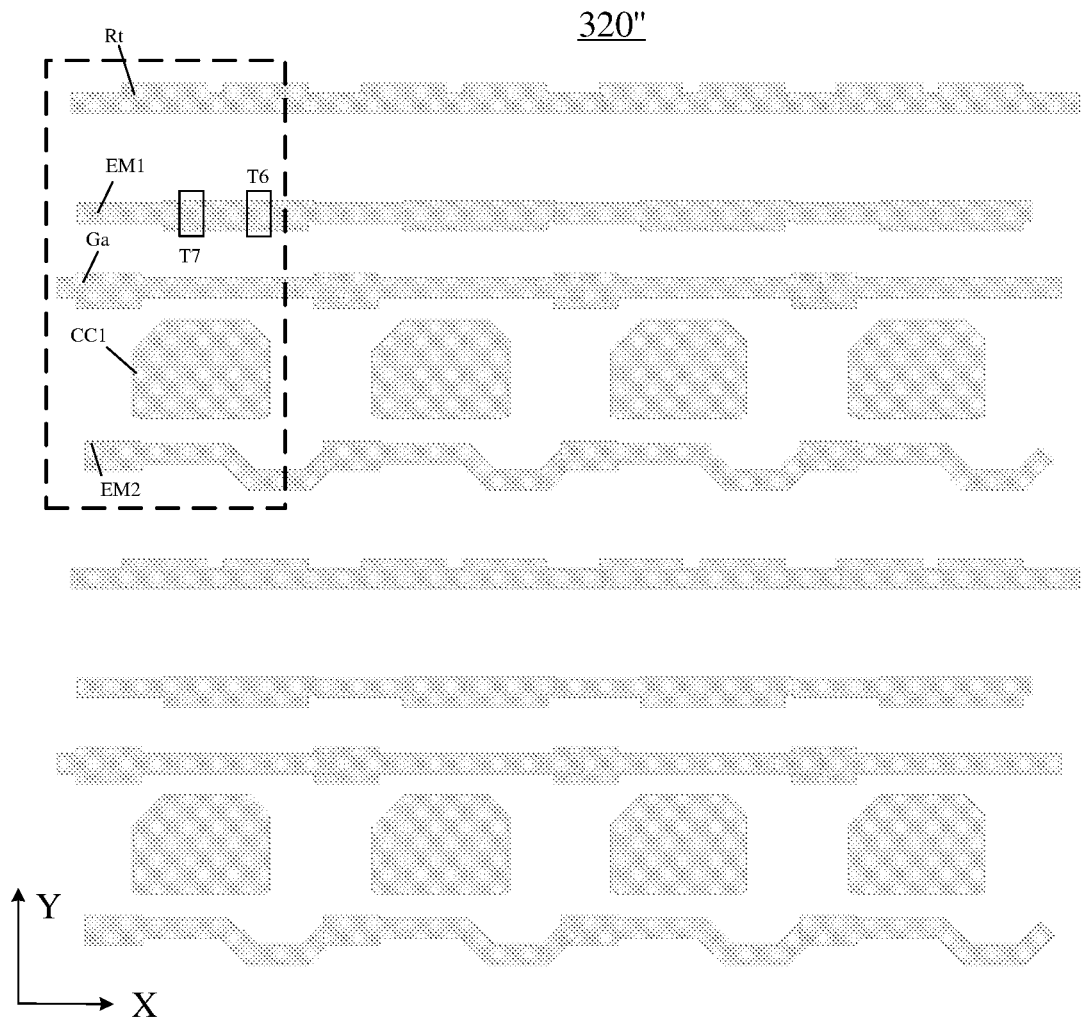
FIG. 8 is a structural schematic diagram of a first conductive layer provided by other embodiments of the present disclosure.

In the above embodiments, the shape of the first light-emitting control signal line EM1 is substantially a curved shape, but the present disclosure is not limited to this case. FIG. 8 is a structural schematic diagram of a first conductive layer provided by other embodiments of the present disclosure. For example, as shown in FIG. 8, in other embodiments, in the first conductive layer 320", the shape of the first light-emitting control signal line EM1 is substantially a straight line shape. As shown in FIG. 4C and FIG. 6C, the connection line between the center of the active layer of the first light-emitting control transistor T6 and the center of the active layer of the second reset transistor T7 is not parallel to the first direction X and is also not parallel to the second direction Y. As shown in FIG. 8, the rectangular solid-line boxes show the overlapping part between the active layer of the first light-emitting control transistor T6 and the first conductive layer 320" and the overlapping part between the active layer of the second reset transistor T7 and the first conductive layer 320". Based on this case, it can be known that in the example shown in FIG. 8, the connection line between the center of the active layer of the first light-emitting control transistor T6 and the center of the active layer of the second reset transistor T7 is approximately parallel to the first direction X.

It should be noted that, in the present disclosure, the region shown by the rectangular dotted-line box and the region shown by the rectangular dot-dash line box only represent the approximate region of the pixel circuit or the approximate region of the pixel circuits of the sub-pixel pair, and the actual region of the pixel circuit is related to the specific setting positions of the transistors and capacitors in the pixel circuit.

Figure 9:
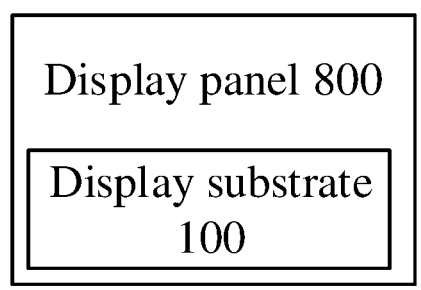
FIG. 9 is a schematic diagram of a display panel provided by at least one embodiment of the present disclosure.

At least one embodiment of the present disclosure further provides a display panel. FIG. 9 is a schematic diagram of a display panel provided by at least one embodiment of the present disclosure. As shown in FIG. 9, the display panel 800 includes the display substrate 100 provided by any embodiment of the present disclosure, for example, the display substrate 100 shown in FIG. 1.

For example, the display panel 800 may be a liquid crystal display panel or an organic light-emitting diode (OLED) display panel or the like. For example, in the case where the display panel 800 is a liquid crystal display panel, the display substrate 100 may be an array substrate or a color film substrate. In the case where the display panel 800 is an organic light-emitting diode display panel, the display substrate 100 may be an array substrate.

For example, the display panel 800 may be a rectangular panel, a circular panel, an oval panel, a polygonal panel, or the like. In addition, the display panel 800 can be not only a flat panel, but also a curved panel, or even a spherical panel.

For example, the display panel 800 may also have a touch function, that is, the display panel 800 may be a touch display panel.

For example, the display panel 800 can be applied to any product or component with a display function, such as a mobile phone, a tablet computer, a television, a monitor, a notebook computer, a digital photo frame, a navigator, and the like.

For example, the display panel 800 may be a flexible display panel, so as to meet various practical application requirements, for example, the display panel 800 may be applied to a curved screen and the like.

It should be noted that the display panel 800 may further include other components, such as a data driving circuit, a timing controller, and the like, and the embodiments of the present disclosure are not limited thereto. For the sake of clarity and conciseness, the embodiments of the present disclosure do not show all the constituent units of the display panel 800. In order to achieve the basic functions of the display panel 800, those skilled in the art can provide or set other structures not shown according to specific needs, and the embodiments of the present disclosure do not limit this.

Regarding the technical effect of the display panel 800 provided by the above embodiments, reference may be made to the technical effect of the display substrate 100 provided in the embodiments of the present disclosure, and details will not be repeated here.

For the present disclosure, the following statements should be noted:

(1) The accompanying drawings of the embodiment(s) of the present disclosure involve only the structure(s) related to the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged. However, it should be understood that, in the case in which a component or element such as a layer, film, region, substrate or the like is referred to be "on" or "under" another component or element, the component or element may be "directly" "on" or "under" the another component or element or a component or element is interposed therebetween.

(3) In case of no conflict, the embodiments of the present disclosure and the features in the embodiment(s) can be combined with each other to obtain new embodiment(s).

What have been described above are only specific implementations of the present disclosure, the protection scope of the present disclosure is not limited thereto, and the protection scope of the present disclosure should be based on the protection scope of the claims.

What is claimed is:

1. A display substrate, comprising: a base substrate, and a plurality of sub-pixels, a first voltage line, a data line, a scan signal line, a first light-emitting control signal line, and a second light-emitting control signal line, which are on the base substrate,
wherein each sub-pixel comprises a pixel circuit and a light-emitting element, and the pixel circuit comprises a driving sub-circuit, a first light-emitting control sub-circuit, a second light- emitting control sub-circuit, and a data writing sub-circuit,
the first light-emitting control sub-circuit is electrically connected to a first terminal of the driving sub-circuit, a first electrode of the light-emitting element, and the first light-emitting control signal line, and is configured to control a connection between the first terminal of the driving sub-circuit and the first electrode of the light-emitting element to be turned on or off under control of a first light-emitting control signal on the first light-emitting control signal line;
the second light-emitting control sub-circuit is electrically connected to a second terminal of the driving sub-circuit, the first voltage line, and the second light-emitting control signal line, and is configured to control a connection between the second terminal of the driving sub-circuit and the first voltage line to be turned on or off under control of a second light-emitting control signal on the second light-emitting control signal line;
the data writing sub-circuit is electrically connected to the second terminal of the driving sub-circuit, the data line, and the scan signal line, and is configured to transmit a data voltage on the data line to the second terminal of the driving sub-circuit under control of a scan signal on the scan signal line; and
the first light-emitting control signal line, the scan signal line, and the second light-emitting control signal line extend along a first direction and are arranged along a second direction that is not parallel to the first direction, and the scan signal line is between the first light-emitting control signal line and the second light-emitting control signal line in the second direction;
the display substrate further comprises a reset signal line and an initial signal line, which are on the base substrate,
wherein the pixel circuit further comprises a reset sub-circuit and a threshold compensation sub-circuit;
the reset sub-circuit is electrically connected to a control terminal of the driving sub-circuit, the initial signal line, the first light-emitting control signal line, and the reset signal line, and is configured to transmit an initial voltage on the initial signal line to the control terminal of the driving sub-circuit under control of the first light-emitting control signal and a reset control signal on the reset signal line;
the threshold compensation sub-circuit is electrically connected to the control terminal and the first terminal of the driving sub-circuit and the reset signal line, and is configured to control a connection between the first terminal of the driving sub-circuit and the control terminal of the driving sub-circuit to be turned on or off under control of the reset control signal; and
the reset signal line extends along the first direction, and in the second direction, the reset signal line is at a side of the first light-emitting control signal line away from the scan signal line.

2. The display substrate according to claim 1, wherein the pixel circuit further comprises a storage capacitor, a first electrode plate of the storage capacitor is electrically connected to the control terminal of the driving sub-circuit, and a second electrode plate of the storage capacitor is electrically connected to the first voltage line; and
in the second direction, an orthographic projection of the first light-emitting control signal line on the base substrate and an orthographic projection of the second light-emitting control signal line on the base substrate are on both sides of an orthographic projection of the second electrode plate of the storage capacitor on the base substrate.

3. The display substrate according to claim 2, wherein in the second direction, an orthographic projection of the scan signal line on the base substrate and the orthographic projection of the second light-emitting control signal line on the base substrate are on both sides of the orthographic projection of the second electrode plate of the storage capacitor on the base substrate.

4. The display substrate according to claim 1, wherein the reset sub-circuit comprises a first reset transistor, the first reset transistor comprises a reset active layer, and the reset active layer comprises a first reset active layer portion;
the threshold compensation sub-circuit comprises a threshold compensation transistor, the threshold compensation transistor comprises a compensation active layer, and the compensation active layer comprises a first compensation active layer portion;
an orthographic projection of the first reset active layer portion on the base substrate and an orthographic projection of the initial signal line on the base substrate at least partially overlap; and
an orthographic projection of the first compensation active layer portion on the base substrate and the orthographic projection of the initial signal line on the base substrate at least partially overlap.

5. The display substrate according to claim 4, wherein the initial signal line comprises a first sub-initial signal line, the first sub-initial signal line extends along the first direction, and the orthographic projection of the first reset active layer portion on the base substrate and the orthographic projection of the first compensation active layer portion on the base substrate are both within an orthographic projection of the first sub-initial signal line on the base substrate.

6. The display substrate according to claim 5, wherein the initial signal line further comprises a second sub-initial signal line, the second sub-initial signal line extends along the second direction, and the first sub-initial signal line and the second sub-initial signal line are electrically connected.

7. The display substrate according to claim 6, wherein the display substrate comprises an active semiconductor layer, a first conductive layer, a second conductive layer, and a source-drain metal layer, in a direction perpendicular to the base substrate, the active semiconductor layer is between the base substrate and the first conductive layer, the first conductive layer is between the active semiconductor layer and the second conductive layer, and the second conductive layer is between the first conductive layer and the source-drain metal layer; and
    the first sub-initial signal line is in the second conductive layer, and the second sub-initial signal line is in the source-drain metal layer.

8. The display substrate according to claim 4, wherein the reset active layer further comprises a second reset active layer portion, and the compensation active layer further comprises a second compensation active layer portion;
    an orthographic projection of the second reset active layer portion on the base substrate and an orthographic projection of the reset signal line on the base substrate at least partially overlap;
    an orthographic projection of the second compensation active layer portion on the base substrate and the orthographic projection of the reset signal line on the base substrate at least partially overlap; and
    the second reset active layer portion and the second compensation active layer portion are sequentially arranged in the first direction.

9. The display substrate according to claim 1, wherein the display substrate comprises an active semiconductor layer and a first conductive layer, and the active semiconductor layer is between the base substrate and the first conductive layer in a direction perpendicular to the base substrate; and
    the reset signal line, the scan signal line, the first light-emitting control signal line, and the second light-emitting control signal line are all in the first conductive layer.

10. The display substrate according to claim 1, wherein under control of the first light-emitting control signal and the reset control signal, the initial voltage is transmitted to the first electrode of the light-emitting element via the reset sub-circuit, the threshold compensation sub-circuit, and the first light-emitting control sub-circuit.

11. The display substrate according to claim 1, wherein the driving sub-circuit comprises a driving transistor, the control terminal of the driving sub-circuit comprises a gate electrode of the driving transistor, the first terminal of the driving circuit comprises a first electrode of the driving transistor, and the second terminal of the driving circuit comprises a second electrode of the driving transistor;
    the first light-emitting control sub-circuit comprises a first light-emitting control transistor, a gate electrode of the first light-emitting control transistor is electrically connected to the first light-emitting control signal line, a first electrode of the first light-emitting control transistor is electrically connected to the first electrode of the driving transistor, a second electrode of the first light-emitting control transistor is electrically connected to the first electrode of the light-emitting element, and a second electrode of the light-emitting element is electrically connected to a second voltage line;
    the second light-emitting control sub-circuit comprises a second light-emitting control transistor, a gate electrode of the second light-emitting control transistor is electrically connected to the second light-emitting control signal line, a first electrode of the second light-emitting control transistor is electrically connected to the second electrode of the driving transistor, and a second electrode of the second light-emitting control transistor is electrically connected to the first voltage line;
    the data writing sub-circuit comprises a data writing transistor, a gate electrode of the data writing transistor is electrically connected to the scan signal line, a first electrode of the data writing transistor is electrically connected to the data line, and a second electrode of the data writing transistor is electrically connected to the second electrode of the driving transistor;
    the reset sub-circuit comprises a first reset transistor and a second reset transistor, a gate electrode of the first reset transistor is electrically connected to the reset signal line, a first electrode of the first reset transistor is electrically connected to the initial signal line, a second electrode of the first reset transistor is electrically connected to a first electrode of the second reset transistor, a gate electrode of the second reset transistor is electrically connected to the first light-emitting control signal line, and a second electrode of the second reset transistor is electrically connected to the gate electrode of the driving transistor; and
    the threshold compensation sub-circuit comprises a threshold compensation transistor, a gate electrode of the threshold compensation transistor is electrically connected to the reset signal line, a first electrode of the threshold compensation transistor is electrically connected to the first electrode of the driving transistor, and a second electrode of the threshold compensation transistor is electrically connected to the gate electrode of the driving transistor.

12. The display substrate according to claim 11, wherein the display substrate comprises an active semiconductor layer, a first conductive layer, a second conductive layer, a source-drain metal layer, and a planarization layer, in a direction perpendicular to the base substrate, the active semiconductor layer is between the base substrate and the first conductive layer, the first conductive layer is between the active semiconductor layer and the second conductive layer, the second conductive layer is between the first conductive layer and the source-drain metal layer, and the planarization layer is on a side of the source-drain metal layer away from the base substrate;
    the second electrode of the first light-emitting control transistor is electrically connected to the first electrode of the light-emitting element through a first hole penetrating through the planarization layer; and
    in the second direction, an orthographic projection of the first hole on the base substrate is between an orthographic projection of the reset signal line on the base substrate and an orthographic projection of the second light-emitting control signal line on the base substrate.

13. The display substrate according to claim 12, wherein the display substrate further comprises a first insulation layer, a second insulation layer, and a third insulation layer, the first insulation layer is between the active semiconductor layer and the first conductive layer, the second insulation layer is between the first conductive layer and the second conductive layer, and the third insulation layer is between the second conductive layer and the source-drain metal layer;
    a part, which corresponds to the second electrode of the first light-emitting control transistor, of the active semiconductor layer is electrically connected to a first connection electrode in the source-drain metal layer through a second hole penetrating through the first insulation layer, the second insulation layer, and the third insulation layer, and the first connection electrode is electrically connected to the second electrode of the first light-emitting control transistor; and
    the first connection electrode is electrically connected to the first electrode of the light-emitting element through the first hole.

14. The display substrate according to claim 12, wherein in the second direction, the orthographic projection of the first hole on the base substrate is between an orthographic projection of the scan signal line on the base substrate and an orthographic projection of the first light-emitting control signal line on the base substrate.

15. The display substrate according to claim 1, wherein the initial signal line comprises a first sub-initial signal line and a second sub-initial signal line, the first sub-initial signal line extends along the first direction and the second sub-initial signal line extends along the second direction, and the first sub-initial signal line and the second sub-initial signal line are electrically connected; the first voltage line comprises a first sub-voltage line;
    the data line extends along the second direction; and
    the first sub-voltage line, the data line, and the second sub-initial signal line are on a same layer, the data line, the first sub-voltage line, and the second sub-initial signal line are arranged along the first direction, and the first sub-voltage line is between the data line and the second sub-initial signal line in the first direction.

16. The display substrate according to claim 1, wherein the plurality of sub-pixels comprises a plurality of sub-pixel pairs, and the plurality of sub-pixel pairs are arranged in an array along the first direction and the second direction; and
    each sub-pixel pair comprises two sub-pixels adjacent to each other in the first direction, and pixel circuits of the two sub-pixels are mirror symmetric along a symmetry axis that is parallel to the second direction.

17. The display substrate according to claim 16, wherein the initial signal line comprises a first sub-initial signal line and a second sub-initial signal line, the first sub-initial signal line extends along the first direction and the second sub-initial signal line extends along the second direction, and the first sub-initial signal line and the second sub-initial signal line are electrically connected; the first voltage line comprises a first sub-voltage line;
    the data line extends along the second direction; and
    the first sub-voltage line, the data line, and the second sub-initial signal line are on a same layer, the data line, the first sub-voltage line, and the second sub-initial signal line are arranged along the first direction, and in the first direction, the data line is between the first sub-voltage line and the second sub-initial signal line.

18. The display substrate according to claim 17, wherein for two sub-pixel pairs, which are adjacent in the first direction, among the plurality of sub-pixel pairs,
    pixel circuits of two sub-pixels, which are adjacent to each other in the first direction, of the two sub-pixel pairs are electrically connected to a same first sub-voltage line.

19. A display panel, comprising a display substrate,
wherein the display substrate comprises: a base substrate, and a plurality of sub-pixels, a first voltage line, a data line, a scan signal line, a first light-emitting control signal line, and a second light-emitting control signal line, which are on the base substrate,
each sub-pixel comprises a pixel circuit and a light-emitting element, and the pixel circuit comprises a driving sub-circuit, a first light-emitting control sub-circuit, a second light-emitting control sub-circuit, and a data writing sub-circuit,
the first light-emitting control sub-circuit is electrically connected to a first terminal of the driving sub-circuit, a first electrode of the light-emitting element, and the first light-emitting control signal line, and is configured to control a connection between the first terminal of the driving sub-circuit and the first electrode of the light-emitting element to be turned on or off under control of a first light-emitting control signal on the first light-emitting control signal line;
the second light-emitting control sub-circuit is electrically connected to a second terminal of the driving sub-circuit, the first voltage line, and the second light-emitting control signal line, and is configured to control a connection between the second terminal of the driving sub-circuit and the first voltage line to be turned on or off under control of a second light-emitting control signal on the second light-emitting control signal line;
the data writing sub-circuit is electrically connected to the second terminal of the driving sub-circuit, the data line, and the scan signal line, and is configured to transmit a data voltage on the data line to the second terminal of the driving sub-circuit under control of a scan signal on the scan signal line;
the first light-emitting control signal line, the scan signal line, and the second light-emitting control signal line extend along a first direction and are arranged along a second direction that is not parallel to the first direction, and the scan signal line is between the first light-emitting control signal line and the second light-emitting control signal line in the second direction;
the display substrate further comprises a reset signal line and an initial signal line, which are on the base substrate,
the pixel circuit further comprises a reset sub-circuit and a threshold compensation sub-circuit;
the reset sub-circuit is electrically connected to a control terminal of the driving sub-circuit, the initial signal line, the first light-emitting control signal line, and the reset signal line, and is configured to transmit an initial voltage on the initial signal line to the control terminal of the driving sub-circuit under control of the first light-emitting control signal and a reset control signal on the reset signal line;
the threshold compensation sub-circuit is electrically connected to the control terminal and the first terminal of the driving sub-circuit and the reset signal line, and is configured to control a connection between the first terminal of the driving sub-circuit and the control terminal of the driving sub-circuit to be turned on or off under control of the reset control signal; and
the reset signal line extends along the first direction, and in the second direction, the reset signal line is at a side of the first light-emitting control signal line away from the scan signal line.

* * * * *